US011425508B2

(12) United States Patent
Take et al.

(10) Patent No.: US 11,425,508 B2
(45) Date of Patent: Aug. 23, 2022

(54) THIN-FILM FILTER, THIN-FILM FILTER SUBSTRATE, METHOD OF MANUFACTURING THE THIN-FILM FILTER, METHOD OF MANUFACTURING THE THIN-FILM FILTER SUBSTRATE, MEMS MICROPHONE AND METHOD OF MANUFACTURING THE MEMS MICROPHONE

(71) Applicant: SAE Magnetics (H.K.) Ltd., Hong Kong (HK)

(72) Inventors: Hiroshi Take, Hong Kong (HK); Masashi Shiraishi, Hong Kong (HK); Toyotaka Kobayashi, Hong Kong (HK); Makoto Yoshida, Hong Kong (HK); Anthony Reymund Melad Binarao, Hong Kong (HK); Cheng Bu Heng, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 224 days.

(21) Appl. No.: 16/931,660

(22) Filed: Jul. 17, 2020

(65) Prior Publication Data
US 2021/0051417 A1 Feb. 18, 2021

(30) Foreign Application Priority Data

Aug. 15, 2019 (JP) .............................. JP2019-149059

(51) Int. Cl.
*H04R 19/04* (2006.01)
*H04R 19/00* (2006.01)
(Continued)

(52) U.S. Cl.
CPC ......... *H04R 19/04* (2013.01); *B01D 39/1692* (2013.01); *B01D 46/10* (2013.01);
(Continued)

(58) Field of Classification Search
CPC ...... H04R 19/04; H04R 1/086; H04R 19/005; H04R 31/00; H04R 2201/003;
(Continued)

(56) References Cited

U.S. PATENT DOCUMENTS 8,739,976 B2\* 6/2014 Ishizuka .............. B01D 63/061
427/244
10,362,387 B2\* 7/2019 Hirai .................... H04R 1/2811
(Continued)

FOREIGN PATENT DOCUMENTS

| JP | 2015-199069 A | 11/2015 | |
| JP | 2017-221887 A | 12/2017 | |
| WO | WO-2010015725 A1 * | 2/2010 | ............... H04R 1/10 |

*Primary Examiner* — Angelica M McKinney

(57) ABSTRACT

A thin-film filter includes thin-film part having a film surface and a rear film surface arranged at the rear side of the film surface, a plurality of through holes, being formed to penetrate the thin-film part from the film surface to the rear film surface, the through holes are formed along by a slanting direction being made an acute angle or an obtuse angle with the film surface, and stripes-formed inner wall surfaces. The stripes-formed inner wall surfaces include stripe-like parts formed along by the slanting direction. The stripes-formed inner wall surfaces are formed inside the respective through holes.

20 Claims, 44 Drawing Sheets

(51) Int. Cl.
　　　*H04R 31/00*　　　(2006.01)
　　　*H04R 1/08*　　　(2006.01)
　　　*B81B 7/00*　　　(2006.01)
　　　*B01D 46/10*　　　(2006.01)
　　　*B01D 39/16*　　　(2006.01)

(52) U.S. Cl.
　　　CPC ........... *B81B 7/0058* (2013.01); *H04R 1/086* (2013.01); *H04R 19/005* (2013.01); *H04R 31/00* (2013.01); *B01D 2239/10* (2013.01); *B01D 2279/45* (2013.01); *B81B 2201/0257* (2013.01); *H04R 2201/003* (2013.01)

(58) Field of Classification Search
　　　CPC ................ B01D 39/1692; B01D 46/10; B01D 2239/10; B01D 2279/45; B01D 46/12; B01D 46/54; B01D 2239/1216; B01D 39/1676; B01D 39/14; B01D 39/16; B01D 67/0039; B01D 67/0081; B01D 69/12; B81B 7/0058; B81B 2201/0257; B81B 7/0061; B81B 2201/10; B81B 2207/012; B81C 2203/0109
　　　See application file for complete search history.

(56) References Cited

U.S. PATENT DOCUMENTS

| | | | |
|---|---|---|---|
| 10,491,991 B2 * | 11/2019 | Yoo | H04R 19/005 |
| 11,153,691 B2 * | 10/2021 | Take | H04R 19/04 |
| 2016/0207006 A1 * | 7/2016 | Furuyama | B01D 71/48 |

* cited by examiner (a)

(b)

Fig.13
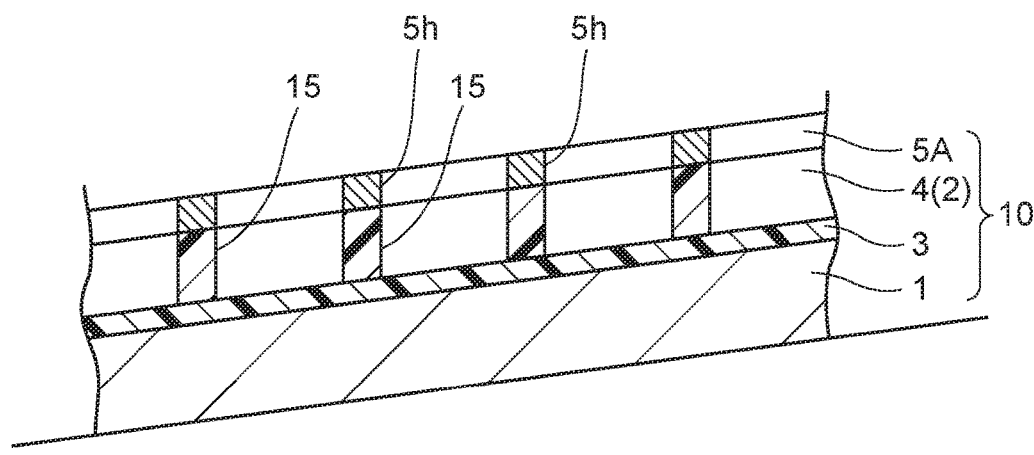
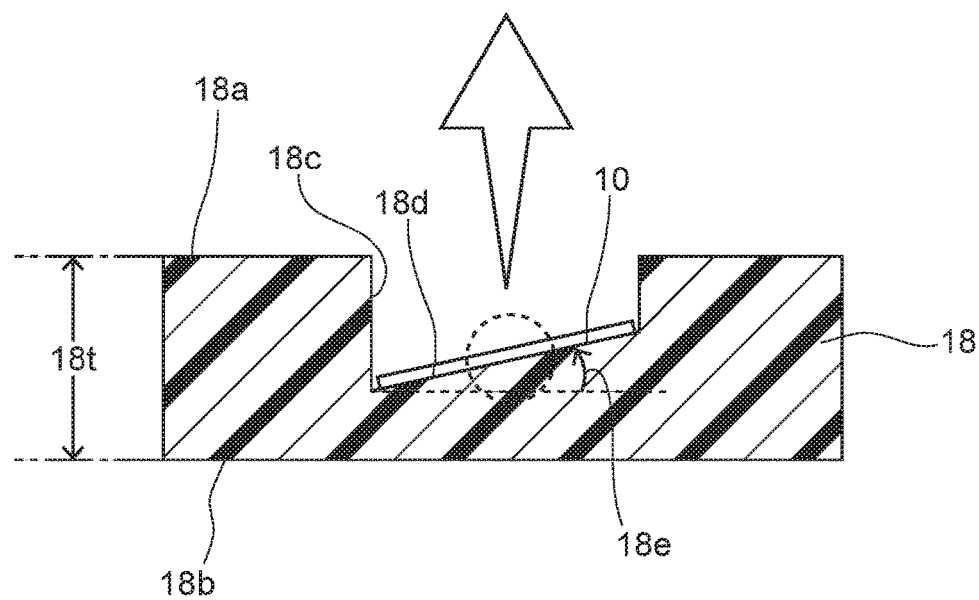

(a)

(b)

THIN-FILM FILTER, THIN-FILM FILTER SUBSTRATE, METHOD OF MANUFACTURING THE THIN-FILM FILTER, METHOD OF MANUFACTURING THE THIN-FILM FILTER SUBSTRATE, MEMS MICROPHONE AND METHOD OF MANUFACTURING THE MEMS MICROPHONE

CROSS REFERENCE TO RELATED APPLICATIONS

The present application claims the benefit of Japanese Patent Application No. 2019-149059 filed on Aug. 15, 2019, the contents of which are incorporated herein by reference in their entirety.

BACKGROUND

Field of the Invention

The present invention relates to a thin-film filter, being used for prevention of entry of particles, water or the like, a thin-film filter substrate having the thin-film filter, a method of manufacturing the thin-film filter, a method of manufacturing the thin-film filter substrate, a MEMS microphone having the thin-film filter and a method of manufacturing the MEMS microphone.

Related Background Art

A filter is conventionally used for prevention of entry, to the inside, of micro things such as particles, cells or the like and water. Concerning such a filter, for example, a polymer film, which micro perforations are formed, is disclosed in patent document 1 (JP2015-199069). In case of the polymer film, diameters of the respective perforations, appeared in the film surface side, are different from diameters, appeared in the rear surface side.

Further, a processed film, which a plurality of through holes are formed systematically with high density, is disclosed in patent document 2 (JP2017-221887).

SUMMARY OF THE INVENTION

By the way, in case of the above-described conventional technologies, the filters are manufactured with resin films. In this case, punching processing is performed to the resin films, the punched resin films, manufactured by the punching processing, are used for the filter.

However, for example, when the punching processing is performed with laser, a part, which is etched by laser irradiation, becomes debris (pieces), the debris are likely to adhere the inside of the holes of the punched resin films. Then, parts of the respective hole are blocked up by the debris, thereby a filtering function of the filter is lowered. Further, the size of respective holes become uneven caused by adhesion of the debris. Therefore, the filtering function of the punched resin films are not sufficient.

Hence the present invention is made to solve the above problem, and it is an object to provide the thin-film filter having a sophisticated filtering function because of the higher capability for catching foreign matters than the conventional filter, a thin-film filter substrate having the thin-film filter, a method of manufacturing the thin-film filter, a method of manufacturing the thin-film filter substrate, a MEMS microphone having the thin-film filter and a method of manufacturing the MEMS microphone.

To solve the above problem, the present invention is a thin-film filter including: a thin-film part having a film surface and a rear film surface arranged at the rear side of the film surface; a plurality of through holes, being formed to penetrate the thin-film part from the film surface to the rear film surface, the through holes are formed along by a slanting direction being made an acute angle or an obtuse angle with the film surface; and stripes-formed inner wall surfaces having stripe-like parts formed along by the slanting direction, the stripes-formed inner wall surfaces are formed inside the respective through holes.

In case of the above-described thin-film filter, it is preferable that the stripe-like parts are arranged in almost the whole of the inner wall surface of the respective through holes.

Further, it is preferable that the stripe-like parts are formed in the length longer than 80% of a film thickness being a thickness of the thin-film part.

Then, the present invention provides a thin-film filter including: a thin-film part having a film surface and a rear film surface arranged at the rear side of the film surface; a plurality of through holes, being formed to penetrate the thin-film part from the film surface to the rear film surface, the through holes are formed along by a slanting direction being made an acute angle or an obtuse angle with the film surface; and protrusions-formed inner wall surfaces including projecting parts protruding along by an intersecting direction intersecting with the slanting direction, the protrusions-formed inner wall surfaces are formed inside the respective through holes.

Further, the present invention provides a thin-film filter including: a laminated structure which a first filter and a second filter are piled up; the first filter includes a first film surface, a first rear film surface, being arranged at the rear side of the first film surface, and a plurality of first through holes, which penetrate from the first film surface to the first rear film surface, and being formed along by a first slanting direction being made an acute angle or an obtuse angle with the first film surface, the second filter includes a second film surface, a second rear film surface, being arranged at the rear side of the second film surface, and a plurality of second through holes, which penetrate from the second film surface to the second rear film surface, and being formed along by a second slanting direction being made an acute angle or an obtuse angle with the second film surface, the thin-film filter includes a plurality of serial through holes, which the first through holes and the second through holes are respectively connected from the first film surface of the first filter to the second film surface or the second rear film surface of the second filter, the serial through holes includes protrusions-formed inner wall surfaces having projecting parts which protrude along by an intersecting direction intersecting with the first slanting direction and the second slanting direction.

In case of the above-described thin-film filter, it is possible that the laminated structure is a structure which the first filter and the second filter are piled up so that the first slanting direction is corresponding to the second slanting direction.

Further, it is possible that the laminated structure is a structure which the first filter and the second filter are piled up so that the first slanting direction is different from the second slanting direction.

Further, it is possible that the thin-film filter, further including: first stripes-formed inner wall surfaces having first stripe-like parts formed along by the first slanting direction, the first stripes-formed inner wall surfaces are formed inside the first through holes of the respective serial through holes; and second stripes-formed inner wall surfaces having second stripe-like parts formed along by the second slanting direction, the second stripes-formed inner wall surfaces are formed inside the second through holes of the respective serial through holes.

Then, the present invention provides a thin-film filter substrate including: a base substrate having a base surface; and a thin-film filter, being formed on the base surface of the base substrate, the thin-film filter includes a thin-film part having a film surface and a rear film surface arranged at the rear side of the film surface, a plurality of through holes, being formed to penetrate the thin-film part from the film surface to the rear film surface, the through holes are formed along by a slanting direction being made an acute angle or an obtuse angle with the film surface, and stripes-formed inner wall surfaces having stripe-like parts formed along by the slanting direction, the stripes-formed inner wall surfaces are formed inside the respective through holes.

Further, the present invention a thin-film filter substrate including: a base substrate having a base surface; and a thin-film filter, being formed on the base surface of the base substrate, the thin-film filter includes a thin-film part having a film surface and a rear film surface arranged at the rear side of the film surface, a plurality of through holes, being formed to penetrate the thin-film part from the film surface to the rear film surface, the through holes are formed along by a slanting direction being made an acute angle or an obtuse angle with the film surface, and protrusions-formed inner wall surfaces including projecting parts protruding along by an intersecting direction intersecting with the slanting direction, the protrusions-formed inner wall surfaces are formed inside the respective through holes.

In case of the above-described filter substrate, the thin-film filter substrate, further including: a peeling-off adhesive layer capable of being peeled off, the peeling-off adhesive layer is formed on the base surface, the thin-film filter is formed on the peeling-off adhesive layer.

Then, the present invention provides a method of manufacturing a thin-film filter including: a peeling-off adhesive layer forming step of forming a peeling-off adhesive layer, capable of being peeled off, on a base substrate; a thin-film filter forming step of forming a thin-film filter on the peeling-off adhesive layer; and a thin-film filter peeling-off step of peeling off the thin-film filter from the peeling-off adhesive layer of a thin-film filter substrate, which the peeling-off adhesive layer and the thin-film filter are formed by performing the peeling-off adhesive layer forming step and the thin-film filter forming step, the thin-film filter forming step includes a resin layer forming step of forming a resin layer on the peeling-off adhesive layer of the base substrate, and a through hole forming step of forming through holes which penetrate from a front surface to a rear surface of the resin layer, so that stripes-formed inner wall surfaces, having stripe-like parts being formed along by a slanting direction being made an acute angle or an obtuse angle with the surface of the resin layer, are formed.

Further, in case of the above-described method of manufacturing the thin-film filter, it is preferable that the thin-film filter forming step further includes a metal layer forming step of forming a metal layer on the surface of the resin layer, a resist pattern forming step of forming a resist pattern, which a plurality of hole parts are formed, on the metal layer, and a metal pattern forming step of forming a metal pattern by forming corresponding hole parts, to the metal layer, corresponding to the hole parts by using the resist pattern as a mask, the through hole forming step includes reactive ion etching being performed of using the metal pattern as a mask to form the stripes-formed inner wall surfaces.

Further, it is possible that the through hole forming step includes the reactive ion etching being performed by slanting a base substrate with resin-layer, which the resin layer is formed, to etch the resin layer along by the slanting direction.

Further, it is possible that the method of manufacturing a thin-film filter, further including: a filter laminating step which two sheets of the thin-film filter substrates are prepared, the thin-film filter, being formed on any one of the thin-film filter substrates, is piled up on the thin-film filter, being formed on the other thin-film filter substrates.

Then, the present invention provides a method of manufacturing a thin-film filter substrate, which a thin-film filter is formed on a base substrate including: a peeling-off adhesive layer forming step of forming a peeling-off adhesive layer, capable of being peeled off, on the base substrate; and a thin-film filter forming step of forming a thin-film filter on the peeling-off adhesive layer, the thin-film filter forming step includes a resin layer forming step of forming a resin layer on the peeling-off adhesive layer of the base substrate, and a through hole forming step of forming through holes which penetrate from a front surface to a rear surface of the resin layer, so that stripes-formed inner wall surfaces, having stripe-like parts being formed along by a slanting direction being made an acute angle or an obtuse angle with the surface of the resin layer, are formed.

In case of the above-described method of manufacturing, it is possible that the thin-film filter forming step further includes a metal layer forming step of forming a metal layer on the surface of the resin layer, a resist pattern forming step of forming a resist pattern, which a plurality of hole parts are formed, on the metal layer, and a metal pattern forming step of forming a metal pattern by forming corresponding hole parts, to the metal layer, corresponding to the hole parts by using the resist pattern as a mask, the through hole forming step includes reactive ion etching being performed using the metal pattern as a mask to form the stripes-formed inner wall surfaces.

Further, it is possible that the reactive ion etching is performed by slanting a base substrate with resin-layer, which the resin layer is formed, to etch the resin layer along by the slanting direction.

Then, the present invention provides a MEMS microphone including: a MEMS chip; a package substrate which the MEMS chip is adhered; and a thin-film filter, being formed on the package substrate or the MEMS chip, the thin-film filter includes a thin-film part having a film surface and a rear film surface arranged at the rear side of the film surface, a plurality of through holes, being formed to penetrate the thin-film part from the film surface to the rear film surface, the through holes are formed along by a slanting direction being made an acute angle or an obtuse angle with the film surface; and stripes-formed inner wall surfaces having stripe-like parts formed along by the slanting direction, the stripes-formed inner wall surfaces are formed inside the respective through holes.

Further, the present invention provides a MEMS microphone including: a MEMS chip; a package substrate which the MEMS chip is adhered; and a thin-film filter, being formed on the package substrate or the MEMS chip, the thin-film filter includes a thin-film part having a film surface and a rear film surface arranged at the rear side of the film surface, a plurality of through holes, being formed to penetrate the thin-film part from the film surface to the rear film surface, the through holes are formed along by a slanting direction being made an acute angle or an obtuse angle with the film surface; and protrusions-formed inner wall surfaces including projecting parts protruding along by an intersecting direction intersecting with the slanting direction, the protrusions-formed inner wall surfaces are formed inside the respective through holes.

Further, the present invention provides a method of manufacturing a MEMS microphone using a MEMS chip and a package substrate which the MEMS chip is adhered including: a photosensitive-adhesive layer forming step of forming a photosensitive-adhesive layer, made of photosensitive-adhesive, on a surface of a package-panel which a plurality of package-regions, for manufacturing the package substrate, are formed; a thin-film filter peeling-off step of peeling-off a thin-film filter from a peeling-off adhesive layer of a thin-film filter substrate, which is manufactured by performing a peeling-off adhesive layer forming step of forming the peeling-off adhesive layer, capable of being peeled off, on a base substrate and a thin-film filter forming step of forming the thin-film filter on the peeling-off adhesive layer; and a thin-film filter transcribing step for transcribing the thin-film filter, peeled off by the thin-film filter peeling-off step, to the package-panel, the thin-film filter forming step includes a resin layer forming step of forming a resin layer on the peeling-off adhesive layer of the base substrate, and a through hole forming step of forming through holes which penetrate from a front surface to the rear surface of the resin layer, so that stripes-formed inner wall surfaces, having stripe-like parts being formed along by a slanting direction being made an acute angle or an obtuse angle with the surface of the resin layer, are formed.

In case of the above-described method of manufacturing the MEMS microphone, it is possible that the thin-film filter forming step further includes a metal layer forming step of forming a metal layer on the surface of the resin layer, a resist pattern forming step of forming a resist pattern, which a plurality of hole parts are formed, on the metal layer, and a metal pattern forming step of forming a metal pattern by forming corresponding hole parts, to the metal layer, corresponding to the hole parts by using the resist pattern as a mask, the through hole forming step includes reactive ion etching being performed of using the metal pattern as a mask to form the stripes-formed inner wall surfaces, the reactive ion etching is performed by slanting a base substrate with resin-layer, which the resin layer is formed, to etch the resin layer along by the slanting direction.

As described above, the present invention provides the thin-film filter having the sophisticated filtering function because of the higher capability for catching foreign matter than the conventional filter, the thin-film filter substrate having the thin-film filter, the method of manufacturing the thin-film filter, the method of manufacturing the thin-film filter substrate, the MEMS microphone having the thin-film filter and the method of manufacturing the MEMS microphone.

The present invention will be more fully understood from the detailed description given hereinbelow and the accompanying drawings which are given by way of illustration only, and thus are not to be considered as limiting the present invention.

BRIEF DESCRIPTION OF THE DRAWINGS

FIG. 13 is a sectional view of a principal part showing the manufacturing step subsequent that in FIG. 12;

DETAILED DESCRIPTION OF THE EMBODIMENTS

In the following, embodiments of the present invention will be described with reference to the drawings. Note that the same components will be referred to with the same numerals or letters, while omitting their overlapping descriptions.

(First Embodiment of the Thin-Film Filter and the Thin-Film Filter Substrate)

Figure 1:
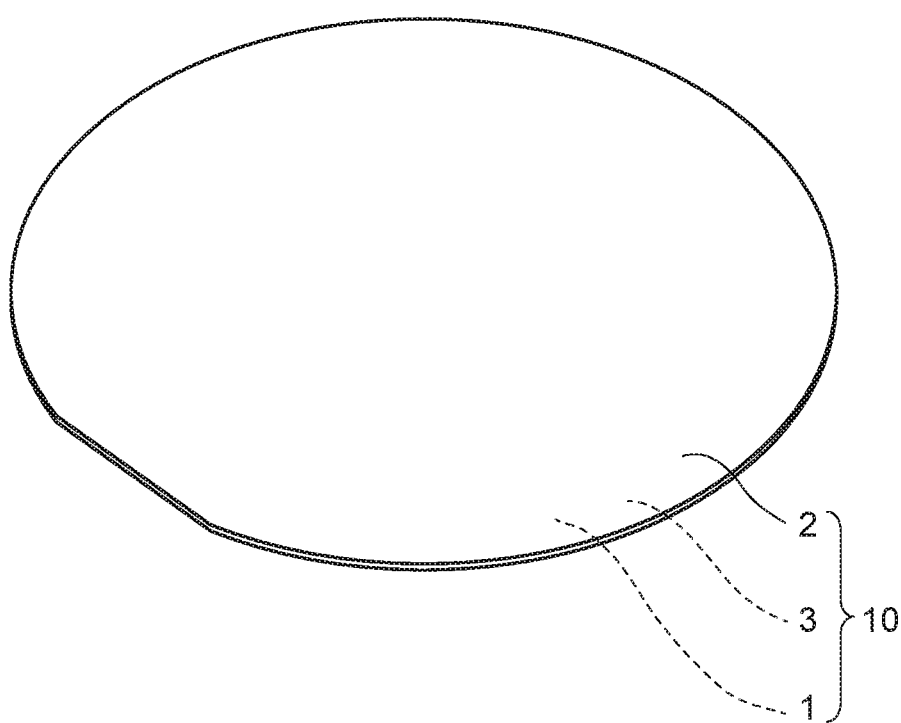
FIG. 1 is a perspective view showing a thin-film filter substrate according to the first embodiment of the present invention.
Figure 2:
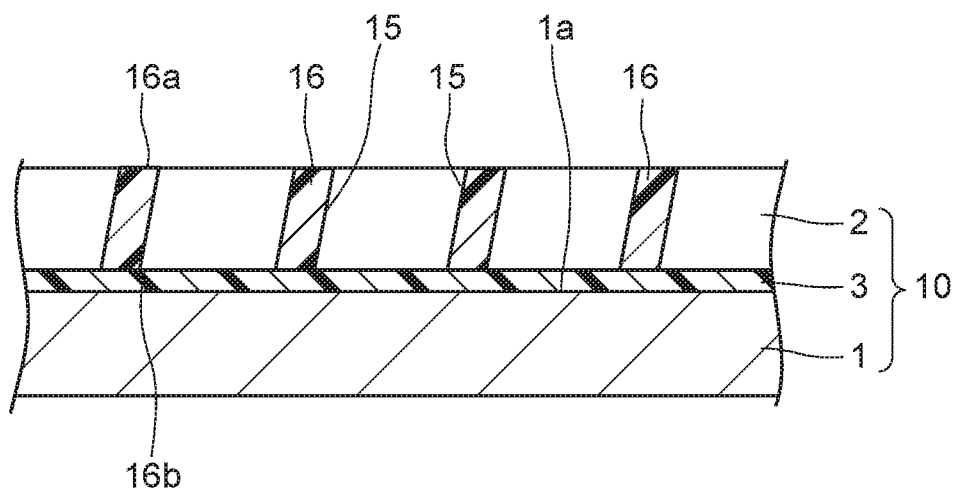
FIG. 2 is a sectional view of the thin-film filter substrate.
Figure 3:
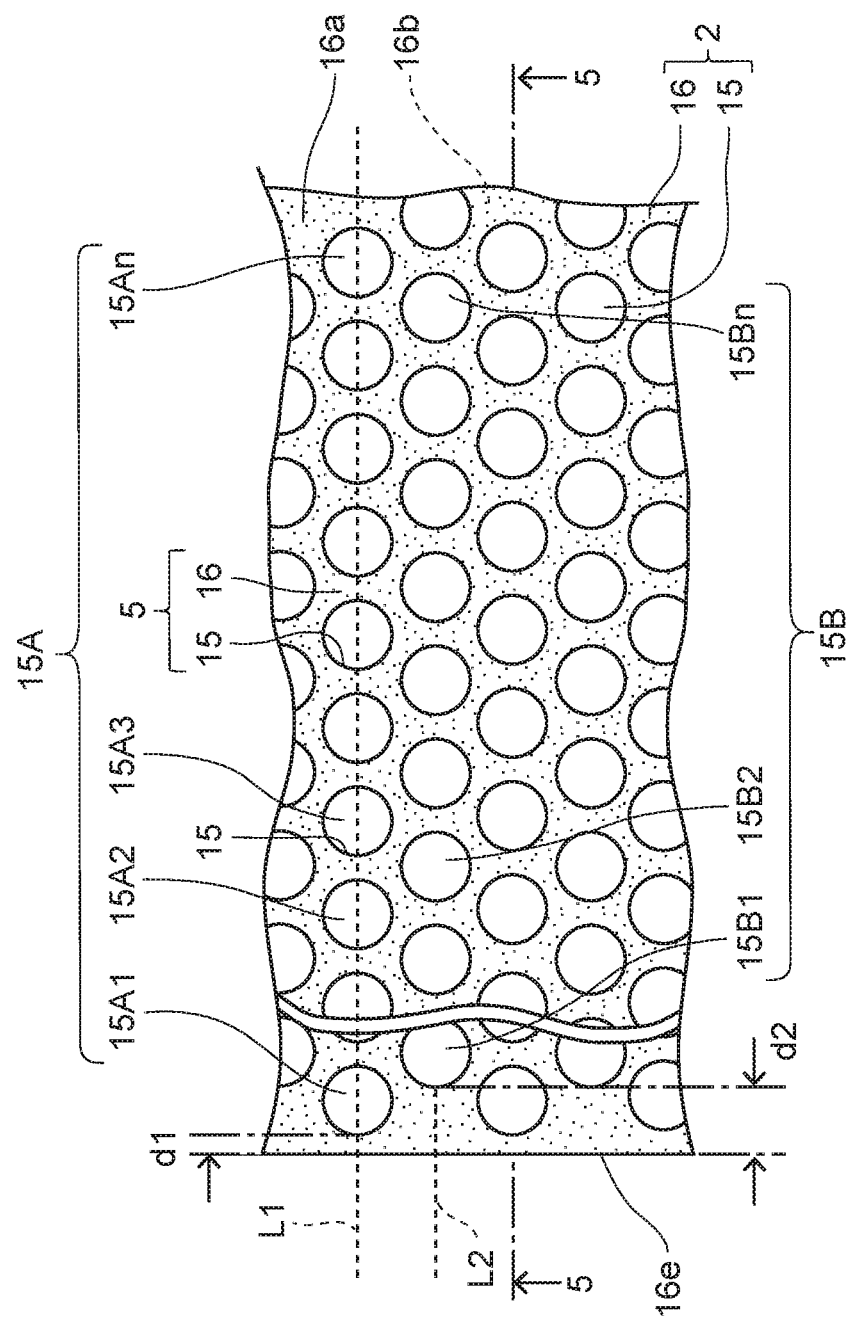
FIG. 3 is a plan view, with enlargement, of a principal part of a thin-film filter.
Figure 4:
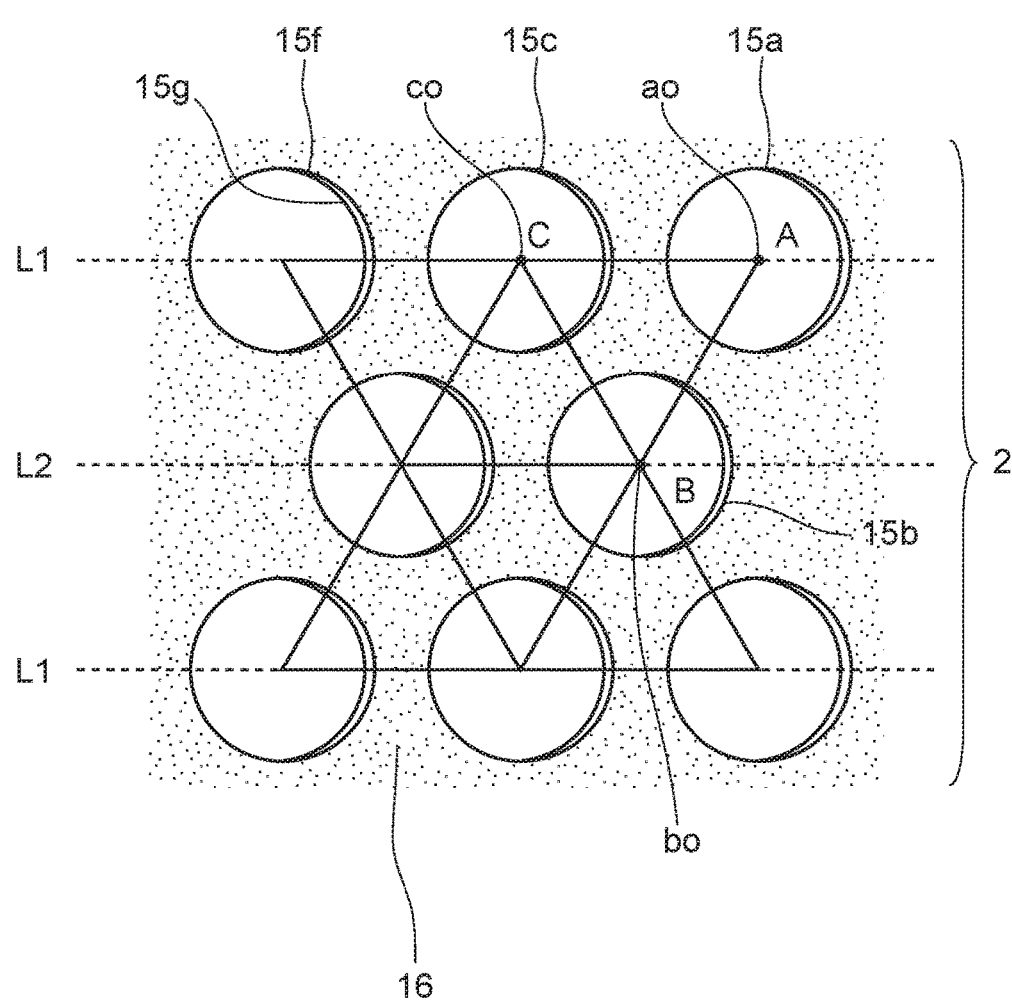
FIG. 4 is a plan view, with enlargement, of the part, including a plurality of through holes, of the thin-film filter.
Figure 5:
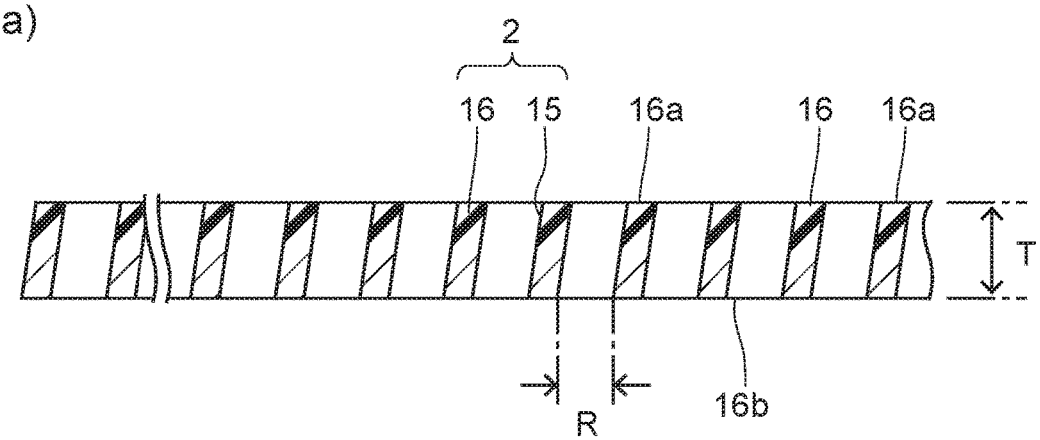
FIG. 5(a) is a sectional view of a part corresponding to the line 5-5 in FIG. 3.
FIG. 5(b) is a sectional view showing the principal part in FIG. 5 (a)
Figure 5:
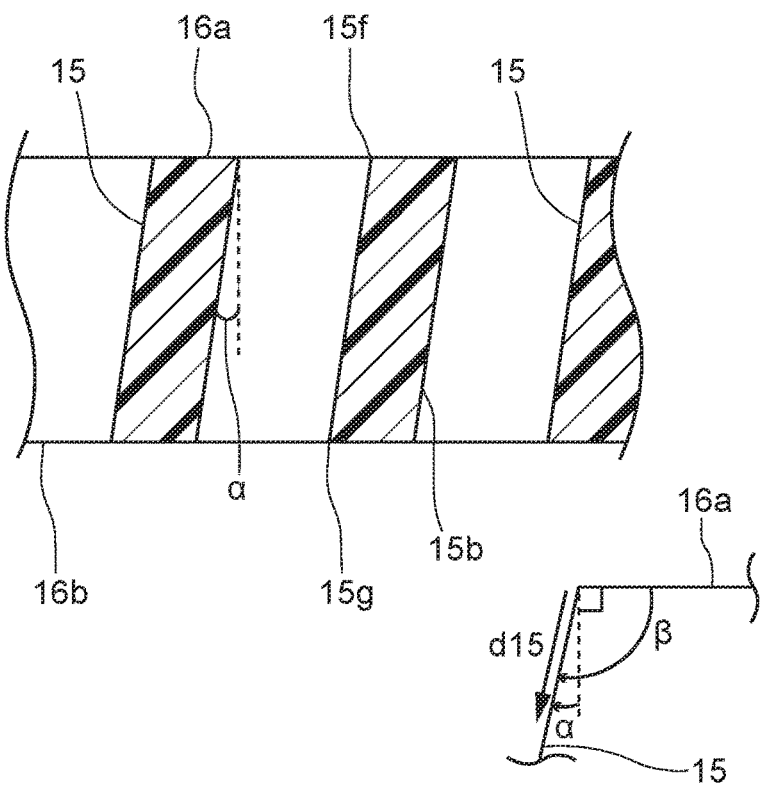
Figure 6:
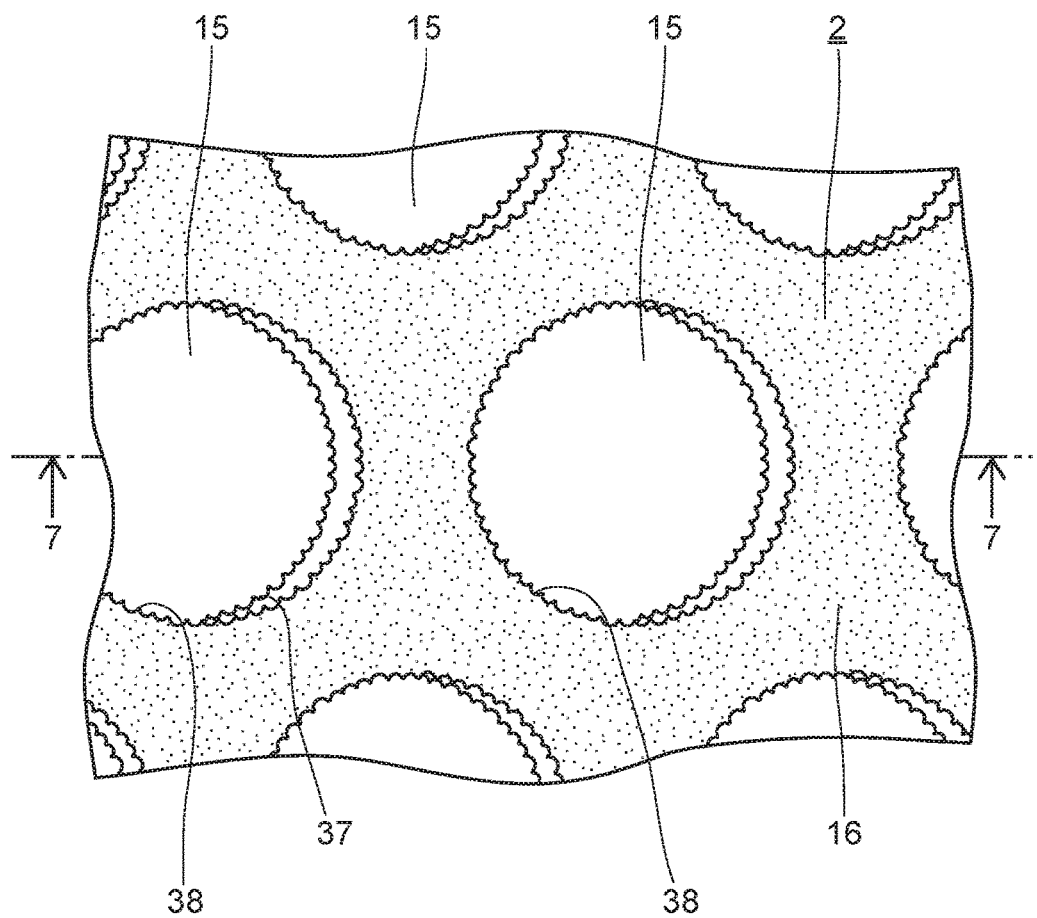
FIG. 6 is a plan view, with more enlargement, showing a principal part of the thin-film filter according to the embodiment of the present invention.
Figure 7:
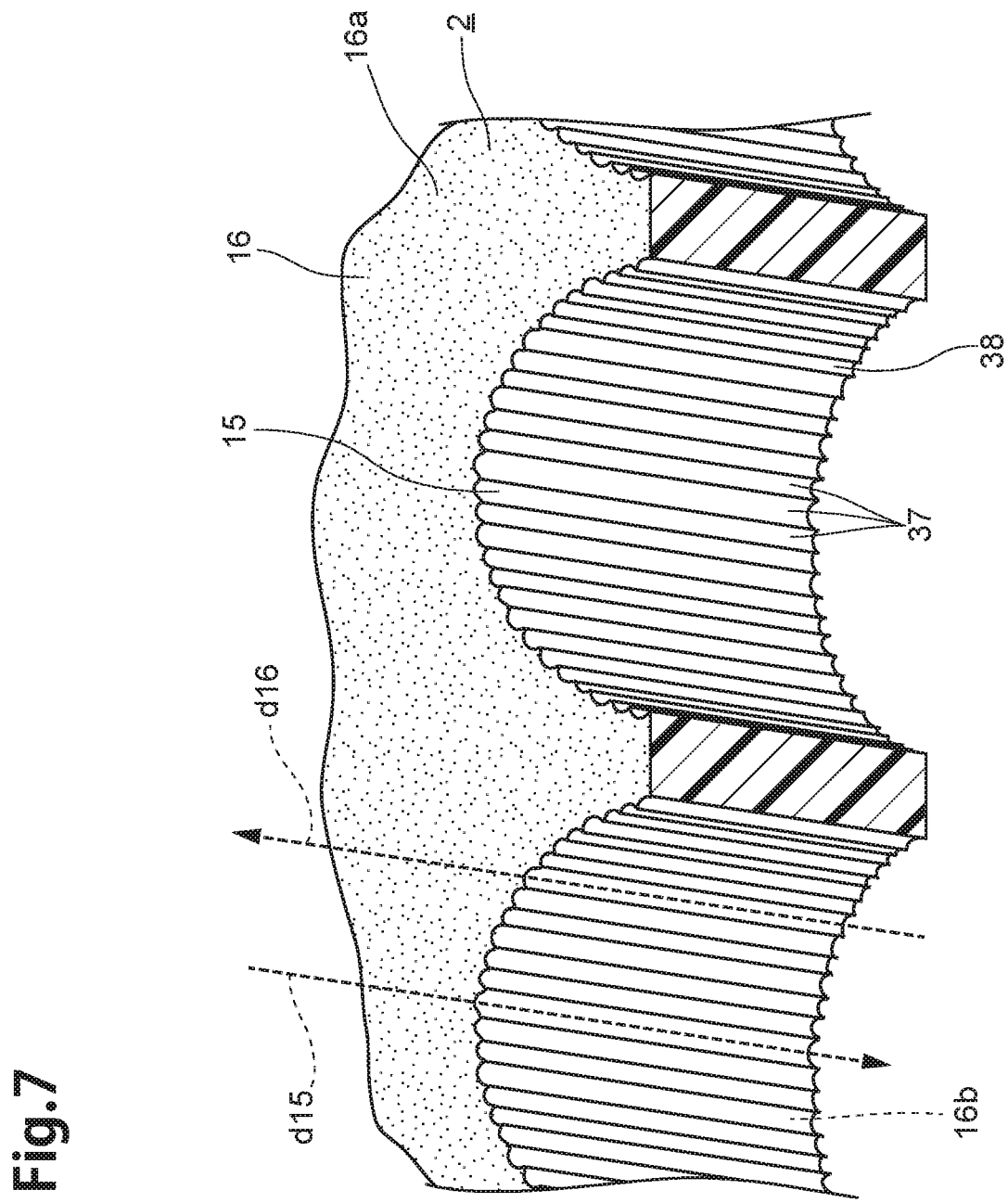
FIG. 7 is a perspective view showing a sectional surface corresponding to the line 7-7 in FIG. 6.
Figure 8:
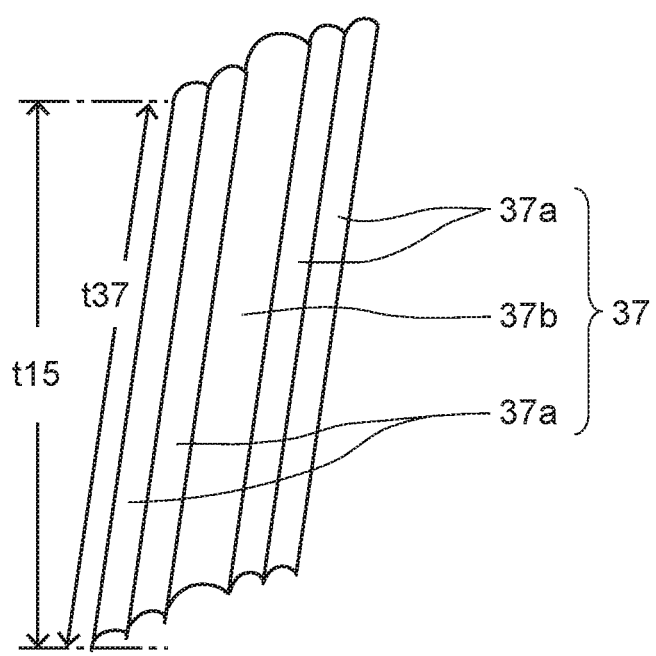
FIG. 8 is a perspective view showing a principal part of a stripe-like part.

To begin with, the structure of a thin-film filter 2, a thin-film filter substrate 10, according to the first embodiment of the present invention will be explained with mainly reference to FIG. 1 to FIG. 8. Here, FIG. 1 is a perspective view showing the thin-film filter substrate 10 according to the first embodiment of the present invention. FIG. 2 is a sectional view of the thin-film filter substrate 10. FIG. 3 is a plan view, with enlargement, of the principal part of the thin-film filter 2. FIG. 4 is a plan view, with enlargement, of the part, including a plurality of through holes 15, of the thin-film filter 2. FIG. 5(a) is a sectional view of a part corresponding to the line 5-5 in FIG. 3. FIG. 5(b) is a sectional view showing a principal part in FIG. 5 (a). FIG. 6 is a plan view, with more enlargement, showing a principal part of the thin-film filter 2. FIG. 7 is a perspective view showing a sectional surface corresponding to the line 7-7 in FIG. 6. FIG. 8 is a perspective view showing a principal part of a stripe-like part 37.

The thin-film filter substrate 10 includes a silicon wafer 1, as a base substrate (a substrate, made of glass, quartz or the like, are able to be used), the thin-film filter 2 and a peeling-off adhesive layer 3.

The silicon wafer 1 has a base surface 1a, being a surface of one side. As illustrated in FIG. 2, the peeling-off adhesive layer 3 is formed on the base surface 1a, the thin-film filter 2 is formed on the peeling-off adhesive layer 3.

The thin-film filter 2 is a filter used for prevention of entry of particles and water. As illustrated in FIG. 3, the thin-film filter 2 includes a thin-film part 16, which is formed with polyamide or polyimide film. Further, a plurality of through holes 15 are formed in the thin-film part 16, and stripes-formed inner wall surfaces 38, as illustrated in FIGS. 6, 7, are formed inside the respective through holes 15.

The thin-film part 16 has a film surface 16a, being a surface of one side, and a rear film surface 16b, being arranged rear side of the film surface 16a, as illustrated in FIG. 2. A plurality of through holes 15 are formed in the thin-film part 16 uniformly by a regular arrangement. In FIG. 3, FIG. 4, dots are shown in the film surface 16a.

The respective through holes 15 are hole parts which penetrate from the film surface 16a to the rear film surface 16b, as illustrated in FIG. 2. The respective through holes 15 are formed in the constant size (diameter), from the film surface 16a to the rear film surface 16b. The through holes 15 are also formed so that the intervals of the adjacent through holes 15 are constant sizes.

Further, as illustrated in FIG. 5(b) in detail, the respective through holes 15 are formed along by a slanting direction d15. The slanting direction d15 is a direction which forms a hole inner angle β (β is an obtuse angle) with the film surface 16a. The hole inner angle β is larger than a direction intersecting vertically with the film surface 16a, the difference is an acute angle α (the hole inner angle β is the sum of the right angle and the acute angle α). The acute angle α is able to be set as 5 degrees, 10 degrees, 20 degrees, for example. Note that the hole inner angle β is able to be set to the acute angle.

Further, the respective through holes 15 are formed in a circular shape in a plan view. The diameters (shown as "R" in FIG. 5(a)) is approximately about 2 μm to 6.5 μm. Further, the thickness (shown as "T" in FIG. 5(a), corresponding to a film thickness being a thickness of the thin-film part 16) of the thin-film filter 2 is approximately about 1 μm to 6 μm. Because the respective through holes 15 are formed along by the slanting direction d15, as illustrated in FIG. 4, circular peripheral parts 15f are arranged on the film surface 16a side, circular peripheral parts 15g are arranged on the rear film surface 16b side. The circular peripheral parts 15f, 15g are arranged on the both end parts, of the through holes 15, along by the slanting direction d15.

Then, as illustrated in FIG. 3 in detail, the thin-film filter 2 has a first through hole-group 15A and a second through hole-group 15B. A plurality of through holes 15, including a first through hole 15A1, through holes 15A2, 15A3 . . . through hole 15An, are included in the first through hole-group 15A. The first through hole 15A1 is arranged in a position which the interval to a peripheral end part 16e of the thin-film part 16 is set a first interval d1, and it is arranged the nearest position to the peripheral end part 16e among the through holes 15 included in the first through hole-group 15A. The first through hole 15A1, through holes 15A2, 15A3 . . . 15An are arranged at a constant interval in a straight line along by a direction intersecting vertically to the peripheral end part 16e to form a first line L1.

A plurality of through holes 15, including a second through hole 15B1, the through hole 15B2, the through hole 15Bn, are included in the second through hole-group 15B. The second through hole 15B1 is arranged in a position which the interval to the peripheral end part 16e is set a second interval d2 larger than the first interval d1, and it is arranged the nearest position to the peripheral end part 16e among through holes 15 included in the second through hole-group 15B. The second through hole 15B1, through holes 15B2 . . . 15Bn are arranged at a constant interval in the direction intersecting vertically to the peripheral end part 16e to form a second line L2.

Then, in the thin-film filter 2, the first line L1 and the second line L2 are arranged alternately.

Further, the thin-film filter 2 is formed so that the center of the through hole 15 (for example, the through hole 15B2, in FIG. 3), included in the second through hole-group 15B, is arranged between the centers of the adjacent through holes 15 (for example, the through hole 15A2, the through hole 15A3, in FIG. 3), included in the first through hole-group 15A.

The through holes 15 become a path of the air though, because the part between the adjacent through holes 15 is the thin-film part 16 (the part with dots in FIGS. 3, 4), the part does not become the path of the air.

Then, in case of the thin-film filter 2, as illustrated in FIG. 4, the three adjacent through holes 15a, 15b, 15c are considered as the representative through holes. The centers of the through holes 15a, 15b, 15c are a0, b0, c0 though, the triangle (the triangle ABC, in FIG. 4) which these centers are vertexes, is a regular triangle, according to the regularity of the arrangement of the through holes 15. Further, the thin-film filter 2 is formed so that the arrangement density of the through holes 15, in the thin-film part 16, may rise as much as possible. In case of the thin-film filter 2, the intervals between adjacent through holes 15 are narrowed so that another through hole 15 is not able to be formed in the space between the adjacent three through holes 15 (for example, another through hole 15 is not able to be formed in the space between the through holes 15a, 15b, 15c, the structure is also referred to a high-density structure).

Then, in the thin-film filter 2, as illustrated in FIG. 6, FIG. 7, the stripes-formed inner wall surfaces 38 are formed inside the respective through holes 15. The stripes-formed inner wall surface 38 includes a plurality of stripe-like parts 37. A plurality of stripe-like parts 37 are arranged in almost the whole of the inner wall surface of the respective through holes 15. The stripes-formed inner wall surfaces 38 are formed in almost the whole of the inner wall surface of the respective through holes 15. The stripe-like parts 37 are formed closely so that a smooth part does not remain in the inner wall surface of the respective through holes 15. The stripe-like parts 37 are formed in a direction along by the slanting direction d15 (d15, d16 in FIG. 7).

The respective stripe-like parts 37 are convex parts or concave parts, formed on the inner wall surface of the through holes 15, approximately in the straight line along by the slanting direction d15. All of the respective stripe-like parts 37 are able to be formed as the convex parts, and they are able to be formed as the concave parts. Both the convex parts and the concave parts are able to be included as the stripe-like parts 37.

The stripe-like parts 37 are drawn in FIG. 8, as the concave parts along by the slanting direction d15. The stripe-like parts 37, drawn in FIG. 8, have first stripe-like parts 37a and second stripe-like parts 37b, having wider widths than the first stripe-like parts 37a. The respective stripe-like parts 37 are formed in the length longer than 80% of the film thickness T. A length t15, illustrated in FIG. 8, is a length of the stripe-like part 37, in the case which the through holes are formed along by the direction intersecting vertically with the film surface 16a. The length t15 is larger than the 80% of the film thickness T. A length t37 of the respective stripe-like parts 37 is larger than the length t15 (t37>t15). Because the stripe-like parts 37 are respectively formed along by the slanting direction d15. As the stripe-like parts 37, illustrated in FIG. 8, it is possible that the lengths of the respective stripe-like parts 37 are common. It is possible that the lengths of the respective stripe-like parts 37 are different (not shown in the drawings).

The peeling-off adhesive layer 3 is formed with the adhesive capable of peeling off. For example, the peeling-off adhesive layer 3 is formed with a thermal-foaming tape made of a thermal-foaming resin, which peels off by heating, or a UV tape.

(Method of Manufacturing the Thin-Film Filter and the Thin-Film Filter Substrate)

Figure 14:
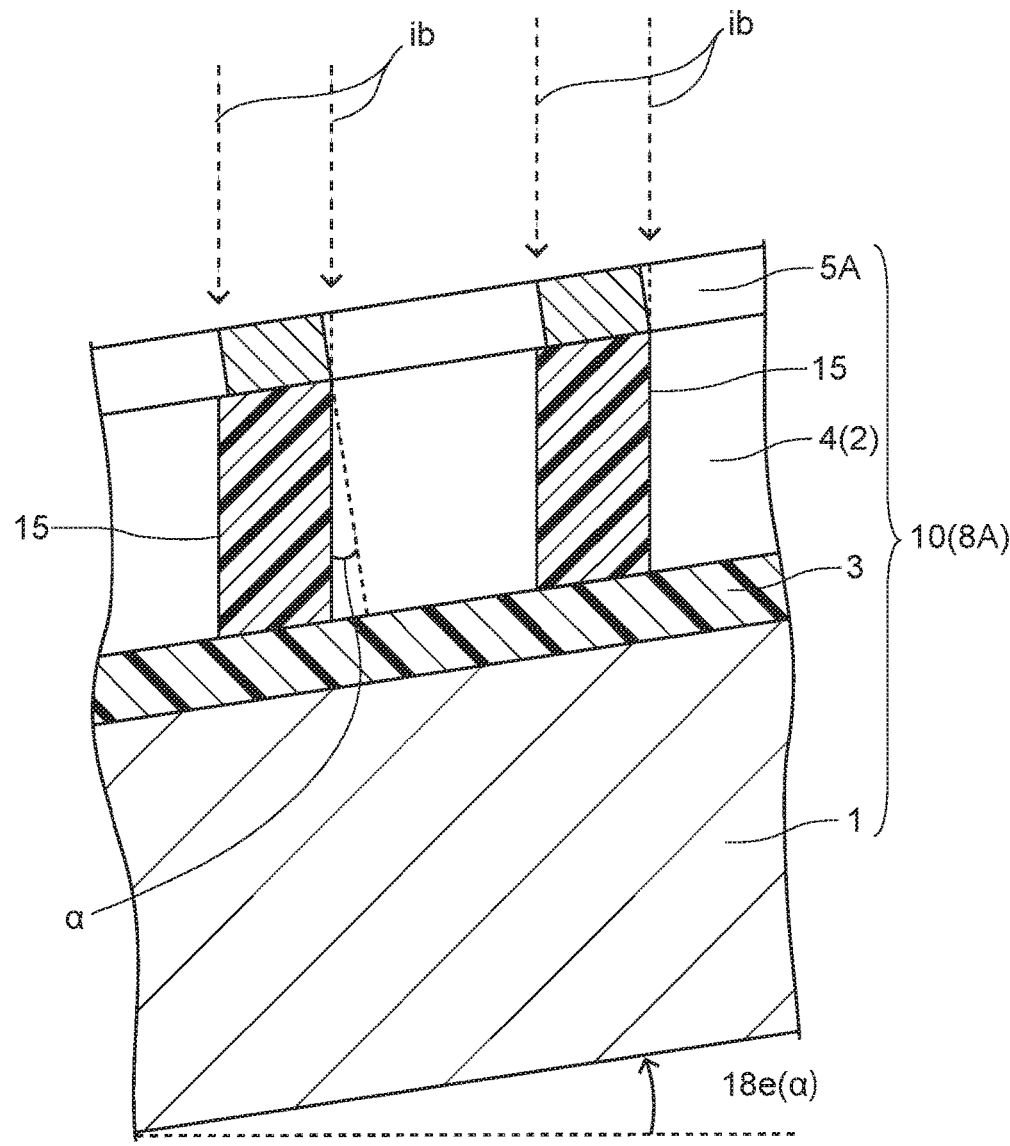
FIG. 14 is a sectional view showing a principal part of a base substrate when a through hole forming step is performed.

Subsequently, the method of manufacturing the thin-film filter 2 and the thin-film filter substrate 10, having the above-described structure, will be explained with reference to FIG. 9 to FIG. 14. Here, FIGS. 9-13 are sectional views showing principal parts of the manufacturing steps of the thin-film filter 2 and the thin-film filter substrate 10. FIG. 14 is a sectional view showing a principal part of a base substrate with resin-layer 8 when the through hole forming step is performed.

The thin-film filter substrate 10 is manufactured by performing the following thin-film filter substrate manufacturing step. The thin-film filter 2 is manufactured by performing a thin-film filter peeling-off step to the manufactured thin-film filter substrate 10.

(Thin-Film Filter Substrate Manufacturing Step)

Then, the thin-film filter substrate manufacturing step includes a peeling-off adhesive layer forming step and a thin-film filter forming step.

Figure 9:
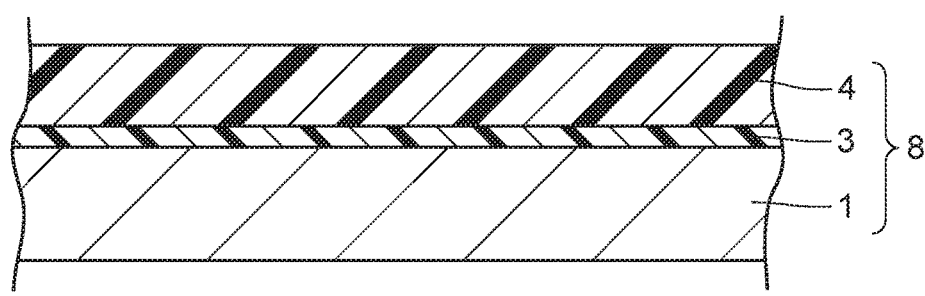
FIG. 9 is a sectional view showing a principal part of a manufacturing step of the thin-film filter and the thin-film filter substrate according to the first embodiment of the present invention.

In the peeling-off adhesive layer forming step, the peeling-off adhesive layer 3 is formed on the silicon wafer 1. In this case, for example, a thermal-foaming tape is applied on the base surface 1a of the silicon wafer 1, as a base substrate. Then, as illustrated in FIG. 9, the peeling-off adhesive layer 3 is formed. Further, the thermal-foaming resin, not-illustrated, is applied on the base surface 1a of the silicon wafer 1, thereby the peeling-off adhesive layer 3 is able to be formed.

Resin and foaming agent are included in the thermal-foaming resin. The thermal-foaming resin generates gas by heating to be able to foam. When the thermal-foaming resin is applied to form the thermal-foaming resin layer, the thermal-foaming resin layer becomes a thermal peeling-off layer, peeling-off by heating, and the peeling-off adhesive layer 3 is formed with the thermal peeling-off layer. Further, the thermal-foaming resin sheet, which the thermal-foaming resin is processed into a sheet-like form, is applied to be able to form the thermal-foaming resin layer. In this case, the peeling-off adhesive layer 3 is formed with the thermal-foaming resin sheet. Further, it is possible that the peeling-off adhesive layer 3 is formed with polyimide-based adhesive, epoxy resin-based adhesive.

Next, the thin-film filter forming step is performed to form the thin-film filter 2 on the peeling-off adhesive layer 3. A resin layer forming step, a metal layer forming step, a resist pattern forming step, a metal pattern forming step and a through hole forming step are included in the thin-film filter forming step.

At first, the resin layer forming step is performed. In the resin layer forming step, as illustrated in FIG. 9, a resin layer 4 is formed, with polyamide or polyimide film, on the peeling-off adhesive layer 3. The resin layer 4 is formed on the peeling-off adhesive layer 3, thereby a base substrate with resin-layer 8 is formed.

Figure 10:
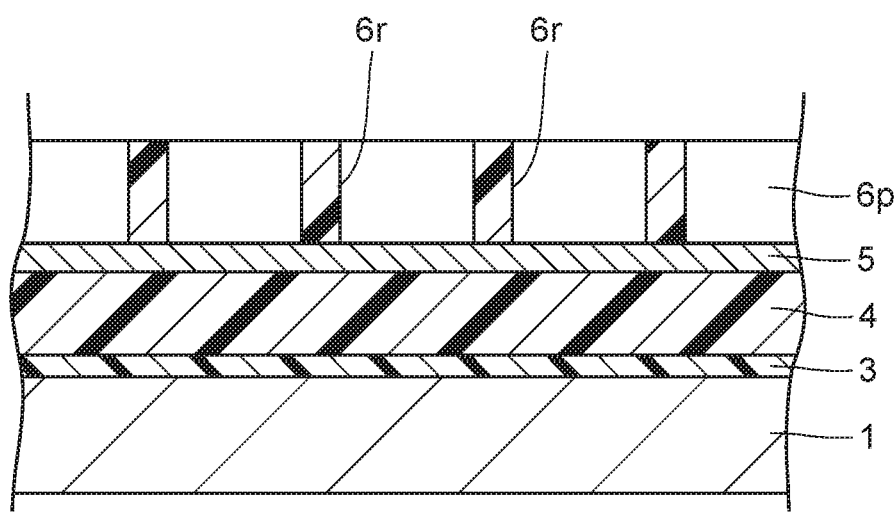
FIG. 10 is a sectional view of a principal part showing the manufacturing step subsequent that in FIG. 9.

Next, the metal layer forming step is performed. In the metal layer forming step, as illustrated in FIG. 10, a metal layer 5 is formed, with titanium (Ti), on the surface of the resin layer 4. The metal layer 5 is able to be formed, with SUS, Cr other than titanium (Ti).

Subsequently, the resist pattern forming step is performed. In the resist pattern forming step, photoresist is applied on the surface of the metal layer 5. After that, an exposure is performed with a not-illustrated photomask, further a development is performed, thereby a resist pattern 6p, having a plurality of hole parts 6r, is formed.

Figure 11:
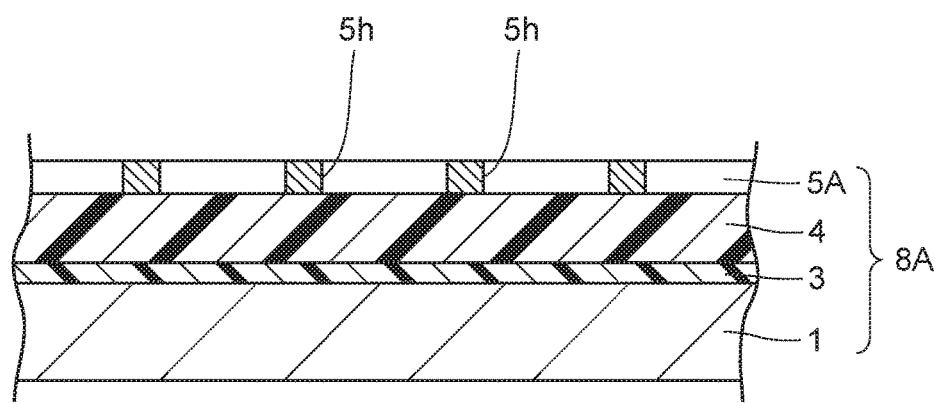
FIG. 11 is a sectional view of a principal part showing the manufacturing step subsequent that in FIG. 10.

Next, the metal pattern forming step is performed. In the metal pattern forming step, a milling with Ar, to the metal layer 5, is performed with the resist pattern 6p as a mask (reactive ion etching is able to be performed, wet etching is also able to be performed). After that, the resist pattern 6p is removed. Then, as illustrated in FIG. 11, unnecessary parts of the metal layer 5 are removed to form corresponding hole parts 5h, corresponding to the hole parts 6r of the resist pattern 6p, is formed on the metal layer 5. Thereby a metal pattern 5A is formed. The metal pattern 5A is formed by a pattern corresponding to the thin-film filter 2, being formed later. Thereby, a base substrate with-pattern 8A, having the metal pattern 5A, is formed.

Subsequently, the through hole forming step is performed. In the through hole forming step, the metal pattern 5A is used as the mask to form the through holes 15, being along by the slanting direction d15, in the resin layer 4. Then, reactive ion etching (RIE), to the resin layer 4, is performed so that the stripes-formed inner wall surfaces 38, having the stripe-like parts 37, are formed.

Figure 12:
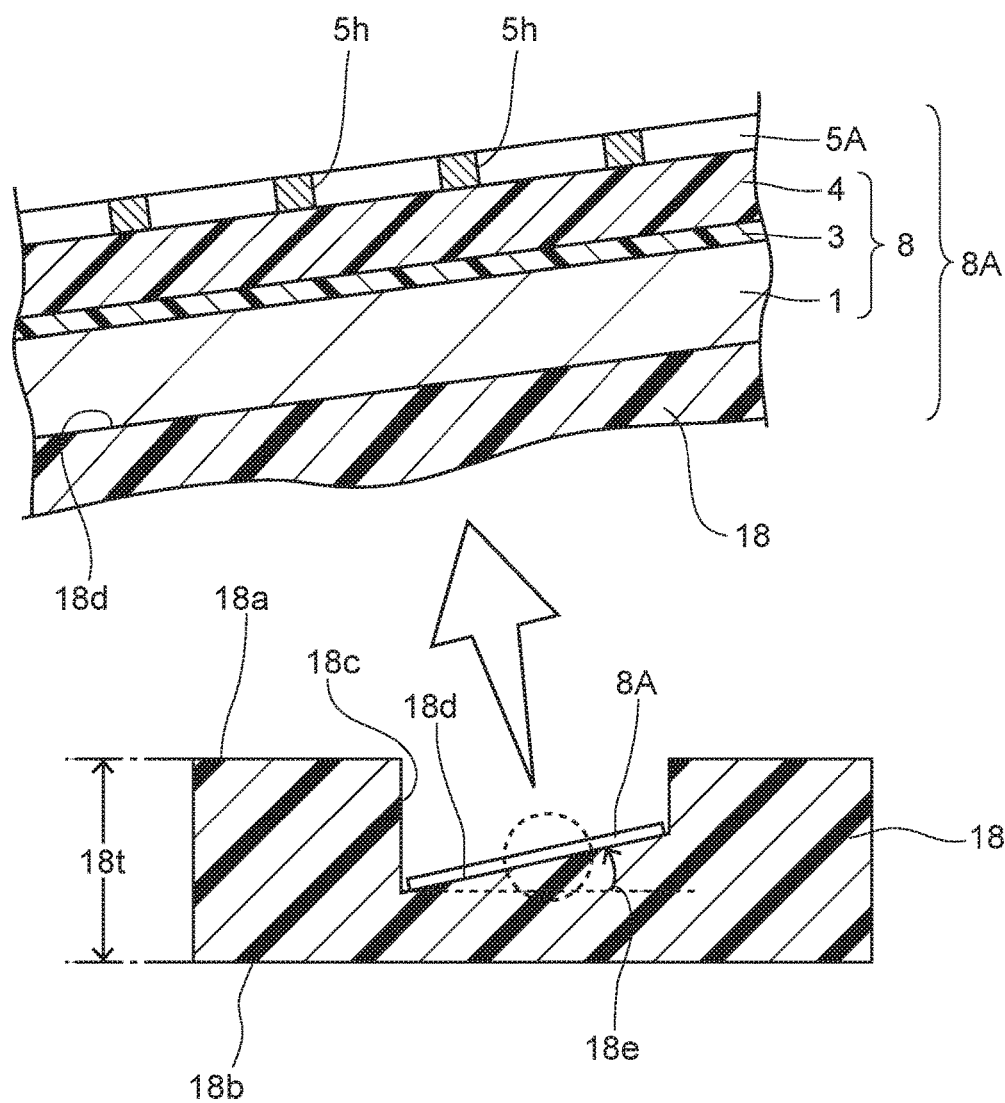
FIG. 12 is a sectional view of a principal part showing the manufacturing step subsequent that in FIG. 11.

In this case, in the through hole forming step, as illustrated in FIG. 12, a substrate tray (also referred to a wafer tray) 18 is used. The substrate tray 18 is a member having a predetermined tray thickness 18t. The substrate tray 18 has a tray surface 18a, in the front side, and a rear surface 18b. A concave part 18c, corresponding to the size of the silicon wafer 1, is formed on the center of the tray surface 18a. The concave part 18c has a bottom part 18d. The bottom part 18d is formed so that a bottom part angle 18e, being formed by the bottom part 18d and the tray surface 18a (or the rear surface 18b), is an acute angle (for example, the above-described acute angle α). The bottom part 18d is inclined at an acute angle (for example, the above-described acute angle α) with respect to the tray surface 18a. Then, in the through hole forming step, the base substrate with-pattern 8A is accommodated in the concave part 18c to be mounted on the bottom part 18d.

Then, as illustrated in FIG. 13, the parts, which are not covered with the metal patterns 5A, of the resin layer 4, are removed as unnecessary parts. In this case, the through holes 15 are formed in the portions which the unnecessary parts are removed. In case of reactive ion etching, etching proceeds by effects of both sputter operation with ion and chemical reaction. Therefore, in case of reactive ion etching, a perpendicular shape, not having under cut, is likely to be realized. Accordingly, a plurality of stripe-like parts 37 are formed inside the respective through holes 15, thereby the stripes-formed inner wall surfaces 38 are formed. In this way, after reactive ion etching (RIE) is performed to the resin layer 4, the thin-film filter 2, having the thin-film part 16, is obtained by using the resin layer 4.

At this time, the base substrate with-pattern 8A (the base substrate with resin-layer 8) is mounted on the bottom part 18d. Therefore, it is possible that reactive ion etching (RIE) is performed on the condition which the base substrate with-pattern 8A (the base substrate with resin-layer 8) is inclined. Then, as illustrated in FIG. 14, because ion beams ib hit the resin layer 4 via the metal pattern 5A from the vertical direction of the tray surface 18a, the resin layer 4 is etched along by the slanting direction d15. Thereby the through holes 15, along by the slanting direction d15, are formed.

After the through hole forming step is performed, as illustrated in FIG. 2, the metal pattern 5A is sometimes removed through, the metal pattern 5A is sometimes left on the surface of the thin-film part 16 (the film surface 16a), as the thin-film filter 2 illustrated in FIG. 13. As described above, the thin-film filter substrate 10 is manufactured.

Figure 36:
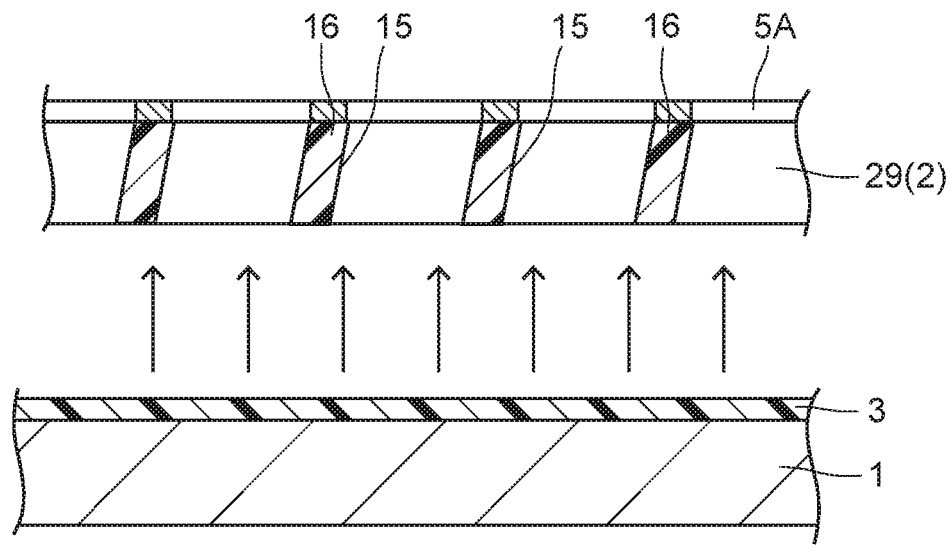
FIG. 36 is a sectional view showing a principal part of a thin-film filter peeling-off step.

Next, the thin-film filter peeling-off step is performed. Then the thin-film filter 2 is manufactured. When the thin-film filter peeling-off step is performed, as illustrated in FIG. 36, the thin-film filter 2 is peeled off from the peeling-off adhesive layer 3 of the thin-film filter substrate 10 (this will be described later). Thereby the thin-film filter 2 is manufactured.

(Operation and Effect of the Thin-Film Filter and the Thin-Film Filter Substrate)

In the above-described thin-film filter 2, the stripes-formed inner wall surfaces 38 are formed inside the respective through holes 15. The stripes-formed inner wall surfaces 38 have respectively a plurality of stripe-like parts 37, which are formed along by the slanting direction d15. Then, when air, including foreign matters such as dust, particles or the like, passes through the thin-film filter 2, the stream of air (passing stream) is in contact with the stripe-like parts 37, being formed inside the through holes 15, the foreign matters are caught effectively due to the stripe-like parts 37.

Moreover, the respective through holes 15 are formed along by the slanting direction d15, the length of the respective through holes 15 are longer than the length of the respective through holes, being formed vertically with respect to the film surface 16a. Therefore, the lengths of the stripes-formed inner wall surfaces 38, the lengths of the stripe-like parts 37 are longer than the lengths of the vertically formed through holes, and the whole surface areas of the stripe-like parts 37 are large. Therefore, the thin-film filter 2 has the sophisticated filtering function than the conventional filter because of the higher capability for catching foreign matters than the conventional filter.

Furthermore, because the respective through holes 15 are formed along by the slanting direction d15, the diameters (hole sizes) of the respective through holes 15 are larger than the case which he respective through holes 15 are formed vertically with respect to the film surface 16a (for example, the hole sizes are enlarged by about 8%, when the acute angle α is 5 degrees. The hole sizes are enlarged by respectively about 14%, 30% when the acute angle α is 10 degrees, 20 degrees). Therefore, because a passing through air current is easy to pass through the thin-film filter 2, the thin-film filter 2 has not only the higher capability for catching foreign matters but also the higher breathability.

Further, in the thin-film filter 2, hole forming process for the through holes 15 is performed by reactive ion etching. In reactive ion etching, etching proceeds by effect of both sputter operation by ion and chemical reaction. In this case, removed material (polyimide and so on, in case of the thin-film filter 2) is turned into volatile matter, and vacuum exhaust, including it, is performed. Therefore, production of debris and adhesion of debris are never occurred. Therefore, hole size of the respective through holes 15 never become uneven. Accordingly, in the thin-film filter 2, lowering the filtering function, originated in the manufacturing process, is never occurred, durability of the thin-film filter 2 is also good.

In case of the thin-film filter 2, because the stripe-like parts 37 are arranged in almost the whole of the inner wall surfaces of the respective through holes 15, foreign matters are caught in almost the whole of the inner wall surfaces of the respective through holes 15. Further, because the stripe-like parts 37 are formed in the size larger than 80% of the film thickness T, the good filtering function is exhibited in the wider range.

Then, in the thin-film filter 2, the centers of the through holes 15, included in the second through hole-group 15B, are arranged between the centers of the adjacent through holes 15, included in the first through hole-group 15A. Therefore, in the thin-film filter 2, there is no waste of the arrangement of through holes 15. Further, the parts, having a function as a path of the passing through air, is secured effectively. Further, because the thin-film filter 2 has the high-density structure, the arrangement of through holes 15 is more effective without waste.

On the other hand, because the thin-film filter 2 is a member mainly having the thin-film part 16, made of polyamide or polyimide, it is difficult to handle the thin-film filter 2 separately. However, in case of the thin-film filter substrate 10, it has the silicon wafer 1, being formed in a plane shape, handling of the thin-film filter substrate 10, such as conveyance, storage or the like, is easy.

Moreover, the thin-film filter substrate 10 includes the peeling-off adhesive layer 3, the thin-film filter 2 is peeled off from the silicon wafer 1, if necessary, thereby the thin-film filter 2 is able to be separated. The thin-film filter 2 is attached to a desired product, thereby the filtering function, that is demanded to the product, is exhibited. Therefore, the thin-film filter substrate 10 is very handy. Further, after the thin-film filter 2 is removed, the silicon wafer 1 is able to be used again as the base substrate which the thin-film filter 2 is formed. Thereby a waste of materials and resources decreases by using the thin-film filter substrate 10.

Modified Example 1

Figure 15:
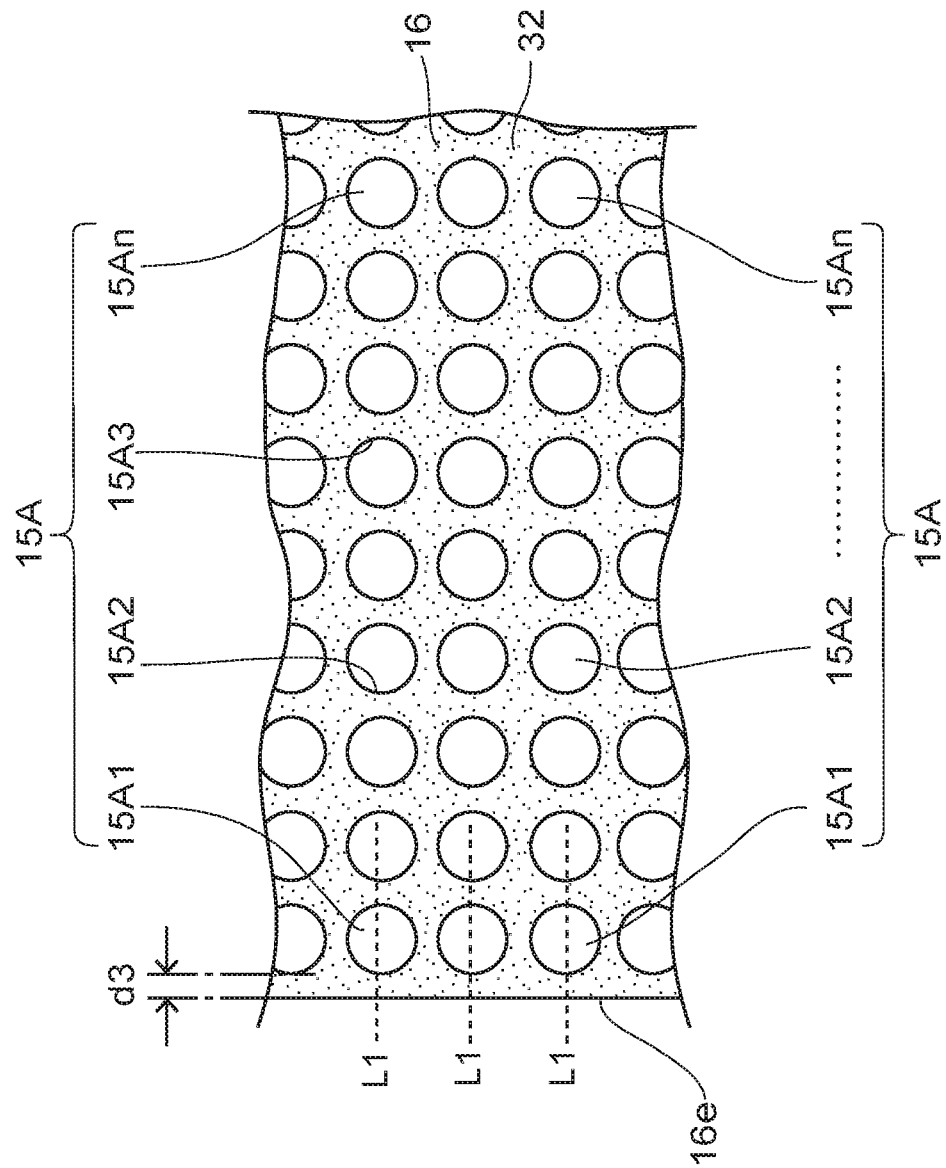
FIG. 15 is a plan view, with enlargement, of a principal part of the thin-film filter according to the modified example 1.
Figure 16:
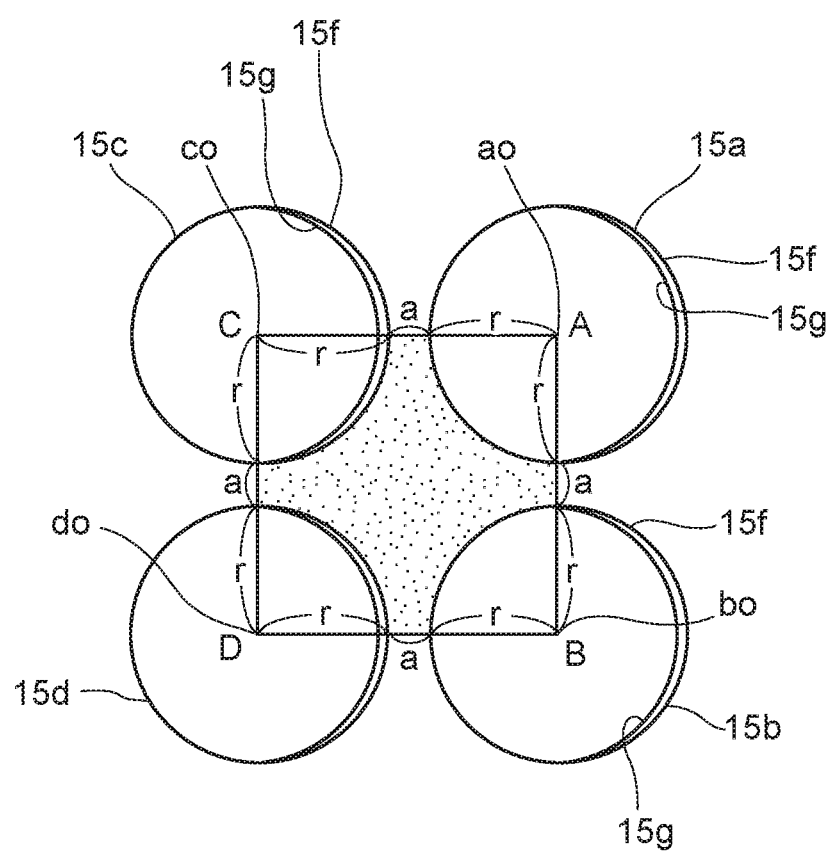
FIG. 16 is a plan view of the part, including a plurality of through holes, of the thin-film filter according to the modified example 1.

Next, the thin-film filter 32, according to a modified example 1, is explained with reference to FIG. 15, FIG. 16. FIG. 15 is a plan view showing a principal part of the thin-film filter 32 according to the modified example 1. FIG. 16 is a plan view showing a part, including representative through holes 15a, 15b, 15c, 15d, of the thin-film filter 32.

The thin-film filter 32 is different in that it has the first through hole-group 15A though, and it does not have the second through hole-group 15B, as compared with the thin-film filter 2. Because the thin-film filter 32 does not have the second through hole-group 15B, a plurality of the first lines L1 are arranged. Further, the first through hole 15A1, through holes 15A2, 15A3 . . . 15An, included in the each first line L1, are arranged at a constant interval in a straight line along by the direction intersecting vertically to the peripheral end part 16e. Furthermore, a plurality of first through holes 15A1, included in the each first line L1, are arranged at a constant interval in a straight line along by the peripheral end part 16e (similar with the through holes 15A2, 15A3 . . . 15An). All intervals between the first through holes 15A1 and the peripheral end part 16e are set an end-interval d3 having constant value.

In case of the thin-film filter 32, as illustrated in FIG. 16, the adjacent four through holes 15a, 15b, 15c, 15d are set as the representative through holes. The centers of the through holes 15a, 15b, 15c, 15d are a0, b0, c0, d0.

A rectangular ABCD is a rectangular which the centers a0, b0, c0, d0 of a plurality of adjacent through holes 15(15a, 15b, 15c, 15d), included in the adjacent two first through hole-groups 15A, are vertexes, and the rectangular ABCD is a square, according to the regularity of the arrangement of the through holes 15.

The thin-film filter 32 has a plurality of through holes 15, similar with the thin-film filter 2, and the thin-film filter 32 is able to be manufactured by the same manufacturing method as the thin-film filter 2. The stripes-formed inner wall surfaces 38, similar with the thin-film filter 2, are formed inside the respective through holes 15 by reactive ion etching (not illustrated in FIG. 15, FIG. 16). Further, the through holes 15 are formed along by the slanting direction d15. Therefore, the thin-film filter 32 and the thin-film filter substrate (not illustrated), which the thin-film filter 32 is formed instead of the thin-film filter 2, have the same operation and effect as the above-described thin-film filter 2, the thin-film filter substrate 10.

Modified Example 2

Figure 17:
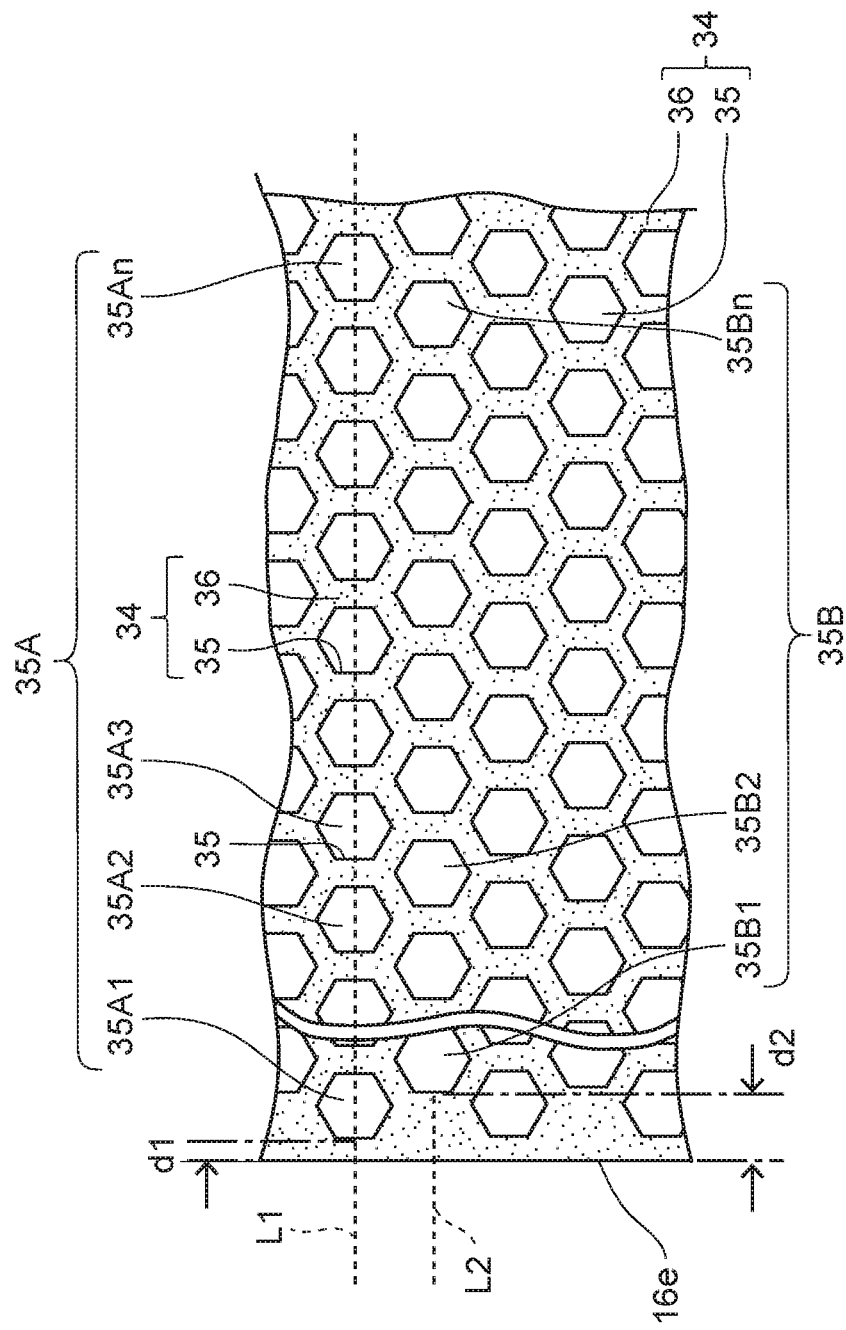
FIG. 17 is a plan view, with enlargement, of a principal part of the thin-film filter according to the modified example 2.
Figure 18:
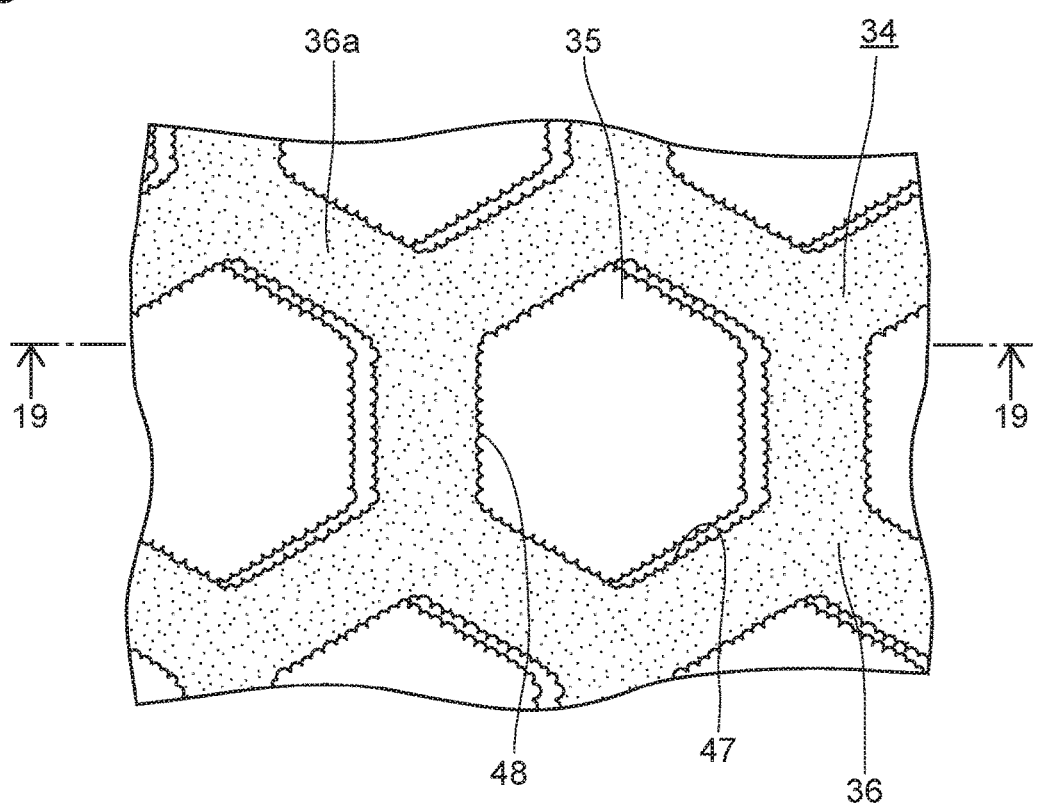
FIG. 18 is a plan view, with more enlargement, of a principal part of the thin-film filter according to the modified example 2.
Figure 19:
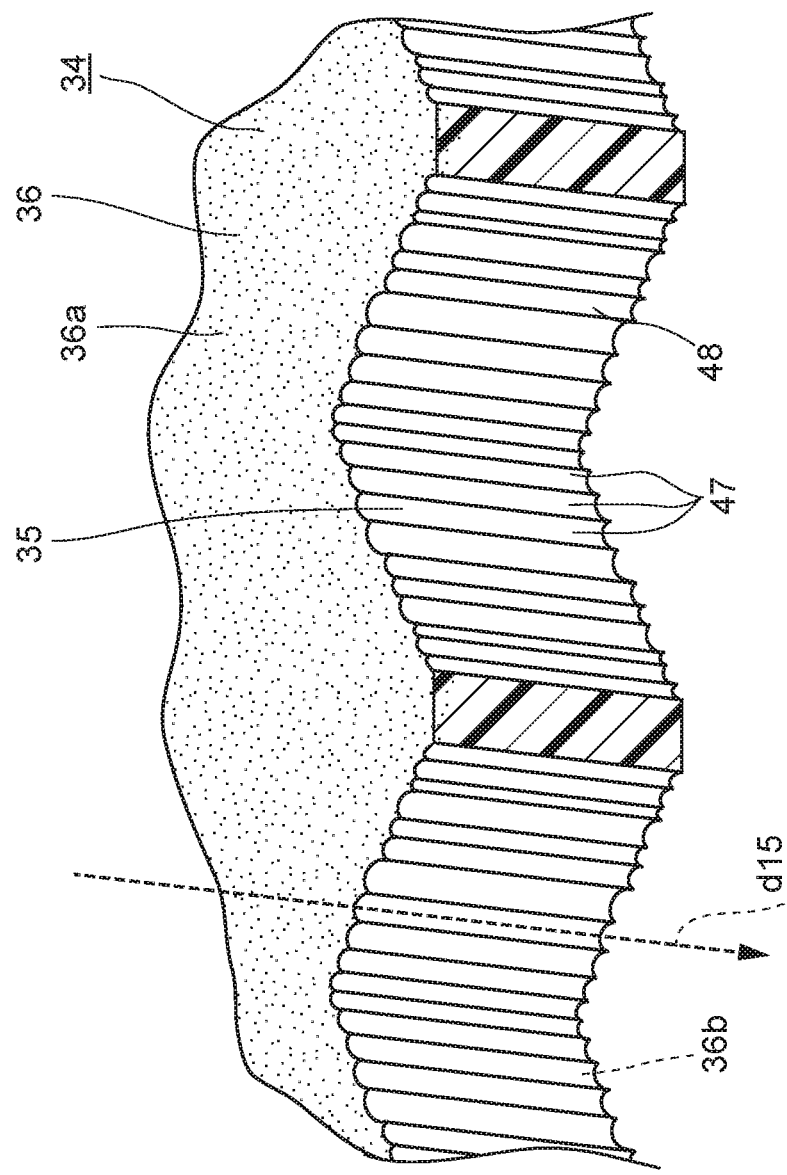
FIG. 19 is a perspective view showing a sectional surface corresponding to the line 19-19 in FIG. 18.

Next, the thin-film filter 34, according to a modified example 2, is explained with reference to FIG. 17, FIG. 18, FIG. 19. FIG. 17 is a plan view, with enlargement, of the principal part of the thin-film filter 34 according to the modified example 2. FIG. 18 is a plan view, with more enlargement, of the principal part of the thin-film filter 34. FIG. 19 is a perspective view showing a sectional surface corresponding to the line 19-19 in FIG. 18.

The thin-film filter 34 is different in that it has a thin-film part 36 instead of the thin-film part 16, and the through holes 35 are formed instead of the through holes 15, as compared with the thin-film filter 2. The thin-film part 36 is different in that the through holes 35 are formed, as compared with the thin-film part 16.

The above-described through holes 15 are formed in circular shape in a plan view though, the through holes 35 are formed in a regular hexagon in a plan view. The thin-film filter 34 has a first through hole-group 35A and a second through hole-group 35B. A plurality of through holes 35, including a first through hole 35A1, through holes 35A2, 35A3 . . . through hole 35An, are included in the first through hole-group 35A. The first line L1, similar with the first through hole-group 15A, is formed by the first through hole 35A1, through holes 35A2, 35A3 . . . 35An.

A plurality of through holes 35, including a second through hole 35B1, through holes 35B2, 35B3 . . . through hole 35Bn are included in the second through hole-group 35B. The second line L2, similar with the second through hole-group 15B, is formed by the second through hole 35B1, through holes 35B2, . . . 35Bn. In case of the thin-film filter 34, the triangle, which the centers of the adjacent three through holes 35 (for example, through holes 35A2, 35A3, 35B3) are vertexes, is a regular triangle, according to the regularity of the arrangement of the through holes 35.

Then, in case of the thin-film filter 34, as illustrated in FIG. 18, FIG. 19, the stripes-formed inner wall surfaces 48 are formed inside the respective through holes 35. The stripes-formed inner wall surfaces 48 have a plurality of stripe-like parts 47. A plurality of stripe-like parts 47 are arranged in almost the whole of the inner wall surface of the respective through holes 35, similar with a plurality of stripe-like parts 37. The stripes-formed inner wall surfaces 48 are formed in almost the whole of the inner wall surface of the respective through holes 35. The stripe-like parts 47 are formed along by the slanting direction d15, similar with the stripe-like parts 37. Further, the respective stripe-like parts 47 are convex parts or concave parts, formed on the respective through holes 35, approximately in the straight line along by the slanting direction d15.

The thin-film filter 34 has a plurality of through holes 35. The stripe-like parts 47 and the stripes-formed inner wall surfaces 48, respectively similar with the stripe-like parts 37 and the stripes-formed inner wall surface 38 of the through hole 15, are formed by reactive ion etching, in the respective through holes 35. Further the through holes 35 are formed along by the slanting direction d15. Therefore, the thin-film filter 34 and the thin-film filter substrate (not illustrated), which the thin-film filter 34 is formed instead of the thin-film filter 2, have the same operation and effect similar with the above-described thin-film filter 2 and the thin-film filter substrate 10.

Modified Example 3

Figure 20:
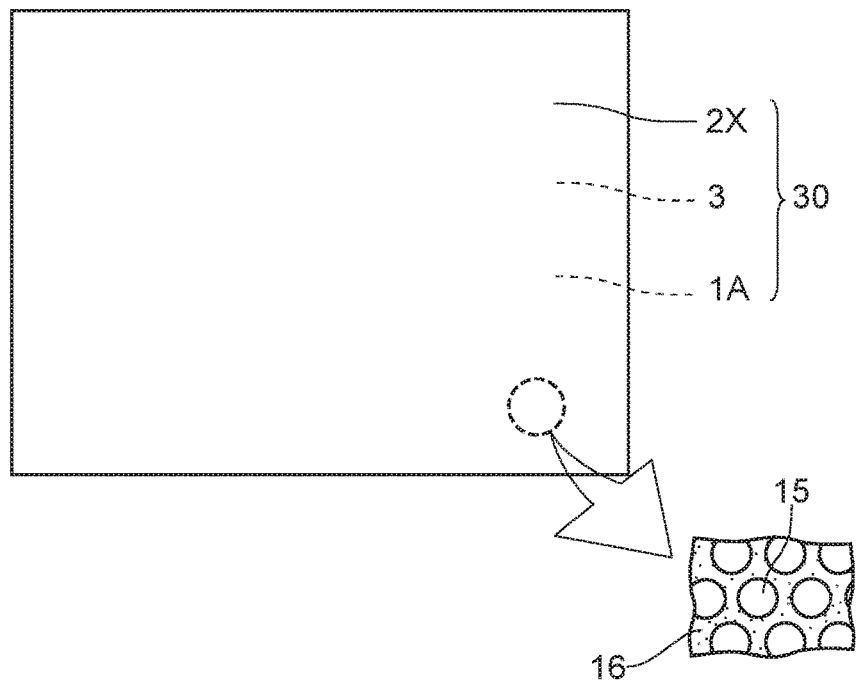
FIG. 20(a) is a plan view of a principal part of the thin-film filter substrate according to the modified example 3.
FIG. 20(b) is a perspective view showing the thin-film filter, included in the thin-film filter substrate and a reel member.
Figure 20:
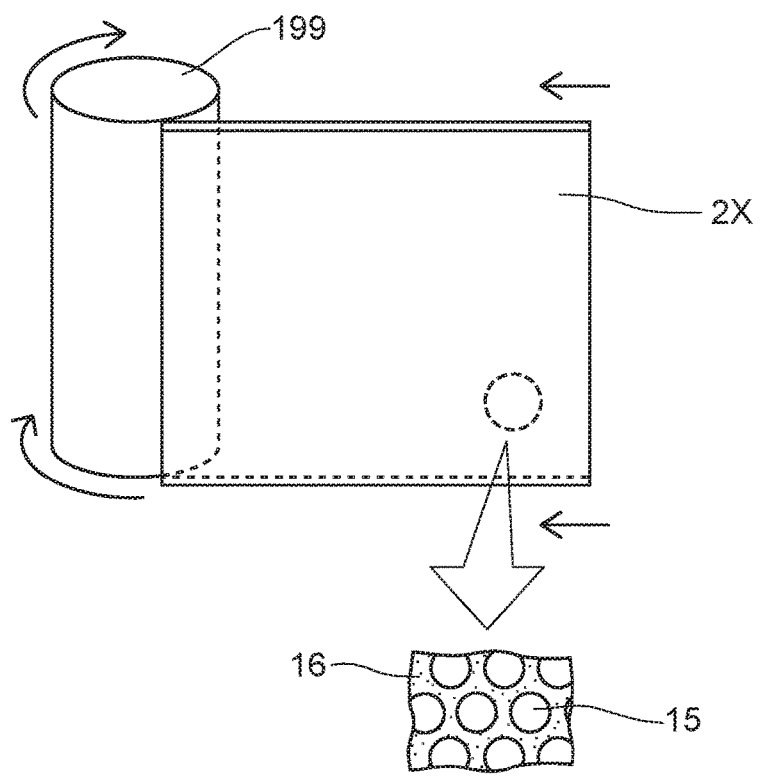

Next, the thin-film filter substrate 30, according to a modified example 3, is explained with reference to FIG. 20. FIG. 20(a) is a plan view of a principal part of the thin-film filter substrate 30 according to the modified example 3. FIG. 20(b) is a perspective view showing the thin-film filter 2X, included in the thin-film filter substrate 30 and a reel member 199.

The thin-film filter substrate 30 has a filter panel 1A, as a base substrate, a thin-film filter 2X and the peeling-off adhesive layer 3.

The filter panel 1A is made of glass, and it is formed in a rectangular shape. The peeling-off adhesive layer 3 is formed on the base surface, being one side surface, of the filter panel 1A, and the thin-film filter 2A is formed on the peeling-off adhesive layer 3.

The thin-film filter 2X is different in its shape from the thin-film filter 2. The thin-film filter 2 is formed in an approximate circular shape in accordance with the silicon wafer 1 though, the thin-film filter 2X is formed in a rectangular shape in accordance with the filter panel 1A. The thin-film filter 2X has the thin-film part 16 similar with the thin-film filter 2, a plurality of through holes 15 are formed uniformly on the thin-film part 16 by a regular arrangement. The stripes-formed inner wall surfaces 38, similar with the thin-film filter 2, are formed inside the respective through holes 15 (not illustrated in FIG. 20(a), FIG. 20(b)). The stripes-formed inner wall surface 38 of the thin-film filter 2X has a plurality of stripe-like parts 37, similar with the thin-film filter 2. Both the respective through holes 15 and the stripes-formed inner wall surface 38 are formed along by the slanting direction d15.

Because the through holes 15, the stripes-formed inner wall surfaces 38 and the stripe-like parts 37 are formed in the thin-film filter 2X, similar with the thin-film filter 2, the thin-film filter 2X have the same operation and effect as the thin-film filter 2. Further, when the filter panel 1A is used instead of the silicon wafer 1, the thin-film filter substrate 30 is manufactured by the manufacturing method similar with the manufacturing method of thin-film filter substrate 10. Further, because the manufactured thin-film filter substrate 30 has the peeling-off adhesive layer 3, the thin-film filter 2X is peeled off, similar with the thin-film filter 2, and the thin-film filter 2X is transcribed to the desired product, thereby the filtering function is exhibited.

On the other hand, the thin-film filter 2X and the reel member 199, having a cylindrical shape, are shown in the FIG. 20(b). Then, rotating the reel member 199 is performed in accordance with the peeling off the thin-film filter 2X from the thin-film filter substrate 30, thereby the thin-film filter 2X is able to be reeled in the reel member 199. The peeling-off adhesive layer 3 is previously formed on the reel member 199.

Handling of the thin-film filter 2X, that is peeled off from the thin-film filter substrate 30, is difficult though, when the thin-film filter 2X is reeled in the reel member 199, handling of the thin-film filter 2X is easy. Further, in case of the thin-film filter substrate 30, because the filter panel 1A is a member formed in a plan shape, storage of the filter panel 1A, in a standing condition, is difficult. In this point, because the reel member 199 is formed in a cylindrical shape, the reel member 199 is suitable for storage of the thin-film filter 2X in a standing condition.

Modified Example 4

Figure 21:
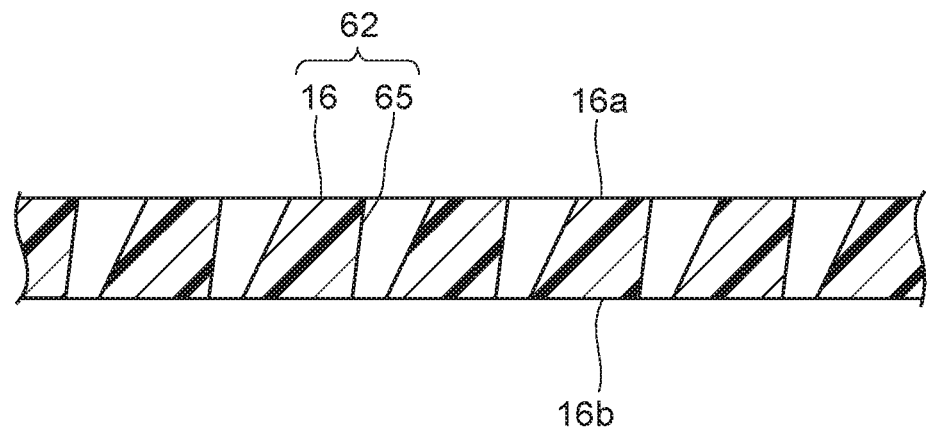
FIG. 21 is a sectional view of the thin-film filter according to the modified example 4, corresponding to FIG. 5.

Next, the thin-film filter 62, according to a modified example 4, is explained with reference to FIG. 21. FIG. 21 is a sectional view of the thin-film filter 62 according to the modified example 4, corresponding to FIG. 5.

The thin-film filter 62 is different in that it has through holes 65 instead of the through holes 15, as compared with the thin-film filter 2. In case of the through holes 15, they respectively have fixed size diameters from the film surface 16a to the rear film surface 16b. To the contrary, in case of the through holes 65, the diameters are gradually reduced from the film surface 16a to the rear film surface 16b. Further, the stripes-formed inner wall surfaces 38 are formed in the respective through holes 65 (not illustrated in FIG. 21), similar with the through holes 15, and the through holes 65 are formed along by the slanting direction d15. Therefore, the thin-film filter 62 has the same operation and effect, similar with the thin-film filter 2.

Modified Example 5

Figure 22:
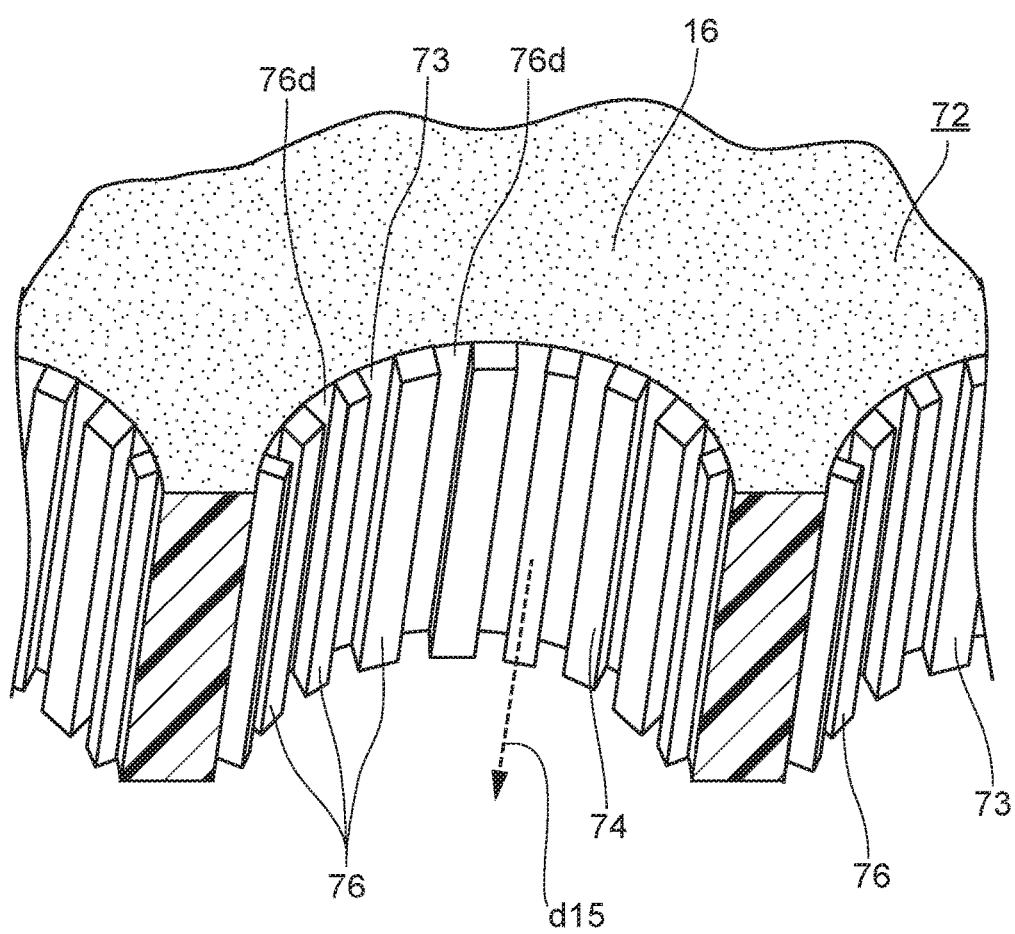
FIG. 22 is a perspective view of the thin-film filter according to the modified example 5, corresponding to FIG. 7.

Next, the thin-film filter 72, according to a modified example 5, is explained with reference to FIG. 22. Here, FIG. 22 is a perspective view of the thin-film filter 72 according to the modified example 5, corresponding to FIG. 7.

The thin-film filter 72 is different in that it has through holes 73 instead of the through holes 15, as compared with the thin-film filter 2. Further, in case of the thin-film filter 72, the stripes-formed inner wall surfaces 74 are formed in the respective through holes 73. The through holes 73 are formed along by the slanting direction d15.

In case of the above-described stripes-formed inner wall surfaces 38, the stripe-like parts 37 are formed closely so that a smooth part does not remain in the inner wall surface of the respective through holes 15. To the contrary, in case of the stripes-formed inner wall surfaces 74, stripe-like convex parts 76 are formed discretely at interval 76d so that a smooth part remains in the inner wall surface of the respective through holes 73. Therefore, parts between the respective stripe-like convex parts 76 remain as the smooth part. The stripe-like convex parts 76 are convex parts, formed in the inner surface of the through holes 73, and they are formed in about straight line along by the slanting direction d15. Because the catching function for foreign matters is exhibited by the respective stripe-like convex parts 76 of the stripes-formed inner wall surfaces 74, the thin-film filter 72 and the thin-film filter substrate (not illustrated), which the thin-film filter 72 is formed, have the same operation and effect similar with the thin-film filter 2 and the thin-film filter substrate 10.

(Second Embodiment of the Thin-Film Filter and the Thin-Film Filter Substrate)

Figure 23:
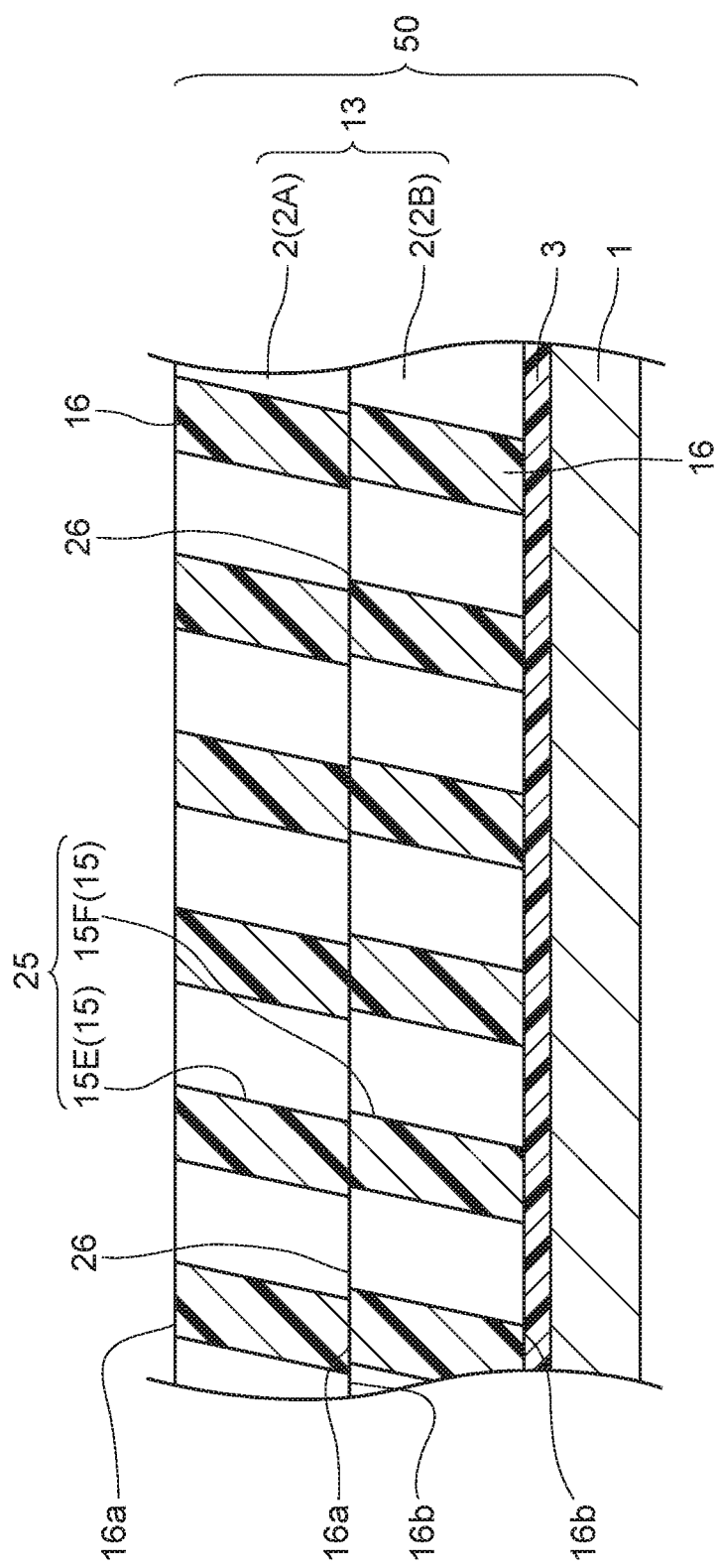
FIG. 23 is a sectional view showing the thin-film filter substrate according to the second embodiment of the present invention.
Figure 24:
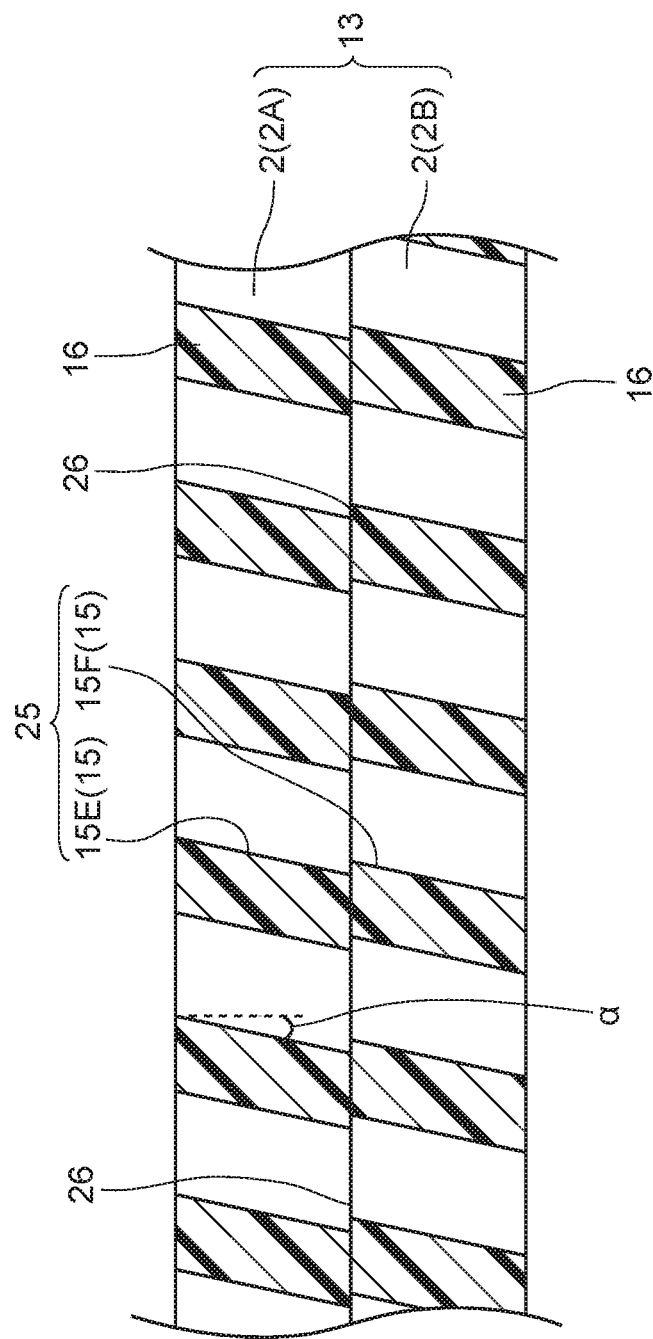
FIG. 24 is a sectional view, corresponding to FIG. 5(a), of the thin-film filter according to the second embodiment of the present invention.
Figure 25:
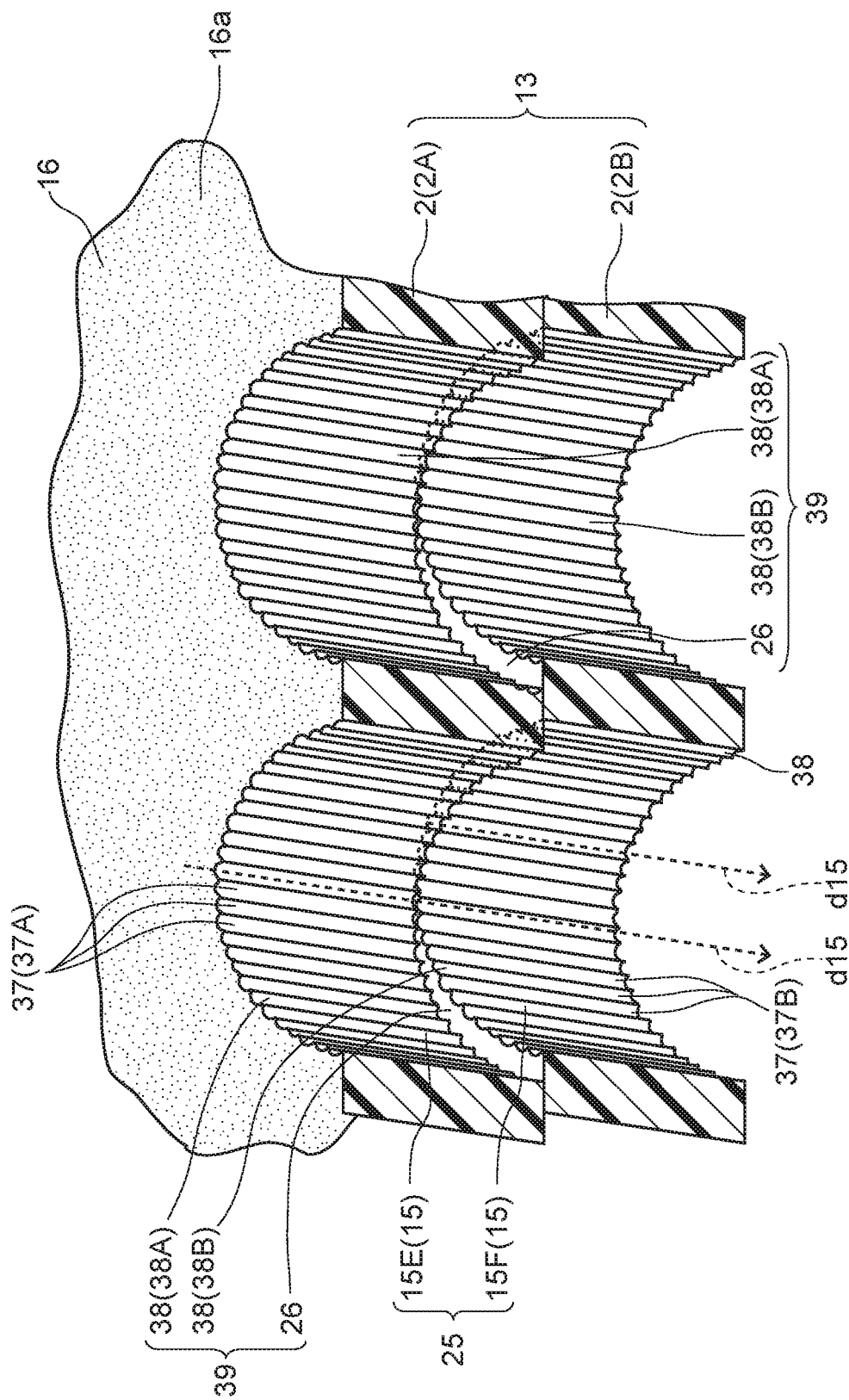
FIG. 25 is a perspective view, corresponding to FIG. 7, showing a sectional surface of the thin-film filter.

To begin with, the structure of a thin-film filter 13, a thin-film filter substrate 50, according to the second embodiment of the present invention will be explained with mainly reference to FIG. 23 to FIG. 25. Here, FIG. 23 is a sectional view of the thin-film filter substrate 50. FIG. 24 is a sectional view, corresponding to FIG. 5(a), of the thin-film filter 13. FIG. 25 is a perspective view, corresponding to FIG. 7, showing a sectional surface of the thin-film filter 13.

The thin-film filter substrate 50 is different in that it has the thin-film filter 13 instead of the thin-film filter 2, as compared with the thin-film filter substrate 10.

The thin-film filter 13 has a laminated structure which two thin-film filters 2A, 2B are piled up. In the thin-film filter 13, the thin-film filter 2A, as a first filter, and the thin-film filter 2B, as a second filter are laminated.

Both of the thin-film filters 2A, 2B have the structures common with the thin-film filter 2 according to the first embodiment. Therefore, both of the thin-film filters 2A, 2B have the thin-film parts 16, a plurality of through holes 15 (respectively first through holes 15E, second through holes 15F) are formed in the respective thin-film parts 16. Further, the above-described stripes-formed inner wall surfaces 38 are formed in the respective through holes 15 (the first through holes 15E, the second through holes 15F).

In the thin-film filter 13, the thin-film filter 2A and the thin-film filter 2B are piled up so that a plurality of serial through holes 25 are formed. The serial through holes 25 have structures which the through holes 15 (the first through holes 15E, the second through holes 15F) of the thin-film filter 2A and the thin-film filter 2B are connected from the film surface 16a (first film surface) of the thin-film filter 2A to the rear film surface 16b (second rear film surface) of the thin-film filter 2B. Further, in case of the thin-film filter 13, the laminated structure is a structure which the thin-film filter 2A and the thin-film filter 2B are piled up so that a slanting direction (first slanting direction) of the first through holes 15E is corresponding to a slanting direction (second slanting direction) of the second through holes 15F (namely, the slanting direction d15 of the first through holes 15E and the slanting direction d15 of the second through holes 15F are arranged in parallel).

Then, in the thin-film filter 13, the thin-film filter 2A and the thin-film filter 2B are laminated so that the through holes 15 (first through holes 15E) of the thin-film filter 2A and the through holes 15 (second through holes 15F) of the thin-film filter 2B are slightly shifted (namely, the parts of the first through holes 15E and the second through holes 15F, being not overlapped, are formed). As the thin-film filter 13, overlaps of the first, second through holes 15E, 15F, with slightly shifting, are also referred to a through hole-shift.

Projecting parts 26 are formed inside the serial through holes 25 due to the through hole-shift. As illustrated in FIG. 25, the projecting parts 26 are protruding along by the direction intersecting with the slanting direction d15 toward inside the serial through holes 25. Because the projecting parts 26 are formed inside the serial through holes 25, the thin-film filter 13 includes protrusions-formed inner wall surfaces 39. The protrusions-formed inner wall surfaces 39 include stripes-formed inner wall surfaces 38A (first stripes-formed inner wall surfaces) of the thin-film filter 2A, stripes-formed inner wall surfaces 38B (second stripes-formed inner wall surfaces) of the thin-film filter 2B and the projecting parts 26. The stripes-formed inner wall surfaces 38A are formed inside the first through holes 15E arranged inside the respective serial through holes 25. The stripes-formed inner wall surfaces 38B are formed inside the second through holes 15F arranged inside the respective serial through holes 25. Both the stripes-formed inner wall surfaces 38A and the stripes-formed inner wall surfaces 38B respectively include the stripe-like parts 37 (respectively the first stripe-like parts 37A, the second stripe-like parts 37B). The first, second stripe-like parts 37A, 37B are formed respectively along by the slanting direction d15.

Then, when the thin-film filter 13, the thin-film filter substrate 50 are manufactured, at first, two thin-film filter substrates 10 (10A, 10B) are prepared. The thin-film filter substrates 10 (10A, 10B) are manufactured in accordance with the same procedure with the first embodiment. The above-described thin-film filters 2A, 2B are respectively formed with the two thin-film filter substrates 10A, 10B. The metal patterns 5A are removed from both the thin-film filter substrates 10A, 10B.

Figure 26:
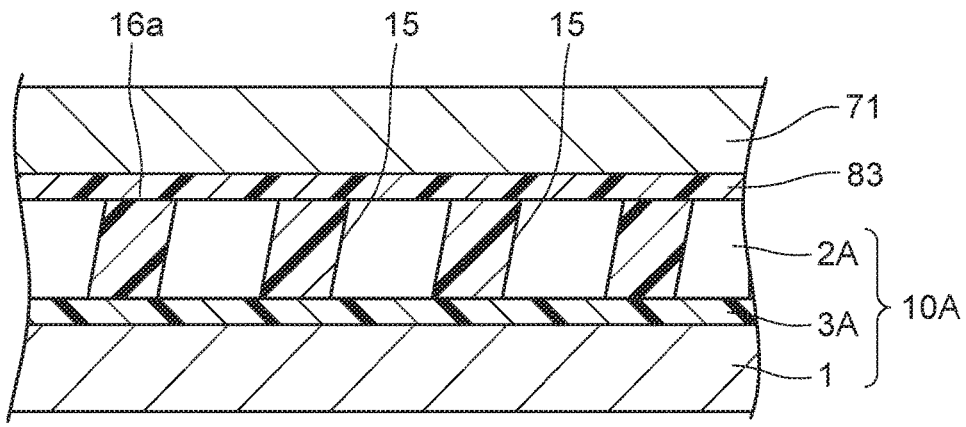
FIG. 26(a) is a sectional view showing a principal part of a manufacturing step of the thin-film filter and the thin-film filter substrate according to the second embodiment of the present invention.
FIG. 26(b) is a sectional view of a principal part showing the manufacturing step subsequent that in FIG. 26(a)
Figure 26:
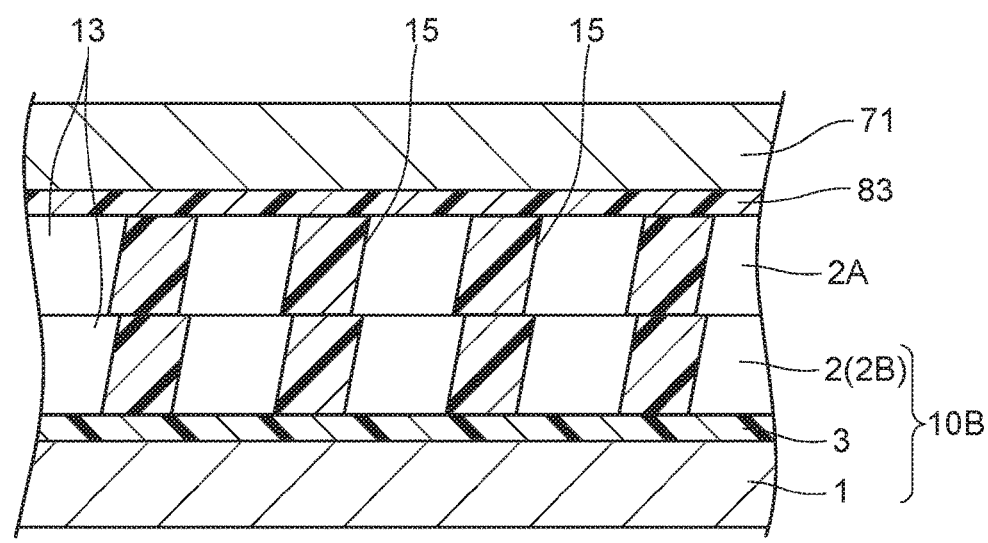

Subsequently, a filter laminating step is performed. As illustrated in FIG. 26(a), a supporting board 71 is mounted on one of the two thin-film filter substrates 10A, 10B (the thin-film filter substrate 10A, in this embodiment). In this case, the supporting board 71 is mounted on the thin-film filter substrate 10A with an adhesive layer 83. If the supporting board 71 is an opaque board, the thermal-foaming tape is used as the adhesive layer 83. If the supporting board 71 is a transparent board, the thermal-foaming tape or an UV tape is used as the adhesive layer 83. The supporting board 71 is mounted on the thin-film filter 2A of the thin-film filter substrate 10A. Next, the silicon wafer 1 is peeled off from the thin-film filter substrate 10A together with the peeling-off adhesive layer 3A, after that, the thin-film filter 2A is laminated on the thin-film filter substrate 10B together with the supporting board 71. At this time, as illustrated in FIG. 26(b), the thin-film filter 2A is laminated on the thin-film filter 2B. In the filter laminating step, the process is proceeded on a half-hardened condition of the thin-film filter 2A and the thin-film filter 2B, further a hardening process is performed after the thin-film filter 2A is laminated on the thin-film filter 2B. Thereby the thin-film filter 2A is joined to the thin-film filter 2B. After that, the supporting board 71 is peeled off, thereby thin-film filter substrate 50 is manufactured. Further, the silicon wafer 1 is peeled off, thereby the thin-film filter 13 is manufactured.

Figure 44:
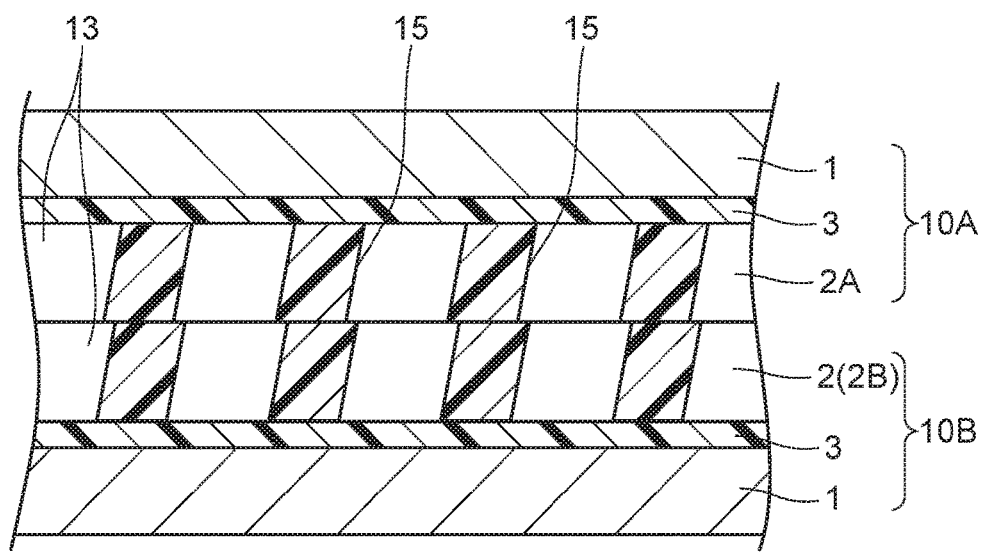
FIG. 44 is a sectional view of a principal part, showing a modified example, of a manufacturing step of the thin-film filter and the thin-film filter substrate according to the second embodiment of the present invention.

The filter laminating step is also performed in the following. After the thin-film filter substrates 10A, 10B are prepared, as illustrated in FIG. 44, one of the thin-film filter substrates 10A, 10B (the thin-film filter substrate 10A, in this embodiment) is turned over, and the thin-film filter substrate 10A is laminated on the thin-film filter substrates 10B. At this time, the thin-film filter 2A is laminated on the thin-film filter 2B. The process is also proceeded on a half-hardened condition of the thin-film filter 2A and the thin-film filter 2B, a hardening process is performed after the thin-film filter 2A is laminated on the thin-film filter 2B. After that, the silicon wafer 1 of the thin-film filter 2A is peeled off, thereby thin-film filter substrate 50 is manufactured. Further, the silicon wafer 1 of the thin-film filter 2B is peeled off, thereby the thin-film filter 13 is manufactured.

The thin-film filter 13 includes a plurality of serial through holes 25, the protrusions-formed inner wall surfaces 39 are formed inside the respective serial through holes 25. Because the protrusions-formed inner wall surfaces 39 include a plurality of stripe-like parts 37, the thin-film filter 13 has the sophisticated filtering function than the conventional filter because of the higher capability for catching foreign matters. Further, because the serial through holes 25 are longer than the through holes 15, the thin-film filter 13 has the sophisticated filtering function than the thin-film filter 2. Furthermore, because the projecting parts 26 are formed inside the serial through holes 25, when air passes through the serial through holes 25, foreign matters strike the projecting parts 26, thereby foreign matters are prevented from entering. Therefore, in case of the thin-film filter 13, capability for catching foreign matters by the projecting parts 26 is exhibited, the thin-film filter 13 has the more sophisticated filtering function.

(Modified Example)

Figure 27:
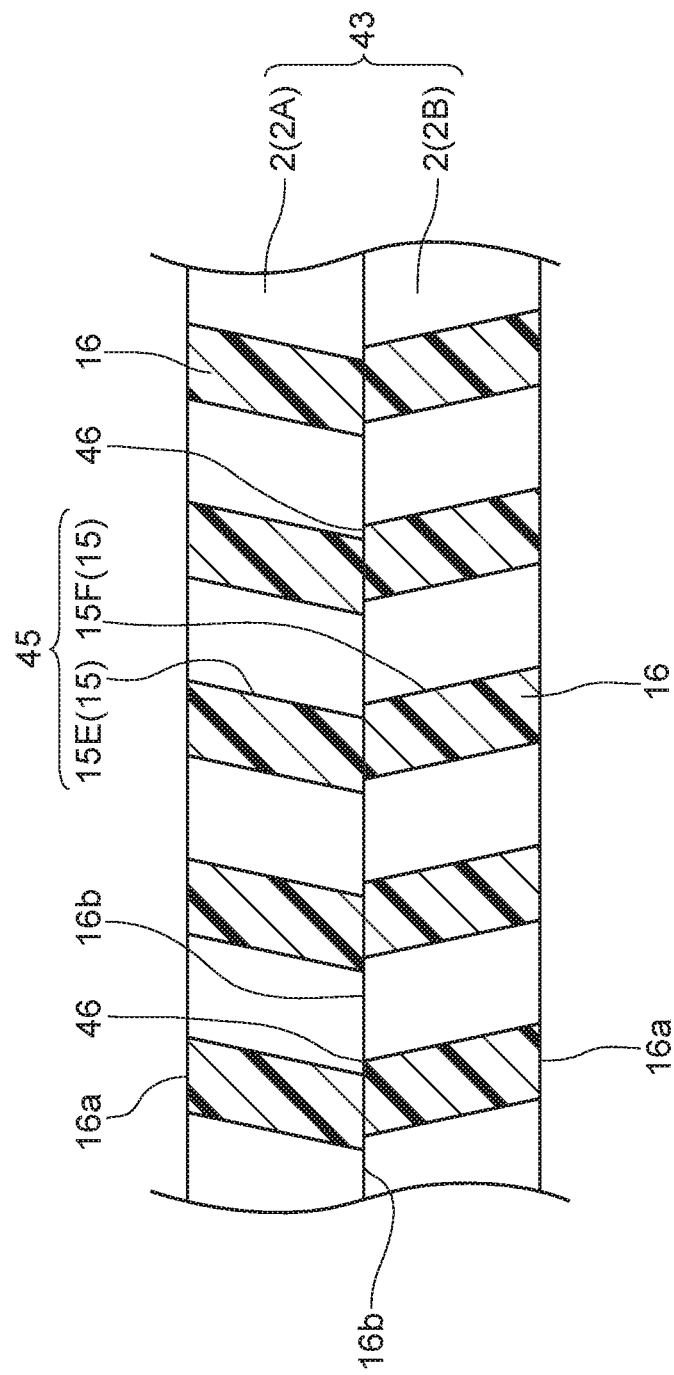
FIG. 27 is a sectional view, corresponding to FIG. 5(a), of the thin-film filter according to the modified example.
Figure 28:
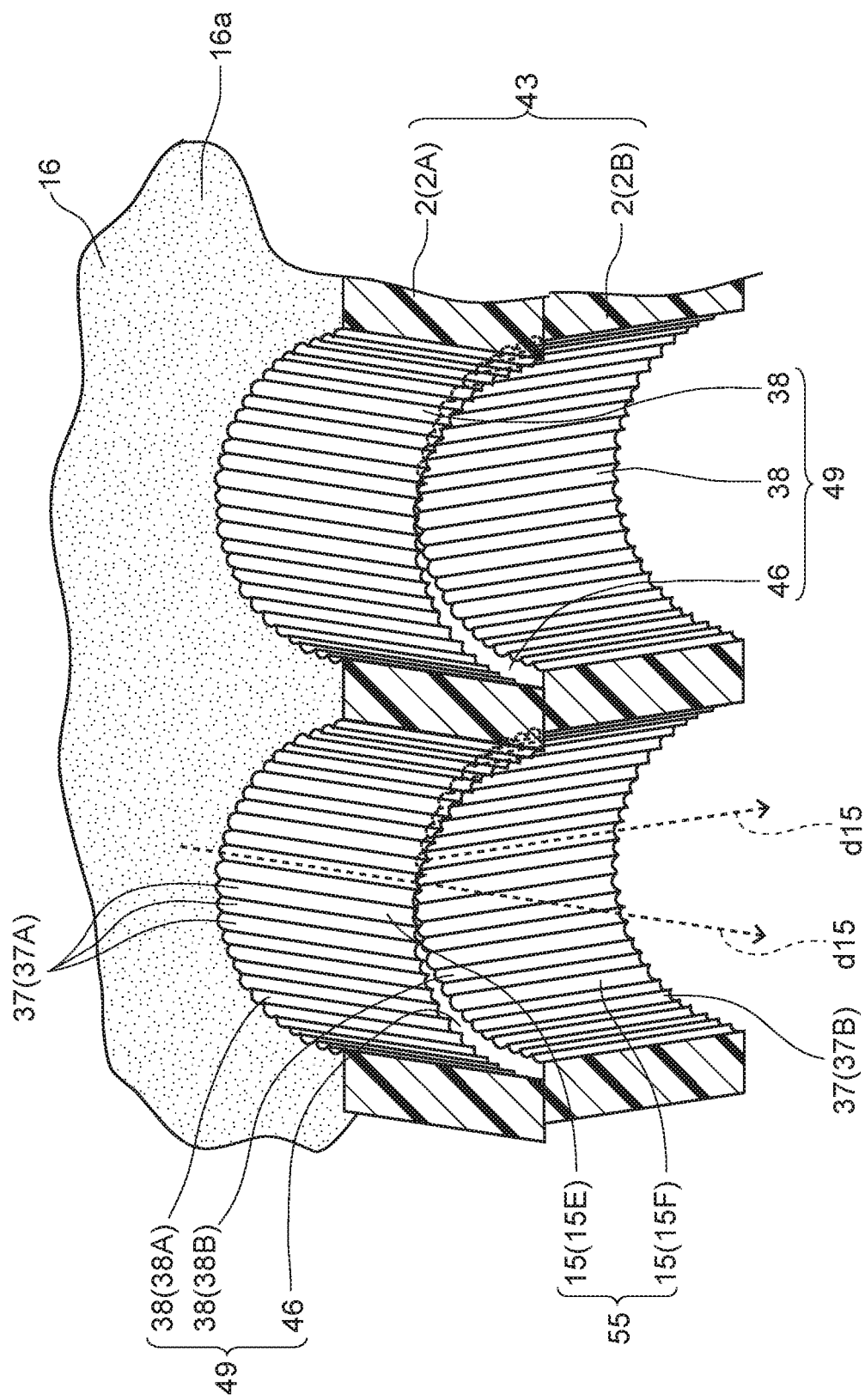
FIG. 28 is a perspective view, corresponding to FIG. 7, showing a sectional surface of the thin-film filter.

Next, the thin-film filter 43, according to a modified example of the second embodiment, is explained with reference to FIG. 27, FIG. 28. Here, FIG. 27 is a sectional view, corresponding to FIG. 5(a), of the thin-film filter 43. FIG. 28 is a perspective view, corresponding to FIG. 7, showing a sectional surface of the thin-film filter 43.

The thin-film filter 43 is different in the laminated direction of the thin-film filter 2B, as compared with the thin-film filter 13.

In case of the above-described thin-film filter 13, the thin-film filter 2A and the thin-film filter 2B are laminated so that slanting directions (first, second slanting directions) of the through holes 15 (first, second through holes 15E, 15F) are coincide each other. On the other hand, in case of the thin-film filter 43, as illustrated in FIG. 28, the thin-film filter 2A and the thin-film filter 2B are laminated so that the slanting directions (first, second slanting directions) of the through holes 15 (first, second through holes 15E, 15F) are different from each other. As illustrated in FIG. 28, in case of the thin-film filter 43, the slanting direction d15 of the first through hole 15E is intersecting with the slanting direction d15 of the second through hole 15F.

Further, the thin-film filter 43 includes serial through holes 45. The serial through holes 45 have structures which the through holes 15, (the first, second through holes 15E, 15F) of the thin-film filters 2A, 2B, are connected. Then, as illustrated in FIG. 27, the through holes 15 (the first, second through holes 15E, 15F) are connected from the film surface 16a (first film surface) of the thin-film filter 2A to the film surface 16a (second film surface) via the rear film surface 16b of the thin-film filter 2B.

Then, in case of the thin-film filter 43, the thin-film filter 2A and the thin-film filter 2B are laminated so as to form the through hole-shift. Further, projecting parts 46 are formed inside the serial through holes 45 due to the through hole-shift. As illustrated in FIG. 28, the projecting parts 46 are protruding along by the direction intersecting with the slanting direction d15 toward inside the serial through holes 45. Because the projecting parts 46 are formed inside the serial through holes 45, the thin-film filter 43 includes protrusions-formed inner wall surfaces 49. The protrusions-formed inner wall surfaces 49 include stripes-formed inner wall surfaces 38A of the thin-film filter 2A, stripes-formed inner wall surfaces 38B of the thin-film filter 2B and the projecting parts 46. The stripes-formed inner wall surfaces 38A, 38B are respectively formed inside the first, second through holes 15E, 15F. Both the stripes-formed inner wall surfaces 38A and the stripes-formed inner wall surfaces 38B include the stripe-like parts 37 (respectively the first, second stripe-like parts 37A, 37B).

When the thin-film filter 43 is manufactured, two thin-film filter substrates 10 (10A, 10B) are prepared, similar with the case of the thin-film filter 13. Then, the thin-film filter 2A is laminated on the rear side of the thin-film filter 2B, thereby the thin-film filter 43 is manufactured.

The thin-film filter 43 includes a plurality of serial through holes 45, similar with the thin-film filter 13, the protrusions-formed inner wall surfaces 49 are formed inside the respective serial through holes 45. Therefore, the thin-film filter 43 has the sophisticated filtering function than the conventional filter, similar with the thin-film filter 13, because of the higher capability for catching foreign matters. Moreover, because the serial through holes 45 are bent at the middle part (the part which the projecting parts 46 are formed), foreign matters are likely to strike against the bent parts. On this point, the thin-film filter 43 has the higher capability for catching foreign matters than the thin-film filter 13.

(Embodiment of the MEMS Microphone)

Figure 29:
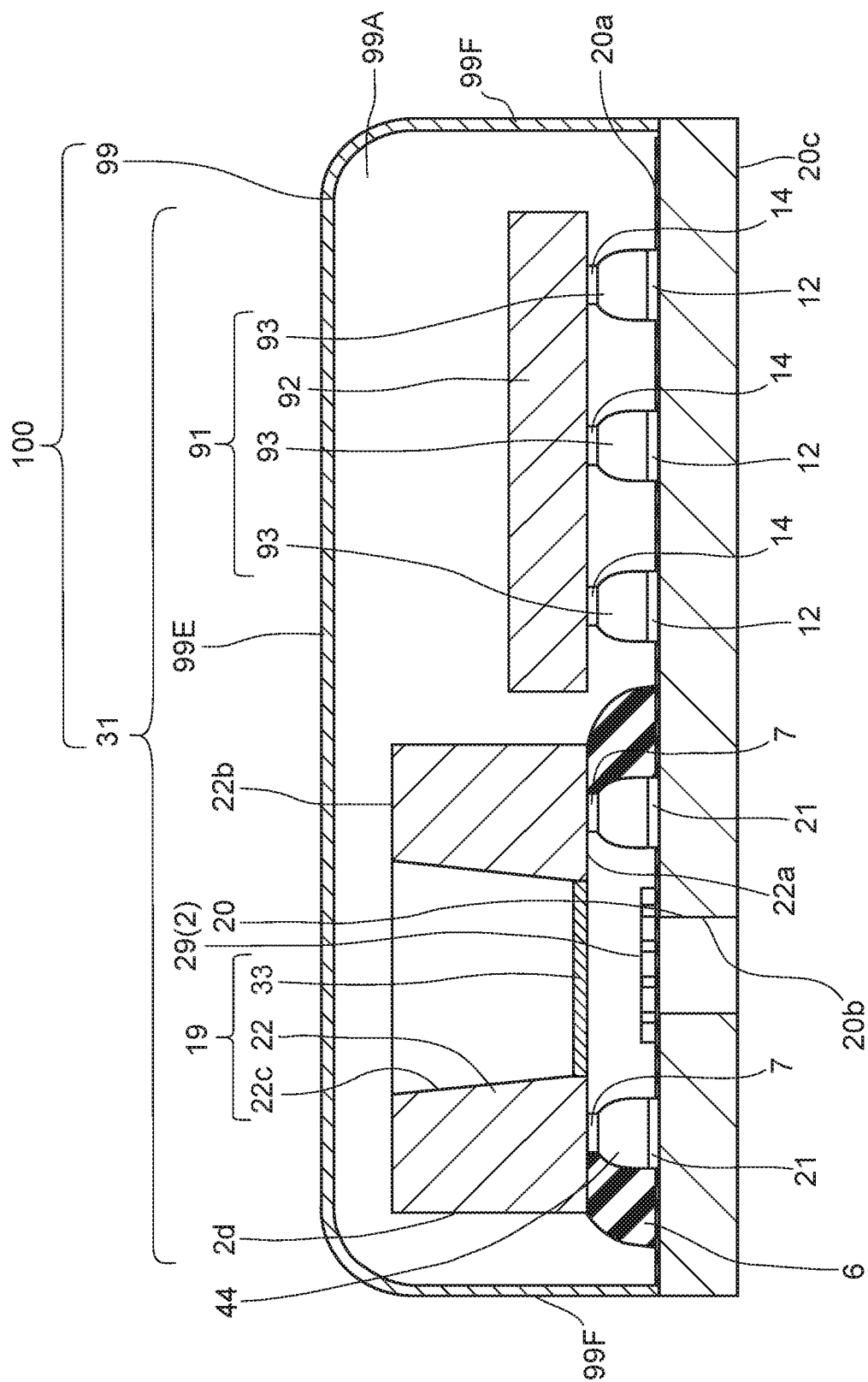
FIG. 29 is a sectional view showing a part, corresponding to the line 29-29 in FIG. 31, of a MEMS microphone according to the embodiment of the present invention.
Figure 30:
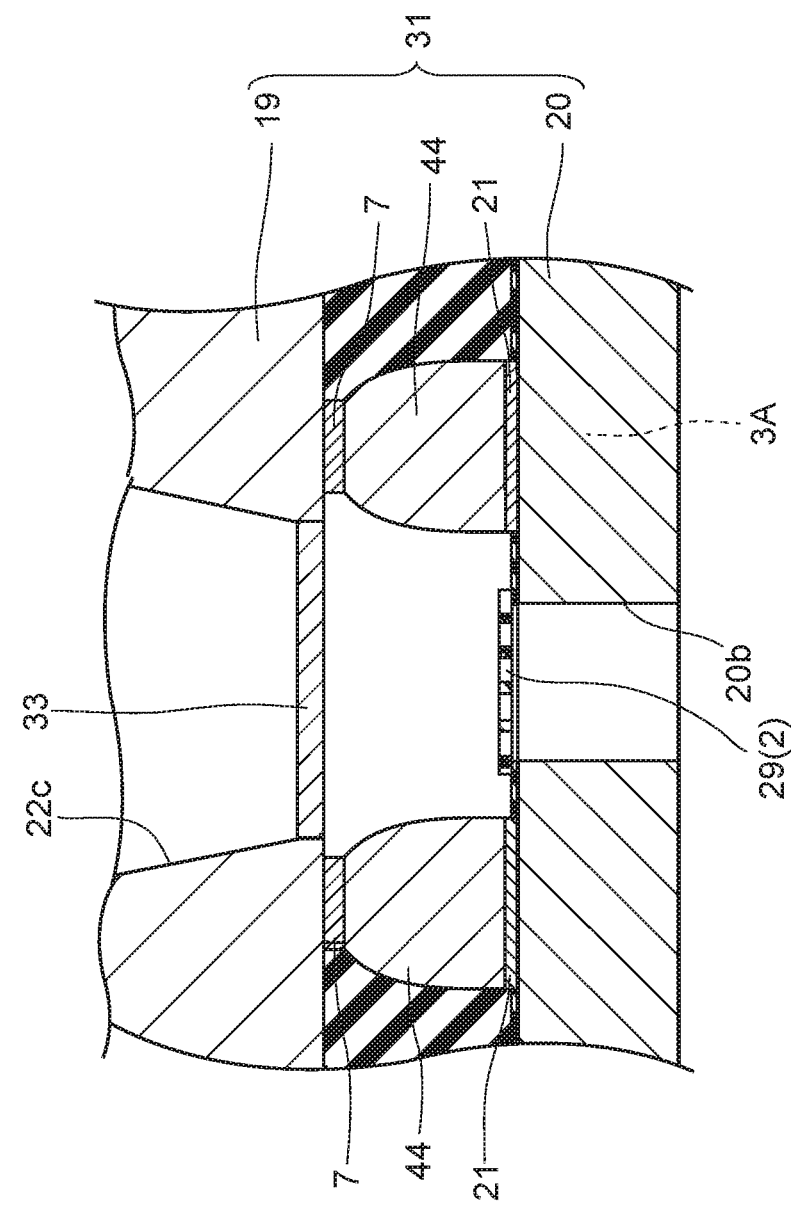
FIG. 30 is a sectional view, with enlargement, showing a principal part in FIG. 29.
Figure 31:
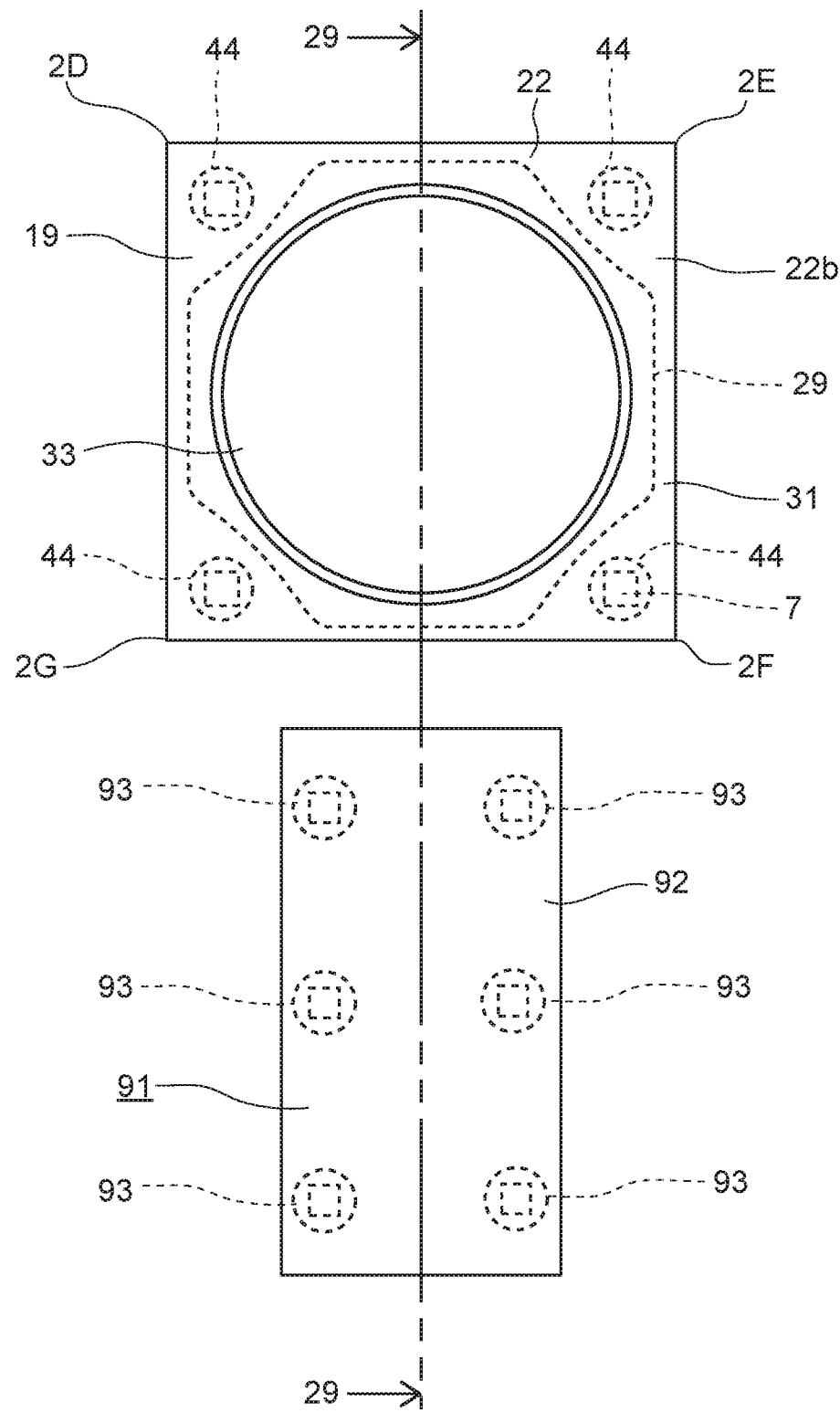
FIG. 31 is a plan view showing a principal part of the MEMS microphone, which a cap is removed, according to the embodiment of the present invention.

Subsequently, the embodiment of a MEMS microphone will be explained with reference to FIG. 29 to FIG. 31. FIG. 29 is a sectional view showing a part, corresponding to the line 29-29 in FIG. 31, of a MEMS microphone 100 according to the embodiment of the present invention. FIG. 30 is a sectional view, with enlargement, showing a principal part in FIG. 29. FIG. 31 is a plan view showing a principal part of the MEMS microphone 100, which a cap 99 is removed.

As illustrated in FIG. 29, the MEMS microphone 100 includes a MEMS package 31 and the cap 99.

The MEMS package 31 includes a MEMS chip 19, a package substrate 20 which the MEMS chip 19 is adhered, bonding bumps 44, a thin-film filter 29 and a sound shield 6. Further, the MEMS package 31 has an ASIC (Application Specific Integrated Circuit) package 91.

The MEMS chip 19 has an element substrate 22 which a membrane 33, as a movable element, is formed. The MEMS chip 19 is used as the microphone of capacitance-type. The element substrate 22 is a substrate formed in a rectangular-shape in a plan view, as illustrated in FIG. 31, and it is formed with silicon. A hole part 22c is formed in the center of the element substrate 22. The hole part 22c is formed in a cylindrical-shape from an upper surface 22b (outside surface of the element substrate 22) of the element substrate 22 to an opposing surface 22a (the surface opposing to the package substrate 20), and the membrane 33 is formed in the opposing surface 22a side of the hole part 22c. Note that two thin-films, which are called back-plates (not illustrated), are arranged in the upper side and the lower side of the membrane 33.

As illustrated in FIG. 29, the bonding bumps 44 are solder bumps adhered to both the opposing surface 22a and the package substrate 20. As illustrated in FIG. 31, the four bonding bumps 44 are respectively arranged in a neighborhood of corner parts 2D, 2E, 2F, 2G.

The membrane 33 is a vibration film formed approximately in a circular shape, and it is a thin-film made of an inorganic metal such as $SiO_2$, SiN or the like.

The bonding bumps 44 are solder bumps made of solder. As illustrated in FIG. 29, the all four bonding bumps 44 are adhered to both the MEMS chip 19 and the package substrate 20. Namely, the four bonding bumps 44 are adhered to electrode pads 7, formed in the opposing surface 22*a*, and electrode pads 21 formed in a package surface 20*a* (surface of the MEMS chip 19 side of the package substrate 20) of the package substrate 20. The four bonding bumps 44 connect the MEMS chip 19 electrically and fixedly to the package substrate 20.

In the MEMS microphone 100, the thin-film filter 29 is formed on the package substrate 20, so as to close a later-described sound-hole 20*b*. The thin-film filter 29 is formed with the above-described thin-film filter 2. The thin-film filter 29 is able to be formed with the above-described thin-film filters 32, 34, 62, 72, 13, 43, instead of the thin-film filter 2, not illustrated though. The thin-film filter 29 is formed in a modified rectangular shape which the four corner parts are removed, as illustrated in FIG. 31. A later-described photosensitive-adhesive layer 61 is formed in the peripheral of the sound-hole 20*b*. The thin-film filter 29 is adhered on the package surface 20*a* of the package substrate 20 by the photosensitive-adhesive layer 61.

The sound shield 6 is made of silicone resin and so on. The sound hole shield 6 is formed between the MEMS chip 19 and the package substrate 20 so as to surround the MEMS chip 19.

The package substrate 20 is a board like member made of such as silicon, ceramic or the like (or PCB: Printed Circuit Board). The electrode pads 21 and electrode pads 12 are formed on the package surface 20*a* of the package substrate 20. The MEMS chip 19 is mounted on the part, of the package surface 20*a*, which the electrode pads 21 are formed, the ASIC package 91 is mounted on the part which the electrode pads 12 are formed. Further, the sound hole 20*b* is formed on the part, of the package substrate 20, which the MEMS chip 19 is mounted. The sound hole 20*b* penetrates the package substrate 20 from the package surface 20*a* to a bottom surface 20*c* on the opposite side.

The ASIC package 91 has an ASIC 92 and bonding bumps 93. The ASIC 92, for example, is an integral circuit which amplifies an output signal of the MEMS chip 19 (an integral circuit which outputs displacement of a capacitance as displacement of the voltage in the MEMS chip 19). Electrode pads 14 are formed lower side of the ASIC 92. The electrode pads 14 are connected to the electrode pads 12 of the package surface 20*a* by bonding bumps 93. The ASIC 92 is mounted on the package substrate 20.

The cap 99 covers the MEMS package 31. The cap 99 is adhered to the package surface 20*a* with not illustrated adhesive (or by soldering). A space 99A is secured by the cap 99 and the package substrate 20, the MEMS package 31 is accommodated in the space 99A.

(Adhesive Structure of the Thin-Film Filter 29)

Figure 40:
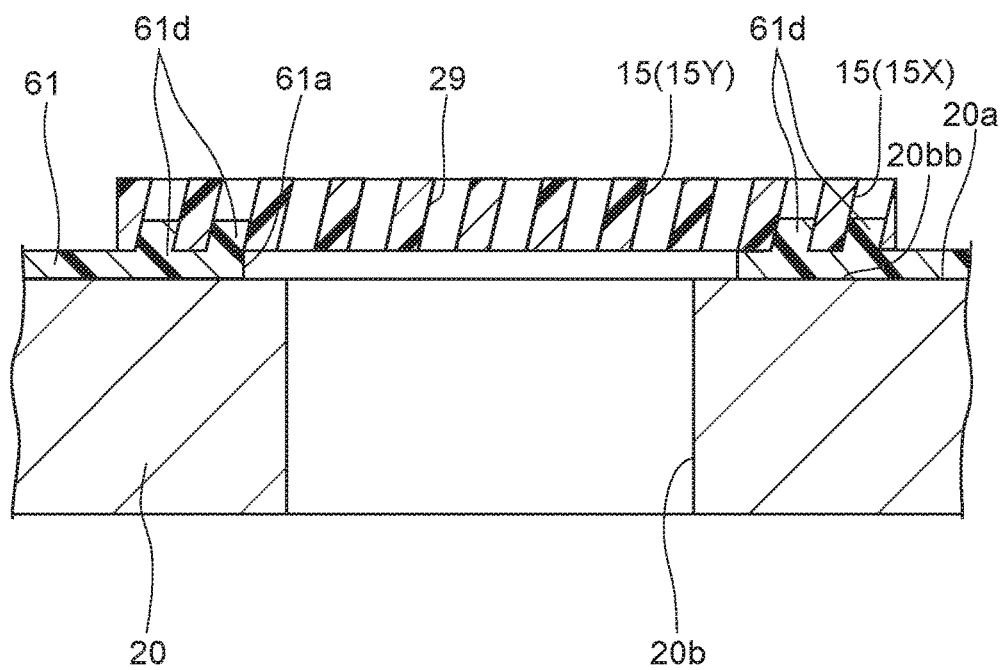
FIG. 40 is a sectional view, with enlargement, showing the principal part of the thin-film filter and an adhesive structure of the thin-film filter.
Figure 41:
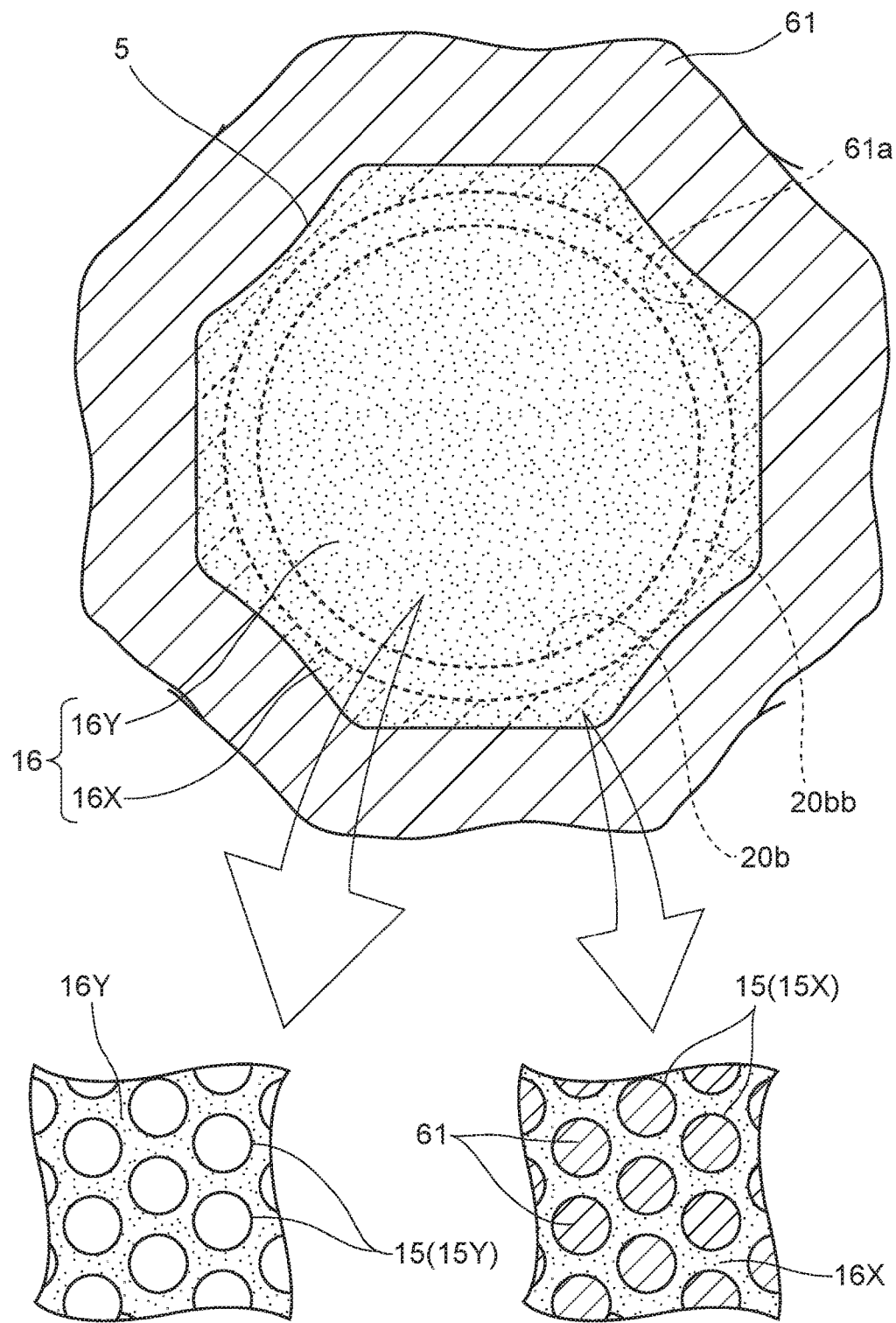
FIG. 41 is a plan view showing the principal part of the thin-film filter and the adhesive structure.
Figure 42:
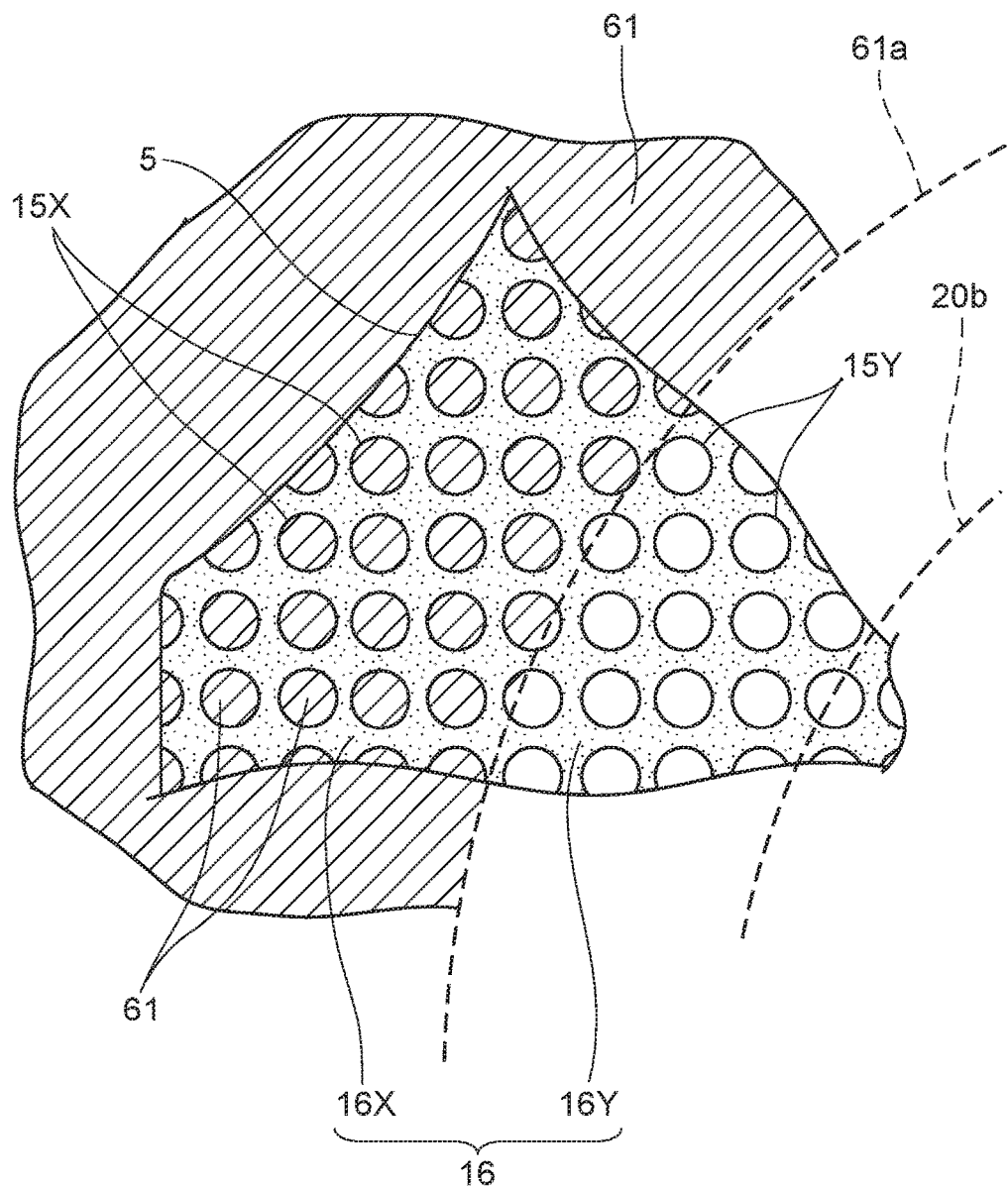
FIG. 42 is a plan view, partially omitted with enlargement, showing a principal part in FIG. 41.
Figure 43:
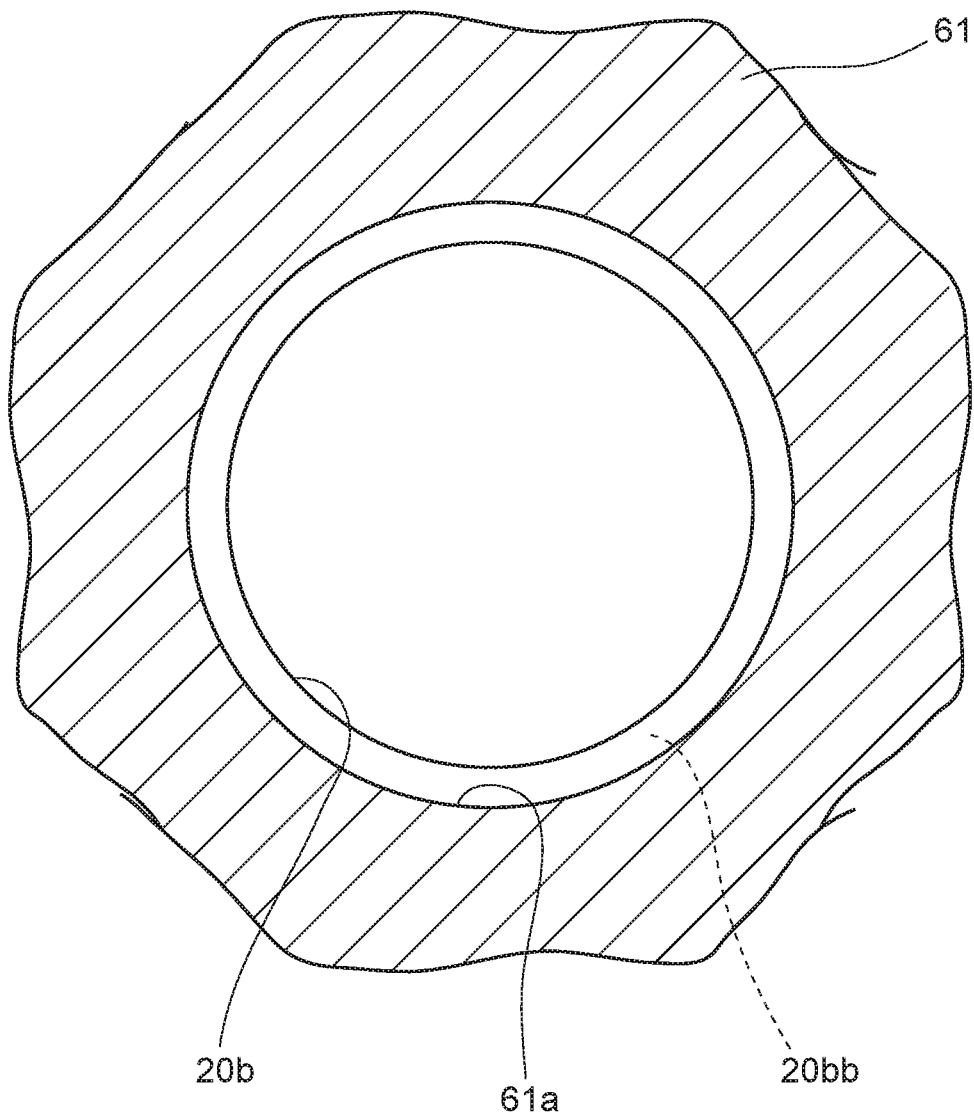
FIG. 43 is a plan view, with enlargement, showing the peripheral part, of a sound hole, which the thin-film filter is adhered.

Next, an adhesive structure of the thin-film filter 29 will be explained with reference to FIG. 40 to FIG. 43. FIG. 40 is a sectional view, with enlargement, showing a principal part of the thin-film filter 29 and the adhesive structure. FIG. 41 is a plan view showing a principal part of the thin-film filter 29 and the adhesive structure. FIG. 42 is a plan view, partially omitted with enlargement, showing a principal part in FIG. 41. FIG. 43 is a plan view, with enlargement, showing a peripheral part, of the sound hole 20*b*, which the thin-film filter 29 is adhered.

As illustrated in FIG. 40, the thin-film filter 29 is adhered to a peripheral part 20*bb* of the sound hole 20*b* (also referred to "sound hole peripheral part") in the package surface 20*a*, so as to cover the sound hole 20*b*. Further, as illustrated in FIG. 43, a later-described photosensitive-adhesive layer 61 is formed in the sound hole peripheral part 20*bb*. The thin-film filter 29 is adhered to the sound hole peripheral part 20*bb* with the photosensitive-adhesive layer 61. The photosensitive-adhesive layer 61 has a hole formed structure, which a hole part 61*a*, having a little larger size than the sound hole 20*b*, is formed.

Then, as illustrated in FIGS. 41, 42, in the thin-film part 16 of the thin-film filter 29, the part, which is adhered to the sound hole peripheral part 20*bb*, is an adhesive region 16X, the part except for the adhesive region 16X, in the thin-film part 16, is a filter region 16Y. Because the adhesive region 16X is adhered to the sound hole peripheral part 20*bb* with the photosensitive-adhesive layer 61, it does not have a capability as a filter (filter-capability). To the contrary, because the filter region 16Y is arranged so as to struggle the sound hole 20*b*, it has the filter-capability.

Further, in the thin-film filter 29, a plurality of through holes 15 are formed in not only the filter region 16Y but also the adhesive region 16X. The through holes 15, which are formed in the filter region 16Y, are filter through holes 15Y. The through holes 15, which are formed in the adhesive region 16X, are adhesive through holes 15X. In FIGS. 41, 42, the through holes 15, which do not have hatching, are the filter through holes 15Y, the through holes 15, which have hatching, are the adhesive through holes 15X.

The filter through holes 15Y and the adhesive through holes 15X are hole parts which penetrate the thin-film part 16 from the film surface 16*a* to the rear film surface 16*b*. However, as illustrated in FIG. 40, because the thin-film filter 29 is adhered to the sound hole peripheral part 20*bb* with the photosensitive-adhesive layer 61, parts of the photosensitive-adhesive layer 61 enter the adhesive through holes 15X (parts of the adhesive through holes 15X, in the sound hole peripheral part 20*bb* side) as entering parts 61*d*. The structure, which parts of the photosensitive-adhesive layer 61 enter the adhesive through holes 15X as entering parts 61*d*, is an adhesive-layer-entering structure. The adhesive through holes 15X are stopped up on the sound hole peripheral part 20*bb* because of the adhesive-layer-entering structure.

Further, because the photosensitive-adhesive layer 61 enters the adhesive through holes 15X, the entering parts 61*d* of the photosensitive-adhesive layer 61 are adhered to the inner wall surfaces (the above-described stripes-formed inner wall surfaces 38) of the adhesive through holes 15X. As described-above, an adhesive strength, of the thin-film filter 29 to the package surface 20*a*, is enhanced by the adhesive through holes 15X. Note that because the photosensitive-adhesive layer 61 is used for the adhesion of the thin-film filter 29, the photosensitive-adhesive layer 61 has a function as a filer-adhesive layer. The photosensitive-adhesive layer 61 is formed with photosensitive-adhesive. It is possible that an adhesive layer, using polyimide adhesive, epoxy adhesive, is formed as the filter-adhesive layer, instead of the photosensitive-adhesive layer 61. This will be explained in detail afterward.

The above-described stripe-like parts 37 and the stripes-formed inner wall surfaces 38 are formed in both the filter through holes 15Y and the adhesive through holes 15X. The entering parts 61*d* of the photosensitive-adhesive layer 61 are adhered to the stripes-formed inner wall surfaces 38, in the adhesive through holes 15X. Further, the stripe-like parts 37 are formed as concave parts, in the stripes-formed inner wall surfaces 38. Therefore, the entering parts 61*d* enter inside of the stripe-like parts 37 (the concave curved surface parts of the stripe-like parts 37a, 37b), thereby the entering parts 61d are adhered to the curved surface parts of the stripe-like parts 37.

(Method of Manufacturing the MEMS Microphone)

Figure 33:
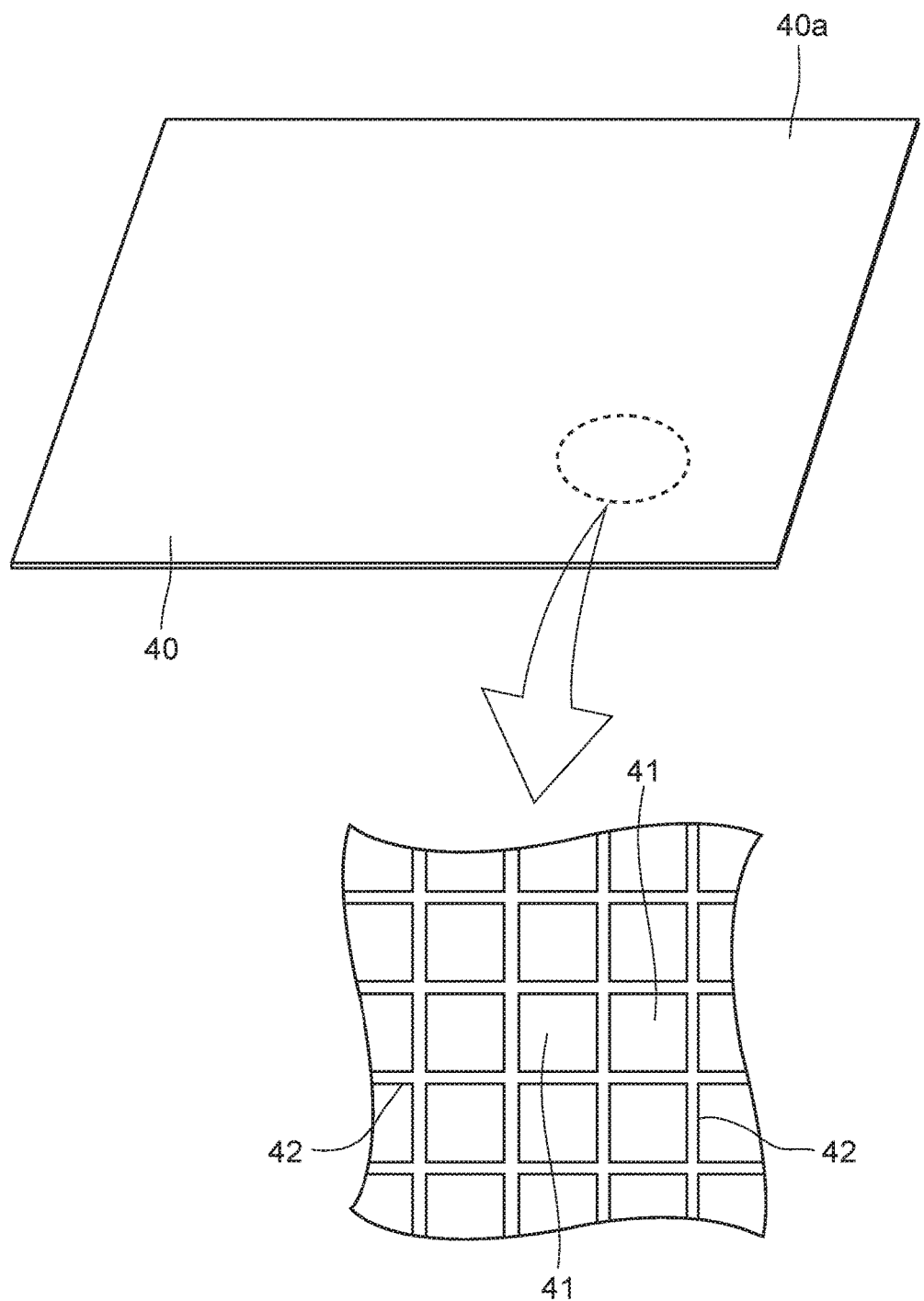
FIG. 33 is a perspective view showing a package-panel.
Figure 34:
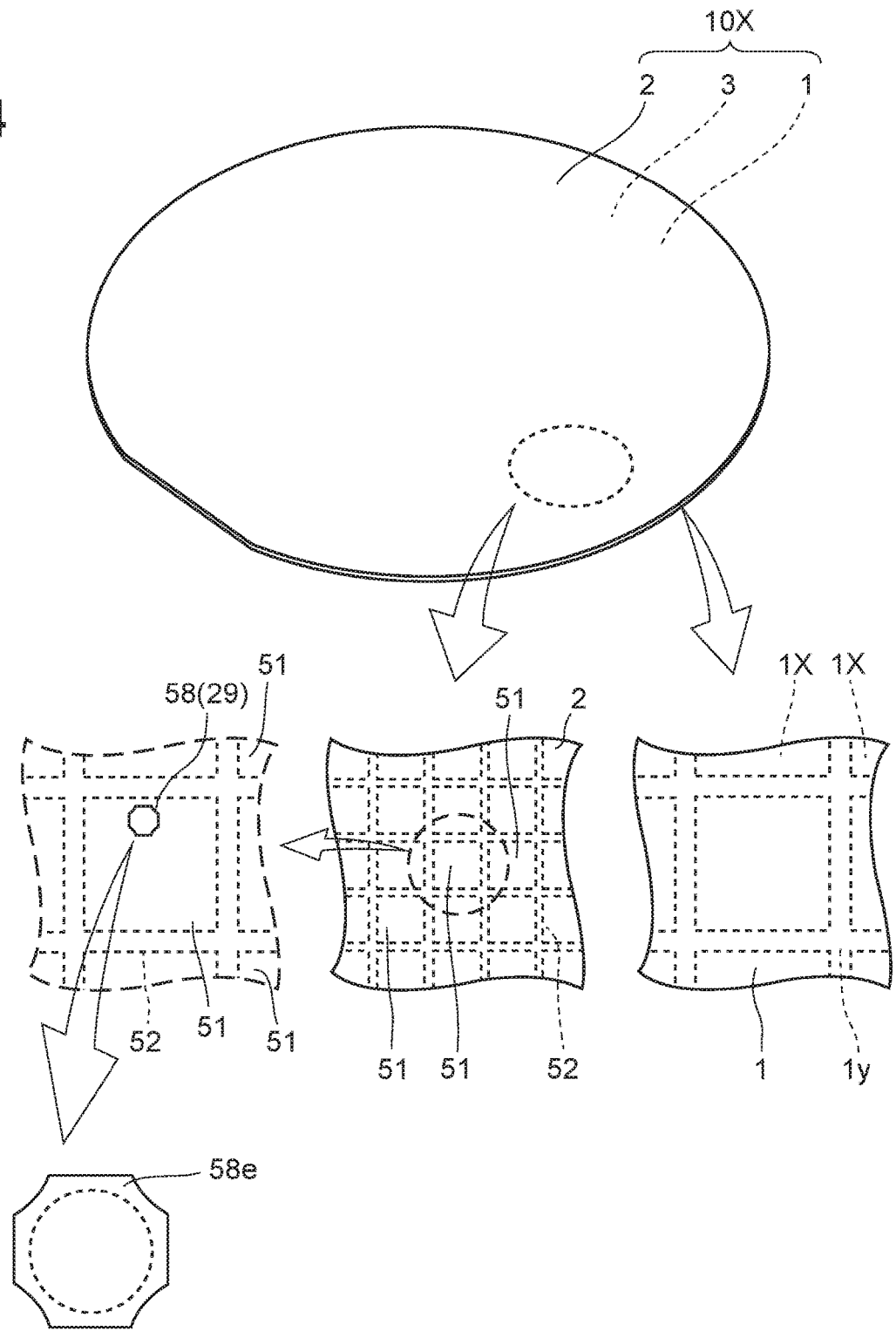
FIG. 34 is a perspective view showing the thin-film filter substrate.

Subsequently, the method of manufacturing the MEMS microphone 100, having the above-described structure, will be explained with reference to FIG. 33 to FIG. 38. Here, FIG. 33 is a perspective view showing a later-described package-panel 40, FIG. 34 is a perspective view showing a later-described thin-film filter substrate 10X. FIGS. 35-38 are sectional views showing principal parts of a respective photosensitive-adhesive layer forming step, a thin-film filter peeling off step and a thin-film filter transcribing step.

In the method of manufacturing the MEMS microphone 100, the MEMS microphone 100 is manufactured with the above-described MEMS chip 19, the ASIC 92 and the package substrate 20 which the MEMS chip 19 and the ASIC 92 are adhered. In case of the method of manufacturing, according to the embodiment, the MEMS chip 19 (rectangular MEMS chip), having the rectangular element substrate 22, is used. In the method of manufacturing the MEMS microphone 100, the package-panel 40, illustrated in FIG. 33, and the thin-film filter substrate 10X, illustrated in FIG. 34, are used. In the method of manufacturing the MEMS microphone 100, the photosensitive-adhesive layer forming step, the thin-film filter peeling off step and the thin-film filter transcribing step are performed.

As illustrated in FIG. 33, the package-panel 40 is a board-like member, having rectangular shape, made of PCB or ceramic, and a plurality of package-regions 41 are formed on the surface 40a by a regular arrangement. When the package-panel 40 is divided along by divided lines 42, the package substrate 20 is manufactured from each package region 41 (about 600 package substrates 20 are manufactured by every package-panel 40).

As illustrated in FIG. 34, the thin-film filter substrate 10X has the silicon wafer 1 (a substrate made of glass, quartz is able to be used), the thin-film filter 2 and the peeling-off adhesive layer 3, similar with the above-described thin-film filter substrate 10. The thin-film filter substrate 10X is manufactured by performing the above-described the thin-film filter substrate manufacturing step. The thin-film filter substrate manufacturing step, for manufacturing the thin-film filter substrate 10X, includes the above-described peeling-off adhesive layer forming step and the thin-film filter forming step.

Then the thin-film filter substrate 10X has a specific use which the thin-film filter substrate 10X is used for the MEMS microphone 100. Therefore, in case of the thin-film filter substrate 10X, the silicon wafer 1 has a plurality of separative regions 1X, and the thin-film filter 2 has a plurality of filter regions 51.

A plurality of separative regions 1X are formed by a regular arrangement corresponding to the package regions 41 of the package-panel 40. The parts between the respective separative regions 1X are divided lines 1y corresponding to the divided lines 42. Further, a plurality of filter regions 51 are also formed by a regular arrangement corresponding to the package regions 41 of the package-panel 40. The filter regions 51 are formed in accordance with the separative regions 1X. The parts between the respective filter regions 51 are divided lines 52 corresponding to the divided lines 42. When the thin-film filter 2 is divided along by the divided lines 52, a plurality of filter regions 51 are formed. Therefore, the above-described plurality of through holes 15 and the stripes-formed inner wall surfaces 38 are formed in the respective filter regions 51.

As illustrated in FIG. 34, filter parts 58 are arranged in the respective filter region 51. The respective filter parts 58 becomes the above-described thin-film filter 29 afterward. Therefore, the respective filter parts 58 are formed in a modified rectangular shape corresponding to the thin-film filter 29.

Then, the MEMS microphone 100 is manufactured with the package panel 40 and the thin-film filter substrate 10X. The MEMS microphone 100 is manufactured by performing the later-described photosensitive-adhesive layer forming step, the thin-film filter peeling-off step and the thin-film filter transcribing step.

Figure 35:
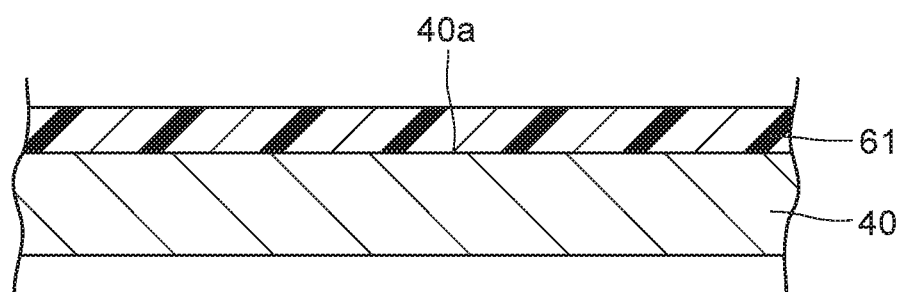
FIG. 35 is a sectional view showing a principal part of a photosensitive-adhesive layer forming step.
Figure 37:
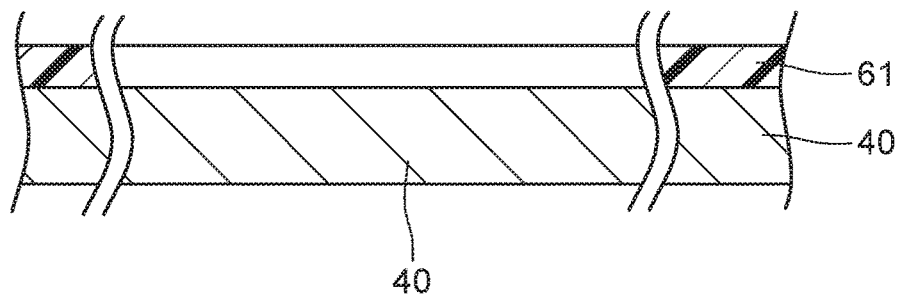
FIG. 37 is a sectional view showing another principal part of the photosensitive-adhesive layer forming step.

At first, the photosensitive-adhesive layer forming step is performed. In the photosensitive-adhesive layer forming step, as illustrated in FIG. 35, the photosensitive-adhesive layer 61 is formed on the surface 40a of the package-panel 40. The photosensitive-adhesive layer 61 is formed by applying photosensitive polyimide adhesive sheet and so on. In this case, as illustrated in FIG. 37, the photosensitive-adhesive layer 61 is formed in a hole-formed structure. In the hole-formed structure, a part, which the sound hole 20b will be formed later, is removed.

Next, the thin-film filter peeling-off step is performed. In the thin-film filter peeling-off step, the thin-film filter substrate 10X is heated. Then, as illustrated in FIG. 36, the peeling-off adhesive layer 3 is foamed by that heat. Therefore, the thin-film filter 2(29) is peeled off from the peeling-off adhesive layer 3, together with the metal pattern 5A.

Figure 38:
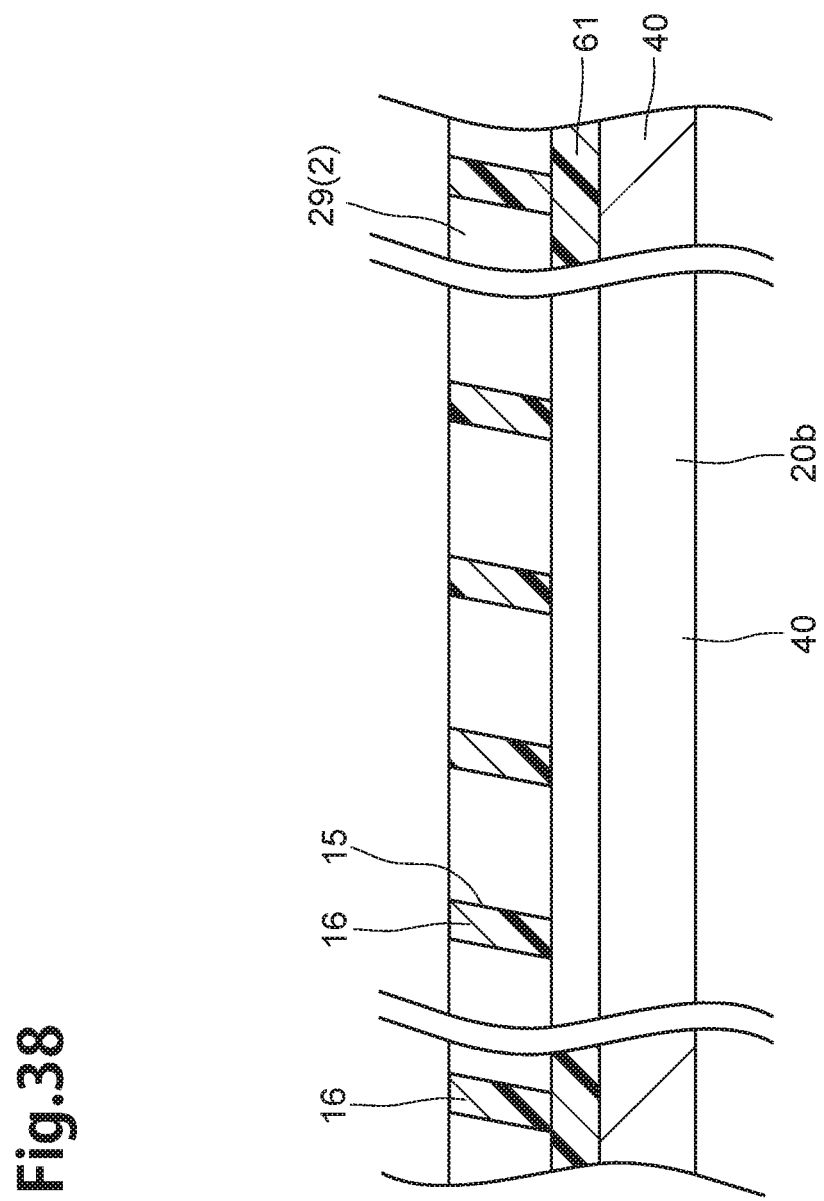
FIG. 38 is a sectional view showing a thin-film filter transcribing step.

Subsequently, the thin-film filter transcribing step is performed. As described-above, because the photosensitive-adhesive layer 61 is formed on the surface 40a of the package-panel 40. Therefore, when the thin-film filter 2(29), peeled off from the thin-film filter substrate 10X, is laminated on the package panel 40, as illustrated in FIG. 38, the thin-film filter 2(29) are overlaid on the photosensitive-adhesive layer 61. In this way, the thin-film filter 2(29) is transcribed on the package-panel 40 (the metal pattern 5A is omitted in FIG. 38).

Then, a plurality of package-regions 41 are formed on the package-panel 40. In the respective package-regions 41, unnecessary parts of the thin-film filter 2 are removed by a laser-processing. In this case, in the respective package-regions 41, the part, being used for the thin-film filter 29, of thin-film filter 2, is saved as a filter part 58, the other part is removed. In this way, the thin-film filter 29 is formed so as to cover the sound hole 20b.

Then, the peripheral parts 58e of the respective filter parts 58 are laminated on the photosensitive-adhesive layer 61, in the respective package regions 41. At this time, when the photosensitive-adhesive layer 61 is pasty at the normal temperature, parts of the surface of the photosensitive-adhesive layer 61 enter inside of the through holes 15, formed on the peripheral part 58e of the filter part 58 (the peripheral part 58e corresponds to an adhesive planned-region), thereby the above-described entering parts 61d are formed. Further, when the photosensitive-adhesive layer 61 softens in the heating, the surface of the photosensitive-adhesive layer 61 softens in the heat when the package-panel 40 is heated, the parts enter inside the through holes 15, thereby the entering parts 61d are formed. Then, the through holes 15, which the entering parts 61d are formed, are formed as the adhesive through holes 15X, and thereby the adhesive-layer-entering structure is obtained.

Figure 39:
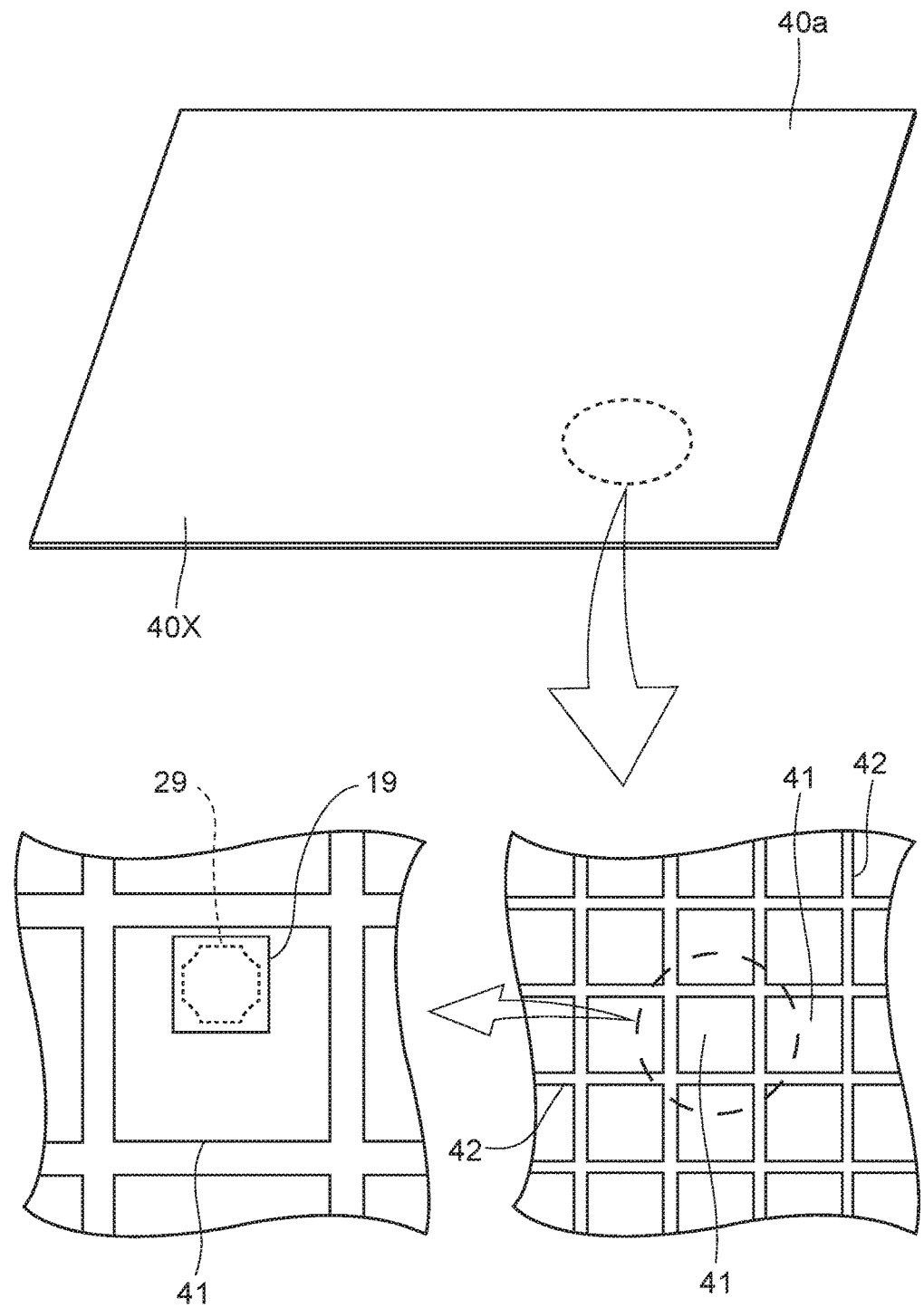
FIG. 39 is a perspective view showing a panel-with-chip according to the embodiment of the present invention.

After that, the MEMS chip mounting step is performed. In the MEMS chip mounting step, the electrode pads 7 are formed on the MEMS chip 19, further the solder bumps are formed. After that, in the package-panel 40, the MEMS chips 19 are mounted on the respective package-regions 41 by the flip chip bonding with solder bumps to form the panel-with-chip 40X (see FIG. 39). The panel-with-chip 40X is put into the not-illustrated heating reflow furnace. Then the solder bumps become the bonding bumps 44 after melting. After that, the sound shield 6 is formed (the sound shield 6 is sometimes formed before the MEMS chips 19 are mounted).

After that, the ASIC 92 is mounted on the package-region 41, further the cap 99 is adhered. Note that a package reflow is able to be performed about both the MEMS chip 19 and ASIC 92, when the ASIC 92 is mounted on the panel-with-chip 40X.

Furthermore, a panel cutting step is performed. In the panel cutting step, the panel-with-chip 40X, which the MEMS chip 19 and ASIC 92 are mounted further the cap 99 is covered, is cut along with the divided lines 42 to be divided into the respective package-regions 41. Then, the panel-with-chip 40X is divided into a plurality of package-regions 41. The MEMS microphone 100 is manufactured together with the package substrate 20 from the respective package-regions 41. The above-described thin-film filter 29 is formed in the manufactured package substrate 20.

Because the thin-film filter 29 is formed in the MEMS microphone 100, the particles and water are able to be kept out surely by the thin-film filter 29. A plurality of through holes 15 are formed in the thin-film filter 29, the stripes-formed inner wall surfaces 38 are formed inside the respective through holes 15. The respective through holes 15 are formed along by the slanting direction d15, and the stripe-like parts 37 of the stripes-formed inner wall surfaces 38 are also formed along by the slanting direction d15. Therefore, the MEMS microphone 100 has the sophisticated filtering function because of the thin-film filter 29. Moreover, a plurality of through holes 15 are formed with reactive ion etching so as to form the stripes-formed inner wall surfaces 38. Therefore, lowering the filtering function, originated in the manufacturing process, for example such a hole closing by adhesion of debris, is never occurred. Further, durability of the thin-film filter 29 is also good.

(Modified Example)

Figure 32:
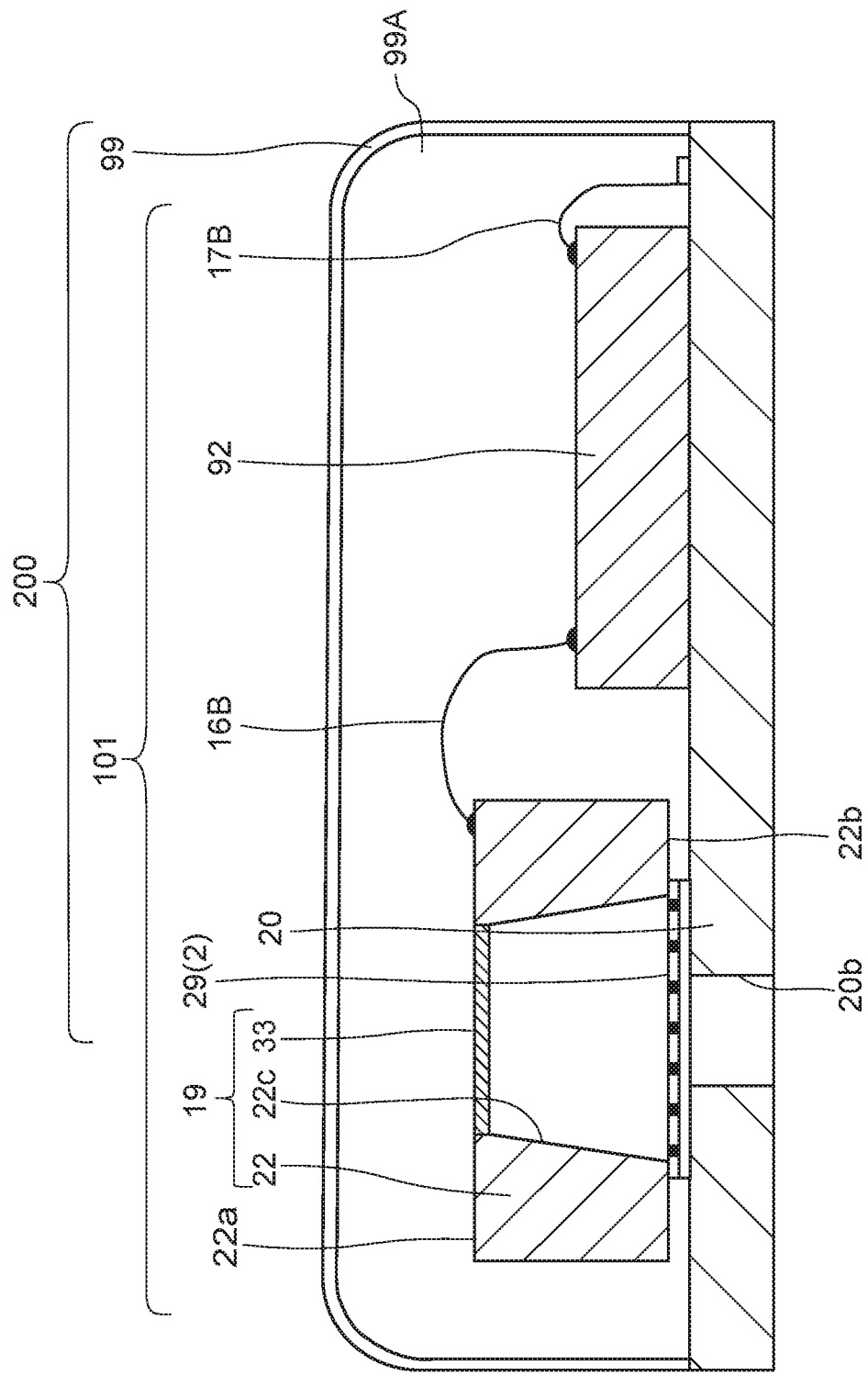
FIG. 32 is a sectional view, corresponding to FIG. 29, of the MEMS microphone according to the modified example.

Next, a MEMS microphone 200, according to a modified example, is explained with reference to FIG. 32. FIG. 32 is a sectional view of the MEMS microphone 200, corresponding to FIG. 29.

As illustrated in FIG. 32, the MEMS microphone 200 includes the MEMS package 101 and the cap 99.

In case of the above-described MEMS microphone 100 (the MEMS package 31), the MEMS chip 19 and the ASIC 92 are mounted on the package substrate 20 by the flip chip bonding.

To the contrary, in case of the MEMS microphone 200 according to the modified example, the MEMS chip 19 and the ASIC 92 are mounted on the package substrate 20 by the wire bonding.

Then, the MEMS package 101 is different in the following a), b), c), as compared with the MEMS package 31.
a) The thin-film filter 29 is formed on the MEMS chip 19.
b) The MEMS package 101 does not have the bonding bumps 44, the sound shield 6, the electrode pads 7, 21.
c) The MEMS chip 19 is connected to the ASIC 92 by the wire 16B.

In case of the MEMS package 31, the thin-film filter 29 is formed on the package substrate 20 though, in case of the MEMS package 101, the thin-film filter 29 is formed on the MEMS chip 19.

The ASIC 92 is connected to the package substrate 20 by the wire 17B not by the bonding bumps 93.

Because the thin-film filter 29 is also formed on the MEMS microphone 200, the MEMS microphone 200 has the same operation and effect with the MEMS microphone 100.

In the above-described embodiment, the type "double back-plate" having two not illustrated thin-films which are called back-plate are arranged in the upper side and the lower side of the membrane 33, is explained exemplarily in the embodiment. The present invention is also applicable to the type "single back-plate", having one back-plate is arranged in the one side of the membrane 33. In this case, it is sufficient that the two bonding bumps 44 are formed. Further, as form of the through hole, being formed in the thin-film filter, circular-shape in a plan view, a hexagon shape, a rectangular shape are able to be used. When the substrate, made of the transparent material such glass, quartz or the like, is used as the base substrate, the peeling adhesive layer is able to be formed by attachment of UV tape to the base surface.

In the above-described embodiments, the MEMS microphone is explained as the example which the thin-film filter, according to the present invention, is applied though, the thin-film filter is applied to products except for the MEMS microphone, for example MEMS sensor.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

Applying this invention provides the thin-film filter having the sophisticated filtering function because of the higher capability for catching foreign matters than the conventional filter. This invention is able to be used in the field of the thin-film filter, the thin-film filter substrate having the thin-film filter, the method of manufacturing the thin-film filter, the method of manufacturing the thin-film filter substrate, the MEMS microphone having the thin-film filter and the method of manufacturing the MEMS microphone.

What is claimed is:

1. A thin-film filter comprising:
   a thin-film part having a film surface and a rear film surface arranged at the rear side of the film surface;
   a plurality of through holes, being formed to penetrate the thin-film part from the film surface to the rear film surface, the through holes are formed along by a slanting direction being made an acute angle or an obtuse angle with the film surface; and
   stripes-formed inner wall surfaces having stripe-like parts formed along by the slanting direction, the stripes-formed inner wall surfaces are formed inside the respective through holes.

2. The thin-film filter according to claim 1,
   wherein the stripe-like parts are arranged in almost the whole of the inner wall surface of the respective through holes.

3. The thin-film filter according to claim 1,
   wherein the stripe-like parts are formed in the length longer than 80% of a film thickness being a thickness of the thin-film part.

4. A thin-film filter comprising:
a thin-film part having a film surface and a rear film surface arranged at the rear side of the film surface;
a plurality of through holes, being formed to penetrate the thin-film part from the film surface to the rear film surface, the through holes are formed along by a slanting direction being made an acute angle or an obtuse angle with the film surface; and
protrusions-formed inner wall surfaces including projecting parts protruding along by an intersecting direction intersecting with the slanting direction, the protrusions-formed inner wall surfaces are formed inside the respective through holes.

5. A thin-film filter comprising:
a laminated structure which a first filter and a second filter are piled up;
wherein the first filter comprises a first film surface, a first rear film surface, being arranged at the rear side of the first film surface, and a plurality of first through holes, which penetrate from the first film surface to the first rear film surface, and being formed along by a first slanting direction being made an acute angle or an obtuse angle with the first film surface,
wherein the second filter comprises a second film surface, a second rear film surface, being arranged at the rear side of the second film surface, and a plurality of second through holes, which penetrate from the second film surface to the second rear film surface, and being formed along by a second slanting direction being made an acute angle or an obtuse angle with the second film surface,
wherein the thin-film filter comprises a plurality of serial through holes, which the first through holes and the second through holes are respectively connected from the first film surface of the first filter to the second film surface or the second rear film surface of the second filter,
wherein the serial through holes comprise protrusions-formed inner wall surfaces having projecting parts which protrude along by an intersecting direction intersecting with the first slanting direction and the second slanting direction.

6. The thin-film filter according to claim 5,
wherein the laminated structure is a structure which the first filter and the second filter are piled up so that the first slanting direction is corresponding to the second slanting direction.

7. The thin-film filter according to claim 5,
wherein the laminated structure is a structure which the first filter and the second filter are piled up so that the first slanting direction is different from the second slanting direction.

8. The thin-film filter according to claim 5, further comprising:
first stripes-formed inner wall surfaces having first stripe-like parts formed along by the first slanting direction, the first stripes-formed inner wall surfaces are formed inside the first through holes of the respective serial through holes; and
second stripes-formed inner wall surfaces having second stripe-like parts formed along by the second slanting direction, the second stripes-formed inner wall surfaces are formed inside the second through holes of the respective serial through holes.

9. A thin-film filter substrate comprising:
a base substrate having a base surface; and
a thin-film filter, being formed on the base surface of the base substrate,
wherein the thin-film filter comprises a thin-film part having a film surface and a rear film surface arranged at the rear side of the film surface, a plurality of through holes, being formed to penetrate the thin-film part from the film surface to the rear film surface, the through holes are formed along by a slanting direction being made an acute angle or an obtuse angle with the film surface, and stripes-formed inner wall surfaces having stripe-like parts formed along by the slanting direction, the stripes-formed inner wall surfaces are formed inside the respective through holes.

10. The thin-film filter substrate according to claim 9, further comprising:
a peeling-off adhesive layer capable of being peeled off,
wherein the peeling-off adhesive layer is formed on the base surface,
wherein the thin-film filter is formed on the peeling-off adhesive layer.

11. A thin-film filter substrate comprising:
a base substrate having a base surface; and
a thin-film filter, being formed on the base surface of the base substrate,
wherein the thin-film filter comprises a thin-film part having a film surface and a rear film surface arranged at the rear side of the film surface, a plurality of through holes, being formed to penetrate the thin-film part from the film surface to the rear film surface, the through holes are formed along by a slanting direction being made an acute angle or an obtuse angle with the film surface, and protrusions-formed inner wall surfaces including projecting parts protruding along by an intersecting direction intersecting with the slanting direction, the protrusions-formed inner wall surfaces are formed inside the respective through holes.

12. The thin-film filter substrate according to claim 11, further comprising:
a peeling-off adhesive layer capable of being peeled off,
wherein the peeling-off adhesive layer is formed on the base surface,
wherein the thin-film filter is formed on the peeling-off adhesive layer.

13. A method of manufacturing a thin-film filter comprising:
a peeling-off adhesive layer forming step of forming a peeling-off adhesive layer, capable of being peeled off, on a base substrate;
a thin-film filter forming step of forming a thin-film filter on the peeling-off adhesive layer; and
a thin-film filter peeling-off step of peeling off the thin-film filter from the peeling-off adhesive layer of a thin-film filter substrate, which the peeling-off adhesive layer and the thin-film filter are formed by performing the peeling-off adhesive layer forming step and the thin-film filter forming step,
wherein the thin-film filter forming step comprises a resin layer forming step of forming a resin layer on the peeling-off adhesive layer of the base substrate, and a through hole forming step of forming through holes which penetrate from a front surface to a rear surface of the resin layer, so that stripes-formed inner wall surfaces, having stripe-like parts being formed along by a slanting direction being made an acute angle or an obtuse angle with the surface of the resin layer, are formed.

14. The method of manufacturing a thin-film filter according to claim 13, wherein the thin-film filter forming step further comprises
a metal layer forming step of forming a metal layer on the surface of the resin layer, a resist pattern forming step of forming a resist pattern, which a plurality of hole parts are formed, on the metal layer, and a metal pattern forming step of forming a metal pattern by forming corresponding hole parts, to the metal layer, corresponding to the hole parts by using the resist pattern as a mask, wherein the through hole forming step includes reactive ion etching being performed of using the metal pattern as a mask to form the stripes-formed inner wall surfaces.

15. The method of manufacturing a thin-film filter according to claim 14, wherein the through hole forming step includes the reactive ion etching being performed by slanting a base substrate with resin-layer, which the resin layer is formed, to etch the resin layer along by the slanting direction.

16. The method of manufacturing a thin-film filter according to claim 13, further comprising:

a filter laminating step which two sheets of the thin-film filter substrates are prepared, the thin-film filter, being formed on any one of the thin-film filter substrates, is piled up on the thin-film filter, being formed on the other thin-film filter substrates.

17. A method of manufacturing a thin-film filter substrate, which a thin-film filter is formed on a base substrate comprising:

a peeling-off adhesive layer forming step of forming a peeling-off adhesive layer, capable of being peeled off, on the base substrate; and a thin-film filter forming step of forming a thin-film filter on the peeling-off adhesive layer, wherein the thin-film filter forming step comprises a resin layer forming step of forming a resin layer on the peeling-off adhesive layer of the base substrate, and a through hole forming step of forming through holes which penetrate from a front surface to a rear surface of the resin layer, so that stripes-formed inner wall surfaces, having stripe-like parts being formed along by a slanting direction being made an acute angle or an obtuse angle with the surface of the resin layer, are formed.

18. The method of manufacturing a thin-film filter substrate according to claim 17, wherein the thin-film filter forming step further comprises
a metal layer forming step of forming a metal layer on the surface of the resin layer, a resist pattern forming step of forming a resist pattern, which a plurality of hole parts are formed, on the metal layer, and a metal pattern forming step of forming a metal pattern by forming corresponding hole parts, to the metal layer, corresponding to the hole parts by using the resist pattern as a mask, wherein the through hole forming step includes reactive ion etching being performed using the metal pattern as a mask to form the stripes-formed inner wall surfaces.

19. A MEMS microphone comprising:
a MEMS chip;
a package substrate which the MEMS chip is adhered; and
a thin-film filter, being formed on the package substrate or the MEMS chip, wherein the thin-film filter comprises a thin-film part having a film surface and a rear film surface arranged at the rear side of the film surface, a plurality of through holes, being formed to penetrate the thin-film part from the film surface to the rear film surface, the through holes are formed along by a slanting direction being made an acute angle or an obtuse angle with the film surface; and stripes-formed inner wall surfaces having stripe-like parts formed along by the slanting direction, the stripes-formed inner wall surfaces are formed inside the respective through holes.

20. A MEMS microphone comprising:
a MEMS chip;
a package substrate which the MEMS chip is adhered; and
a thin-film filter, being formed on the package substrate or the MEMS chip, wherein the thin-film filter comprises a thin-film part having a film surface and a rear film surface arranged at the rear side of the film surface, a plurality of through holes, being formed to penetrate the thin-film part from the film surface to the rear film surface, the through holes are formed along by a slanting direction being made an acute angle or an obtuse angle with the film surface; and protrusions-formed inner wall surfaces including projecting parts protruding along by an intersecting direction intersecting with the slanting direction, the protrusions-formed inner wall surfaces are formed inside the respective through holes.

\* \* \* \* \*